(12) United States Patent
Urano et al.

(10) Patent No.: US 6,656,660 B1
(45) Date of Patent: Dec. 2, 2003

(54) RESIST COMPOSITION

(75) Inventors: Fumiyoshi Urano, Kawagoe (JP); Hirotoshi Fujie, Kawagoe (JP); Naoki Takeyama, Settsu (JP); Koji Ichikawa, Ashiya (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/492,389

(22) Filed: Jan. 27, 2000

(30) Foreign Application Priority Data

Jan. 28, 1999 (JP) .............................. 11-020450

(51) Int. Cl.⁷ ................................. G03C 7/00
(52) U.S. Cl. .................... 430/270.1; 430/170; 430/905; 430/176
(58) Field of Search ............................ 430/270.1, 170, 430/905, 176

(56) References Cited

U.S. PATENT DOCUMENTS

| | | | | |
|---|---|---|---|---|
| 5,688,628 A | * | 11/1997 | Oie et al. ................... | 430/176 |
| 5,750,309 A | * | 5/1998 | Hatakeyama et al. ....... | 430/170 |
| 5,817,444 A | | 10/1998 | Sato et al. .................. | 430/155 |
| 5,852,128 A | * | 12/1998 | Padmanaban et al. ... | 525/328.8 |
| 5,908,730 A | * | 6/1999 | Nitta et al. ................. | 430/170 |
| 5,976,759 A | * | 11/1999 | Urano et al. ............. | 430/270.1 |
| 6,033,826 A | * | 3/2000 | Urano et al. ............. | 430/270.1 |
| 6,136,502 A | * | 10/2000 | Satoshi et al. ........... | 430/270.1 |
| 6,153,349 A | * | 11/2000 | Ichikawa et al. ........... | 430/170 |
| 6,165,680 A | * | 12/2000 | Choi ....................... | 430/270.1 |

FOREIGN PATENT DOCUMENTS

| | | |
|---|---|---|
| EP | 0780732 A2 | 6/1997 |
| EP | 0819982 A1 | 1/1998 |
| EP | 0908473 A1 | 4/1999 |
| EP | 0908783 A1 | 4/1999 |
| EP | 0955563 A1 | 11/1999 |

OTHER PUBLICATIONS

European Search Report dated May 18, 2000.

* cited by examiner

Primary Examiner—Janet Baxter
Assistant Examiner—Yvette C. Thornton
(74) Attorney, Agent, or Firm—Armstrong, Westerman & Hattori, LLP

(57) ABSTRACT

A resist composition comprising (a) at least two kinds of polymers which become alkali-soluble by the action of an acid, (b) as a photoacid generator, a combination of an alkylsulfonyl diazomethane compound and a triarylsulfonium arylsulfonate compound or a diaryliodonium arylsulfonate compound, and (c) a solvent is excellent as a chemically amplified resist composition to give excellent pattern shape and very fine line-and-space, particularly when exposed to lights having a wavelength of 300 nm or less.

2 Claims, 4 Drawing Sheets

RESIST COMPOSITION

BACKGROUND OF THE INVENTION

The present invention relates to a resist composition used in production of semiconductor elements, etc., more particularly, to a resist composition used in formation of a positive type pattern using ultraviolet light, particularly deep ultraviolet light having a wavelength of not higher than 300 nm, for instance, KrF excimer laser light, as an exposure energy source.

With a recent trend toward higher density integration of semi-conductor devices, an energy source for exposure means used for fine working, particularly photolithography, becomes to have shorter and shorter wavelengths. Now use of deep ultraviolet light (wavelength of not higher than 300 nm), KrF excimer laser light (wavelength of 248.4 nm), etc. has been started. However, there has not yet been available a resist composition having high applicability to a technology for production in large scale with the use of this kind of short wavelength exposure light.

As a resist composition for KrF excimer laser light and deep ultraviolet light as the exposure source, a chemical amplified type resist composition proposed by H. Ito et al has generally been used and improved for reducing exposure energy amount [H. Ito et al, Polym. Eng. Sci., 23, 25 1012 (1983)].

Many reports have been published concerning chemical amplified type resist compositions, and those compositions have been accompanied with many problems to be solved from a view point of practical applicability.

Namely, in the reports at early development stage [e.g. JP-B 2-27660 (U.S. Pat. No. 4,491,628); JP-A 62-115440 (U.S. Pat. No. 4,603,101); JP-A 2-25850; Y. Jian et al Polym. Mater. Sci. & Eng., 66, 41(1992),etc.], polymers used therein were phenolic ether type polymers such as poly(p-tert-butoxycarbonyloxystyrene), poly(p-tert-butoxystyrene), poly(p-tert-butoxycarbonyloxy-α-methylstyrene), poly(p-tert-butoxy-α-methylstyrene), poly(tert-butyl p-isopropenylphenoxyacetate), poly(p-tert-butoxycarbonyloxystyrene/sulfone), poly(p-tetrahydropyranyloxystyrene), poly[p-(1-methoxyethoxy) styrene] and poly([p-(1-phenoxyethoxy)styrene], but all of these polymers are poor in their adhesion to substrates, easily peeled off from the substrate upon development, and further poor in heat resistance. Therefore, the resist compositions containing those polymers have such a defect as giving no good pattern. In the case of resist compositions using carboxylic acid type polymers such as poly(tert-butyl p-vinylbenzoate) and poly(tetrahydropyranyl p-vinylbenzoate), there is such a defect in that transmittance around 248.4 nm is not satisfactory because of the benzoyl group and thus the resolution is not good. In the case of resist compositions using poly(tert-butyl methacrylate), there are problems of poor heat resistance of polymer and poor dry-etching resistance.

Additionally, resist compositions using silicon-containing polymers have been disclosed [e.g. JP-B 3-44290], but in cases of using poly(p-trimethylsilyloxystyrene) and poly(p-tert-butyldimethylsilyloxystyrene), there are found such defects as low sensitivity, incomplete removal by ashing due to the silicon contained therein, etc., and thus they are difficult to realize a practical use.

With a development of the technology, there have been reported chemical amplified type resist compositions in which the above defects are improved by using poly(p-tert-butoxycarbonyloxystyrene/p-hydroxystyrene) [JP-A 2-209977; JP-A 3-206458], poly(p-tetrahydropyranyloxystyrene/p-hydroxystyrene) [Japanese Patent No. 2675138 (EPC No. 342498); JP-A 2-161436; JP-A 3-83063] and poly(p-tert-butoxystyrene/p-hydroxystyrene) [JP-A 2-62544; JP-A 4-211258 (U.S. Pat. No. 5,350,660, EPC No. 440374).]

However, any of the resist compositions using those polymers cannot attain the required resolution ability, nor overcome the problem of delay time which has been discussed in practical application [change in dimension and deterioration of the pattern shape during the time from coating of the resist to the light exposure or during the time from the light exposure to the heat treatment (PEB)] and the problem of substrate dependency [$SiO_2$, $Si_3N_4$, $Ti_3N_4$, BPSG or polysilicon have been used as the semiconductor substrate, and the pattern shape becomes bad depending upon the kind of the substrate material].

Thereafter, resist compositions using polymers in which an acetal group or a ketal group is introduced as a protecting group [e.g. poly(p-1-methoxyethoxystyrene/p-hydroxystyrene)] and a photoacid generator such as triphenylsulfonium salt derivative and diphenyliodonium salt [e.g. JP-A 2-161436; JP-A 4-219757 (EPC No. 447868); JP-A 5-281745 (EPC Publication No. 553737); JP-A 3-282550] have been reported. However, they are accompanied with such problems as generation of scum (undissolved parts generated during development: they cause a problem of transcription to the under substrate plate upon etching), a substrate dependency and delay time. Additionally, JP-A 5-249682 (EPC Publication No. 520642)], discloses a resist composition comprising a polymer such as poly(p-1-ethoxyethoxystyrene/p-hydroxystyrene), poly(p-1-methoxy-1-methylethoxystyrene/p-hydroxystyrene), poly(p-1-ethoxyethoxystyrene/p-hydroxystyrene/methyl methacrylate) or poly(p-1-ethoxyethoxystyrene/p-hydroxystyrene/fumaronitrile), and a diazodisulfone compound as a photoacid generator, and JP-A 8-253528 discloses a resist composition comprising poly(p-1-tert-butoxyethoxystyrene/p-hydroxystyrene) and a diazodisulfone compound as a photoacid generator.

Though those resist compositions are excellent in many aspects such as resolution ability and delay time and so on, they are still accompanied with such problems as poor substrate dependency and generation of scum.

JP-A 8-15864 (EPC Publication No. 679951, U.S. Pat. No. 5,736,296), JP-A 8-262721, JP-A 9-127698, JP-A 9-90639 resist compositions containing a mixture of two kinds of polymers , poly(p-1-ethoxyethoxystyrene/p-hydroxystyene) and poly(p-tert-butoxycarbonyloxystyrene/p-hydroxystyrene), and one or more diazodisulfone compounds as a photoacid generator. JP-A 9-160244 discloses a composition containing a mixture of two kinds of polymers, poly(p-1-ethoxyethoxystyrene/p-hydroxystyrene) and poly (tert-butoxystyrene/p-hydroxystyrene), and one or more photoacid generators. JP-A 10-97074 discloses a composition containing two kinds of polymers, poly(p-1-ethoxyethoxystyrene/p-hydroxystyrene) and poly(p-tetrahydropyranyloxystyrene/p-hydroxystyrene) and one or more photoacid generators. These compositions are accompanied with many problems such as poor in resolution ability, DOF and side-wall shape which are required for the characteristics in recent resolution degree of 0.20 to 0.15 μm L/S.

JP-A 9-160246 discloses a resist composition containing poly(p-1-ethoxyethoxystyrene/p-tert-butoxystyrene/p- hydroxystyrene), a compound having a molecular weight of 1000 to 3000 wherein hydrogen atoms of phenolic hydroxy groups are partially substituted with acid-labile group, as a dissolution-inhibitor and an oinum salt as a photoacid generator. JP-A 10-48826 discloses a resist composition in which p-hydroxystyrene type polymer containing p-hydroxystyrene monomer units protected with an acetal group (e.g. an 1-ethoxyethoxy group) and p-hydroxystyrene type polymer containing p-hydroxystyrene monomer units protected with an alkoxy group (e.g. a tert-butoxy group) whose weight average molecular weight is less than the former polymer are co-used and one or two kinds of photoacid generators are used in combination of the polymers. However, these compositions are also accompanied with many problems concerning poor DOF, side-wall shape, delay time, substrate dependency, poor storage stability and the like contrary to required characteristics in recent resolution degree of 0.20 to 0.15 μm pattern size.

Still further, JP-A 9-274320 and JP-A 10-53621 disclose resist compositions containing poly(p-1-ethoxyethoxystyrene/p-hydroxystyrene/p-tert-butoxycarbonyloxystyrene) or poly(p-1-ethoxyethoxystyrene/p-hydroxystyrene/p-tert-butoxystyrene) and photoacid generator composed of a mixture of a diazodisulfone compound and an onium salt, substantially containing no aromatic rings or aliphatic multi-rings as counter ions. However, these compositions are also accompanied with such problems as poor DOF, side-wall shape, delay time and the like contrary to required characteristics in recent resolution degree of 0.20 to 0.15 μm pattern size.

As mentioned above, chemical amplified type resist compositions have been improved in their poor heat resistance of the polymer, poor adhesion to a substrate material and poor transmittance around 248.4 nm which had been found in the early stage of the development. But these compositions are still now accompanied with such problems as poor resolution ability, change in pattern size with the lapse of time, deterioration of pattern shape, poor DOF, footing and scum remained in the pattern, roughness in side walls of the pattern and the like. Thus, practically applicable resist compositions in which the above problems are solved have strongly been desired.

BRIEF SUMMARY OF THE INVENTION

It is an object of the present invention to provide a practically applicable resist composition which shows high transparency against ultraviolet light, particularly deep ultraviolet light having a wavelength of 300 nm or less, KrF excimer laser light, and the like, shows high sensitivity to exposures by those light sources and to irradiation with electron beams, soft X-ray, etc., is excellent in heat resistance and adhesion to substrates, has high resolution, is capable of giving highly precious patterns without causing pattern size change with the lapse of time, shows high storage stability, has a wide DOF and good mask linearity, shows no substrate dependency, and is capable of forming rectangular pattern forms with less roughness in the side walls without causing footing and scum.

The present invention provides a chemically amplified resist composition comprising (a) two kinds or more of polymers which become alkali-soluble by an action of an acid and represented by the formula:

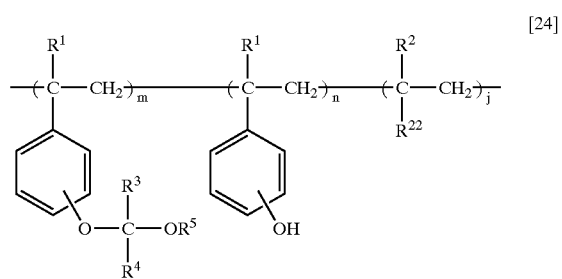

wherein $R^1$ and $R^2$ are independently a hydrogen atom or a methyl group; $R^3$ and $R^4$ are independently a hydrogen atom, a straight-chain, branched or cyclic alkyl group having 1 to 6 carbon atoms, a straight-chain, branched or cyclic haloalkyl group having 1 to 6 carbon atoms, a phenyl group which may have one or more substituents, or $R^3$ and $R^4$ can together form a methylene chain, provided that both $R^3$ and $R^4$ cannot be hydrogen atoms at the same time; $R^5$ is a straight-chain, branched or cyclic alkyl group having 1 to 10 carbon atoms, a straight-chain, branched or cyclic haloalkyl group having 1 to 10 carbon atoms, or an aralkyl group; $R^{22}$ is an esterified carboxyl group or an aryl group which may have one or more substituents; m and n are independently an integer; and j is zero or an integer, provided that $0.10 \leq (m+j)/(m+n+j) \leq 0.90$, and $0 \leq j/(m+n+j) \leq 0.25$, (b) at least one compound of the formula:

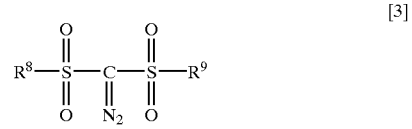

wherein $R^8$ is a branched or cyclic alkyl group having 3 to 8 carbon atoms; and $R^9$ is a straight-chain, branched or cyclic alkyl group having 1 to 8 carbon atoms, or an aralkyl group, and at least one compound selected from the group consisting of a compound of the formula:

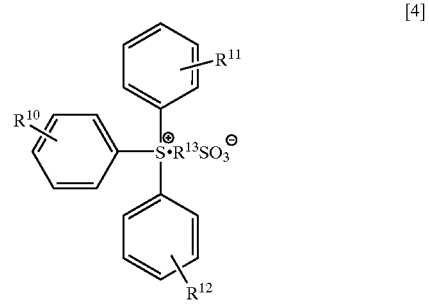

wherein $R^{10}$, $R^{11}$ and $R^{12}$ are independently a hydrogen atom, a halogen atom, a straight-chain, branched or cyclic alkyl group having 1 to 6 carbon atoms, a straight-chain, branched or cyclic alkoxy group having 1 to 6 carbon atoms, or a phenylthio group; $R^{13}$ is a 1-naphthyl group, a 2-naphthyl group, a 10-camphoryl group, a pyridyl group, or a group of the formula:

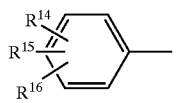

[5]

wherein $R^{14}$ and $R^{15}$ are independently a hydrogen atom or a halogen atom; and $R^{16}$ is a hydrogen atom, a halogen atom, a straight-chain, branched or cyclic alkyl group having 1 to 12 carbon atoms, a straight-chain or branched alkoxy group having 1 to 4 carbon atoms, or a trifluoromethyl group, and a compound of the formula:

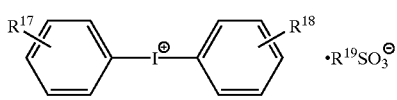

[6]

wherein $R^{17}$ and $R^{18}$ are independently a hydrogen atom, a straight-chain or branched alkyl group having 1 to 4 carbon atoms, a straight-chain or branched alkoxy group having 1 to 4 carbon atoms; and $R^{19}$ is a 1-naphthyl group, a 2-naphthyl group, a 10-camphoryl group, a phenyl group, or a phenyl group substituted with one or more, the same or different, straight-chain, branched or cyclic alkyl groups having 1 to 12 carbon atoms, and (c) a solvent dissolving the components (a) and (b).

DETAILED DESCRIPTION OF THE INVENTION

Figure 1A:
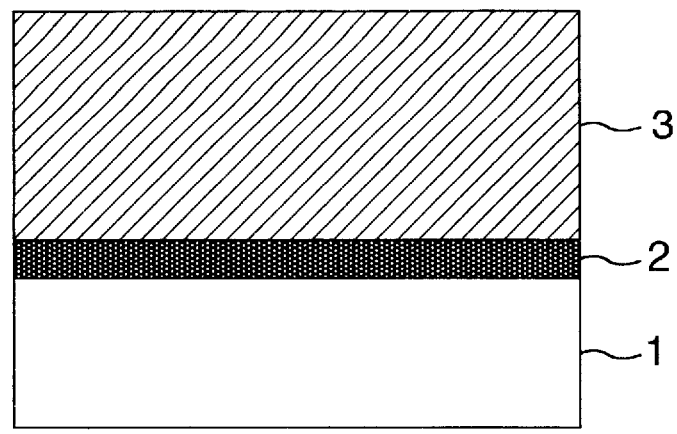
FIGS. 1A to 1C are cross-sectional views showing the process of the positive type pattern formation using the resist composition of the present invention.

The chemically amplified resist composition of the present invention comprises:

(a) two kinds or more of polymers which become alkali-soluble by an action of an acid and represented by the formula:

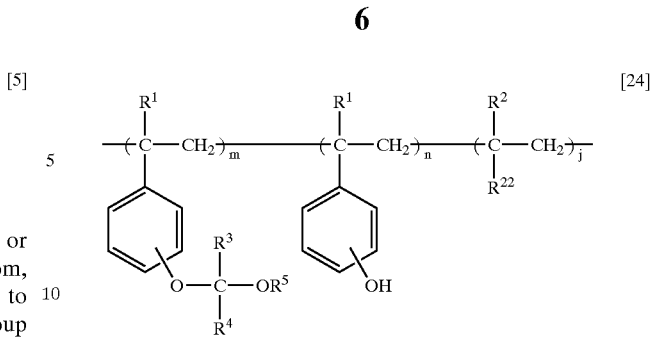

[24]

wherein $R^1$ and $R^2$ are independently a hydrogen atom or a methyl group; $R^3$ and $R^4$ are independently a hydrogen atom, a straight-chain, branched or cyclic alkyl group having 1 to 6 carbon atoms, a straight-chain, branched or cyclic haloalkyl group having 1 to 6 carbon atoms, a phenyl group which may have one or more substituents, or $R^3$ and $R^4$ can together form a methylene chain, provided that both $R^3$ and $R^4$ cannot be hydrogen atoms at the same time; $R^5$ is a straight-chain, branched or cyclic alkyl group having 1 to 10 carbon atoms, a straight-chain, branched or cyclic haloalkyl group having 1 to 10 carbon atoms, or an aralkyl group; $R^{22}$ is an esterified carboxyl group or an aryl group which may have one or more substituents; m and n are independently an integer; and j is zero or an integer, provided that $0.10 \leq (m+j)/(m+n+j) \leq 0.90$, and $0 \leq j/(m+n+j) \leq 0.25$, (b) at least one compound of the formula:

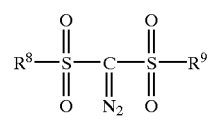

[3]

wherein $R^8$ is a branched or cyclic alkyl group having 3 to 8 carbon atoms; and $R^9$ is a straight-chain, branched or cyclic alkyl group having 1 to 8 carbon atoms, or an aralkyl group, and at least one compound selected from the group consisting of a compound of the formula:

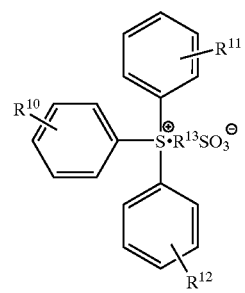

[4]

wherein $R^{10}$, $R^{11}$ and $R^{12}$ are independently a hydrogen atom, a halogen atom, a straight-chain, branched or cyclic alkyl group having 1 to 6 carbon atoms, a straight-chain, branched or cyclic alkoxy group having 1 to 6 carbon atoms, or a phenylthio group; $R^{13}$ is a 1-naphthyl group, a 2-naphthyl group, a 10-camphoryl group, a pyridyl group, or a group of the formula:

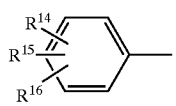

[5]

wherein $R^{14}$ and $R^{15}$ are independently a hydrogen atom or a halogen atom; and $R^{16}$ is a hydrogen atom, a halogen atom, a straight-chain, branched or cyclic alkyl group having 1 to 12 carbon atoms, a straight-chain or branched alkoxy group having 1 to 4 carbon atoms, or a trifluoromethyl group, and a compound of the formula:

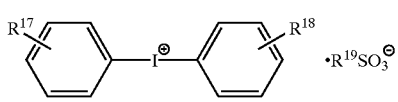

[6]

wherein $R^{17}$ and $R^{18}$ are independently a hydrogen atom, a straight-chain or branched alkyl group having 1 to 4 carbon atoms, a straight-chain or branched alkoxy group having 1 to 4 carbon atoms; and $R^{19}$ is a 1-naphthyl group, a 2-naphthyl group, a 10-camphoryl group, a phenyl group, or a phenyl group substituted with one or more, the same or different, straight-chain, branched or cyclic alkyl groups having 1 to 12 carbon atoms, and (c) a solvent dissolving the components (a) and (b).

In the above general formula [24], the straight-chain, branched or cyclic alkyl group having 1 to 6 carbon atoms and the alkyl group in the straight-chain, branched or cyclic haloalkyl group having 1 to 6 carbon atoms, shown by $R^3$ and $R^4$, are exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, etc.; the straight-chain, branched or cyclic alkyl group having 1 to 10 carbon atoms and the alkyl group in the straight-chain, branched or cyclic haloalkyl having 1 to 10 carbon atoms, shown by $R^5$, are exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group, a decyl group etc.

The halogen in the straight-chain, branched or cyclic haloalkyl having 1 to 6 carbon atoms, shown by $R^3$ and $R^4$, and that in the straight-chain, branched or cyclic haloalkyl group having 1 to 10 carbon atoms, shown by $R^5$, includes chlorine, bromine, iodine, fluorine, etc.

The aralkyl shown by $R^5$ in the general formula [24] includes a benzyl group, a phenethyl group, a phenylpropyl group, a methylbenzyl group, a methylphenethyl group, an ethylbenzyl group, etc.

In the formula [24], the aryl group in the definition of the aryl group which may have one or more substituents and is shown by $R^{22}$ includes a phenyl group, a naphthyl group. As the substituents, there can be exemplified a straight-chain or branched alkyl group having 1 to 4 carbon atoms, a straight-chain, branched or cyclic alkoxy group having 1 to 8 carbon atoms, a saturated heterocyclic oxy group or a group of the formula:

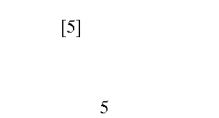

[2]

wherein $R^7$ is a straight-chain, branched or cyclic alkyl group having 1 to 8 carbon atoms, an aryl group, or a saturated heterocyclic group; X is a direct link or an oxygen atom; l is zero or an integer.

More concretely, the aryl group which may have one or more substituents and is shown by $R^{22}$ can be represented by the formula:

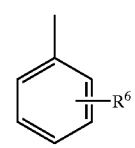

[29]

wherein $R^6$ is a hydrogen atom, a straight-chain or cyclic alkyl group having 1 to 4 carbon atoms, a straight-chain, branched or cyclic alkoxy group having 1 to 8 carbon atoms, a saturated heterocyclic oxy group, or a group of the formula:

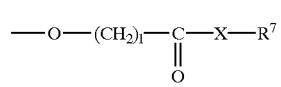

[2]

wherein $R^7$, X and l are as defined above.

The straight-chain or branched alkyl group having 1 to 4 carbon atoms shown by $R^6$ in the formula [29] includes, for example, a methyl group, an ethyl group, an n-propyl group, an isopropyl group, a cyclopropyl group, an n-butyl group, an isobutyl group, a tert-butyl group, a sec-butyl group, etc.

In the general formula [29], the straight chained, branched or cyclic alkoxy group having 1 to 8 carbon atoms, shown by $R^6$, includes a methoxy group, an ethoxy group, an n-propoxy group, an isopropoxy group, a cyclopropoxy group, an n-butoxy group, an isobutoxy group, a tert-butoxy group, a sec-butoxy group, an n-pentyloxy group, an iso-pentyloxy group, a cyclopentyloxy group, an n-hexyloxy group, an isohexyloxy group, a cyclohexyloxy group, an 1-methylcyclopentyloxy group, an 1-methylcyclohexyloxy group, an n-heptyloxy group, an isoheptyloxy group, an n-octyloxy group, a tert-octyloxy group, etc.; and the saturated heterocyclic oxy group includes a tetrahydropyranyloxy group, a tetrahydrofuranyloxy group, etc.

In the above general formula [2], the straight chained, branched or cyclic alkyl group having 1 to 8 carbon, shown by $R^7$, is exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an 1-methylcyclopentyl group, an n-hexyl group, an isohexyl group, a cyclohexyl group, an 1-methylcyclohexyl group, a heptyl group, an octyl group, etc.; the saturated heterocyclic group includes a tetrahydropyranyl group, a tetrahydrofuranyl group, etc.; and the aryl group shown by $R^7$ includes a phenyl group, a 4-methylphenyl group, an 1-naphthyl group, a 2-naphthyl group, etc.

Specific examples of the functional group shown by the general formula [2] are a methoxycarbonyloxy group, an ethoxycarbonyloxy group, an isopropoxycarbonyloxy group, an isobutoxycarbonyloxy group, a sec-butoxycarbonyloxy group, a tert-butoxycarbonyloxy group, an isopentyloxycarbonyloxy group, a tert-pentyloxycarbonyloxy group, an 1-methylcyclohexyloxycarbonymethyloxy group, an 1-methylcyclopentyloxycarbonylmethyloxy group, a tetrahydropyranyloxycarbonylmethyloxy group, a tetrahydrofuranyloxycarbonylmethyloxy group, a tert-butoxycarbonylmethyloxy group, an acetyloxy group, an isobutanoyloxy group, a pivaloyloxy group, an isovaleroyloxy group, a cyclohexylcarbonyloxy group, a benzoyloxy group, a 4-methylbenzoyloxy group, an 1-naphthoyloxy group, a 2-naphthoyloxy group, etc.

The substituent in the phenyl group which may be substituted, shown by $R^3$ and $R^4$ in the general formula [24] includes a halogen atom such as chlorine, bromine, iodine and fluorine; a straight-chain or branched alkyl group (preferably having 1 to 4 carbon atoms) such as a methyl group, an ethyl group, an n-propyl group, an isopropyl group, an n-butyl group, an isobutyl group, a tert-butyl group and a sec-butyl group; a straight-chain or branched alkoxy group (preferably having 1 to 4 carbon atoms) such as a methoxy group, an ethoxy group, an n-propoxy group, an isopropoxy group, an n-butoxy group, an isobutoxy group, a tert-butoxy group and a sec-butoxy group, etc.

The methylene chain formed by $R^3$ and $R^4$ includes those having 2 to 5 carbon atoms.

In the formula [24], the esterified carboxyl group shown by $R^{22}$ can be represented by the formula: —COOR$^{23}$, wherein $R^{23}$ is a hydrocarbon group. The hydrocarbon group shown by $R^{23}$ includes, for example, a straight-chain, branched or cyclic alkyl group having 1 to 6 carbon atoms, or a bridge-containing alicyclic hydrocarbon group having 7 to 9 carbon atoms, such as an isobornyl group, and a norbornyl group. The above-mentioned alkyl group in the definition of $R^{23}$ includes, a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a 1-methylpentyl group, a cyclopentyl group, an n-hexyl group, an isohexyl group, a cyclohexyl group, etc.

Preferable examples of the polymer represented by the formula [24] include a polymer represented by the formula:

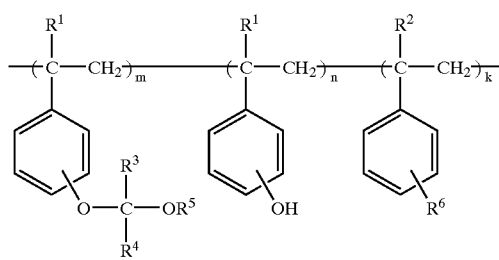

[1]

wherein k is zero or an integer; and $R^1$, $R^2$, $R^3$, $R^4$, $R^5$, $R^6$, m and n are as defined above, provided that $0.10 \leq (m+k)/(m+n+k) \leq 0.90$ and $0 \leq k/(m+n+k) \leq 0.25$, and a polymer represented by the formula:

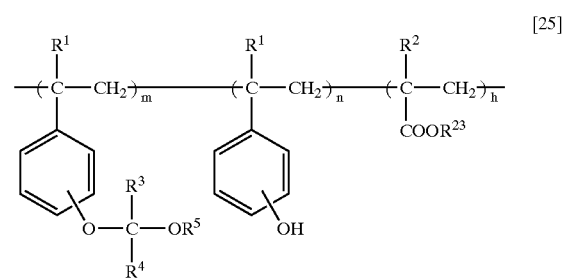

[25]

wherein h is zero or an integer; $R^1$, $R^2$, $R^3$, $R^4$, $R^5$, $R^{23}$, m and n are as defined above, provided that $0.10 \leq (m+h)/(m+n+h) \leq 0.90$ and $0 \leq h/(m+n+h) \leq 0.25$.

In the polymers of the formulae [24], [1] and [25], the proportion of the monomer unit represented by the formula:

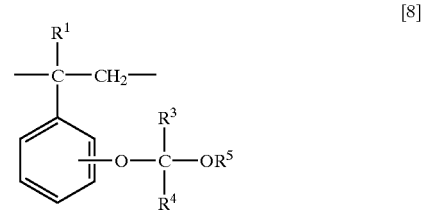

[8]

wherein $R^1$, $R^3$, $R^4$ and $R^5$ are as defined above, is preferably 10% by mole or more, more preferably 10 to 60% by mole, and most preferably 10 to 50% by mole, based on the total monomer units.

One of the characteristic features of the resist compositions of the present invention lies in using two or more kinds of the polymers represented by the following general formula:

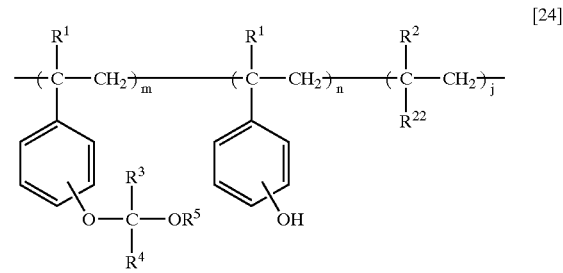

[24]

wherein $R^1$, $R^2$, $R^3$, $R^4$, $R^5$, $R^{22}$, m, n and j are as defined above, having a monomer unit containing a functional group shown by the following general formula:

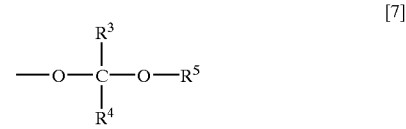

[7]

wherein $R^3$, $R^4$ and $R^5$ are as defined above, said functional group capable of generating a phenolic hydroxy group by removing the protecting group easily by an action of an acid, including an alkoxyalkoxy group, a haloalkoxyalkoxy group, an aralkyloxyalkoxy group, an alkoxy-1-phenylalkoxy group, a haloalkoxy-1-phenylalkoxy group and an aralkyoxy-1-(4-methylphenyl)alkoxy group, that is, the monomer unit being shown by the following general formula:

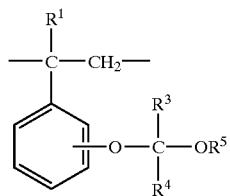
[8]

wherein $R^1$, $R^3$, $R^4$ and $R^5$ are as defined above; a monomer unit giving good adhesion to a substrate and heat resistance, shown by the following general formula:

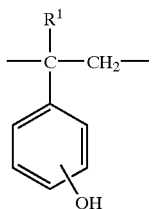
[9]

wherein $R^1$ is as defined above; and a monomer unit optionally used for the purpose of controlling development speed on exposed portions to better the side wall shape, inhibiting influence by proximity effect and improving mask linearity, shown by the following general formula:

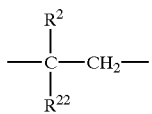
[26]

wherein $R^2$ and $R^{22}$ are as defined above.

Preferable examples of the monomer unit of the formula [26] are that of the formula:

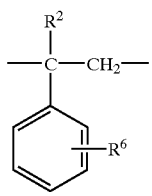
[10]

wherein $R^2$ and $R^6$ are as defined above, that of the formula:

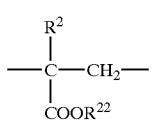
[28]

wherein $R^2$ and $R^{22}$ are as defined above.

The combination of two or more kinds of polymers in the present invention includes, for example, ① combinations of two or more kinds of polymers shown by the general formula:

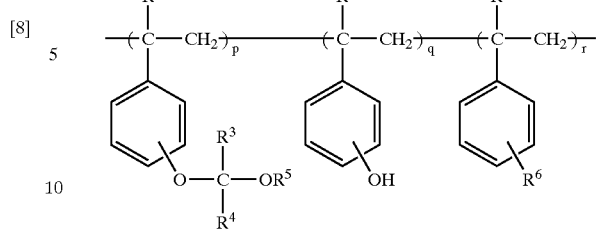
[11]

wherein $R^1$, $R^2$, $R^3$, $R^4$, $R^5$ and $R^6$ are as defined above, and p, q and r are independently an integer, providing that $0.10 \leq (p+r)/(p+q+r) \leq 0.90$ and $0.05 \leq r/(p+q+r) \leq 0.25$, i.e. combinations of two or more polymers having different weight average molecular weights, and/or different monomer units constituting ratios, etc., ② combinations of one or more kinds of the polymers shown by the above general formula [11] and one or more kinds of the polymers shown by the general formula:

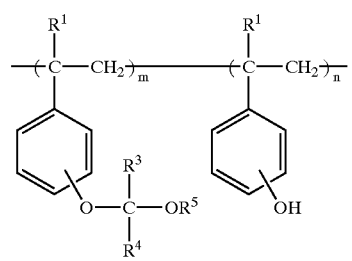
[12]

wherein $R^1$, $R^3$, $R^4$ and $R^5$ are as defined above; and m and n are independently an integer, providing that $0.10 \leq m/(m+n) \leq 0.90$, and ③ combinations of two or more kinds of the polymers shown by the above general formula [12] which are different from one another in their weight average molecular weights, and/or ratios of the monomer units contained therein, etc., ④ combinations of two or more kinds of the polymers of the formula:

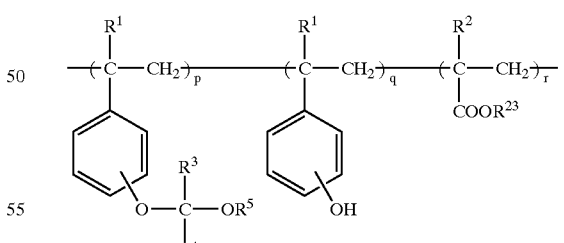
[27]

wherein $R^1$, $R^2$, $R^3$, $R^4$, $R^5$, and $R^{23}$ are as defined above; p, q and g are independently an integer, provided that $0.10 \leq (p+q)/(p+q+g) \leq 0.90$ and $0.05 \leq g/(p+q+g) \leq 0.25$, individual polymers having different weight average molecular weights and/or different ratio of the monomer units contained therein, etc., ⑤ combinations of one or more kinds of polymers of the formula [11] and one or more kinds of polymers of the formula [27], ⑥ combinations of one or more kinds of polymers of the formula [12] and one or more kinds of polymers of the formula [27], ⑦ combinations of one or more kinds of polymers of the formula [11], one or more kinds of polymers of the formula [12], and one or more kinds of polymers of the formula [27].

In the above, the polymer of the formula [11] corresponds to the polymers of the formula [1] wherein k is an integer. The polymer of the formula [12] corresponds to the polymers of the formula [1] wherein k is zero, and the polymers of the formula [25] wherein h is zero. The polymer of the formula [27] corresponds to the polymers of the formula [25] wherein h is an integer.

In the formulae [11], [12] and [27], the proportion of the monomer unit of the formula [8] is preferably 10% by mole or more, more preferably 10 to 60% by mole, most preferably 10 to 50% by mole, based on the total monomer units.

The resist composition of the present invention is characterized by using two or more kinds of polymers of the formula [24], individual polymers having high resolution, DOF, excellent heat resistance, excellent pattern shape, excellent mask linearity, excellent etching resistance, inhibition of influences of proximity effect, etc. required for resist properties.

More preferable examples of the combinations of the polymers of the formula [24] are a combination of two or more kinds of different polymers of the formula [11] (e.g. polymers having different weight average molecular weights and/or different monomer units constitution ratios, polymers having different monomer units, etc.); a mixture of one or more polymers of the formula [11] and one or more polymers of the formula [12]; a combination of different polymers of the formula [27] (e.g. polymers having different weight average molecular weights and/or different monomer units constitution ratios, polymers having different monomer units, etc.); a mixture of one or more polymers of the formula [27] and one or more polymers of the formula [11]; a mixture of one or more polymers of the formula [27] and one or more polymers of the formula [12]; etc. Among them, the mixture of one or more polymers of the formula [11] and one or more polymers of the formula [12]; and the mixture of one or more polymers of the formula [27] and one or more polymers of the formula [11] are particularly preferable.

The mixing ratio of the polymer of the formula [11] and the polymer of the formula [12] is usually 95:5 to 5:95 by weight, preferably 95:5 to 50:50 by weight from the viewpoint of light intensity difference when used for line-and-space; and more preferably 90:10 to 50:50 by weight from the viewpoints of heat resistance and side wall shapes of the resulting pattern. When used for contact holes, the ratio of 50:50 to 5:95 by weight is usual, and more preferably 50:50 to 10:90 by weight considering resolution and DOF.

When two polymers are selected from those of the formulae [11], [12] and [27], the using proportions are usually 95:5 to 5:95 by weight.

The using ratio of the polymer of the formula [11] and the polymer of the formula [27], or the polymer of the formula [12] and the polymer of the formula [27] is usually 95:5 to 5:95 by weight, and more preferably 50:50 to 5:95 by weight.

The using ratio of the polymer of the formula [11], the polymer of the formula [12] and the polymer of the formula [27] is usually 90:5:5 to 5:5:90 by weight, preferably 90:5:5 to 5:90:5 by weight or 5:90:5 to 5:5:90 by weight.

The using ratio of the different polymers (the first polymer and the second polymer) of the formula [1] or the different polymers (the first polymer and the second polymer) of the formula [12] or the different polymers (the first polymer and the second polymer) of the formula [25] is usually 95:5 to 5:95 by weight, more preferably 50:50 to 5:95 by weight.

The polymers of the general formula [1], [11], [12], [24], [25] or [27] used in the resist compositions of the present invention are very advantageous in the aspects of improved resolution ability, stable pattern size with the lapse of time (delay time), and uniformity of a pattern size in the surface of wafer, etc. which are caused by remarkably easier removal of the protecting group in the functional group shown by the general formula [7] to generate a hydroxy group as compared with known functional group such as a tert-butoxycarbonyloxy group, a tetrahydropyranyloxy group, a tert-butoxy group, a tert-butoxycarbonylmethyloxy group and a carboxylic acid tert-butyl ester group.

Further, by incorporating the monomer unit shown by the general formula [26], more concretely the formula [10], [28], etc. in the polymer in an appropriate amount, developing speed upon development can be controlled, and thus roughness of side wall which has commonly be observed in polymers containing an acetal group as a functional group can be improved, influences by proximity effect can be inhibited and also a mask linearity can be improved.

Still further, by incorporating this monomer unit, the amount of the monomer unit shown by the general formula [8] in the polymer can be reduced, resulting in improving heat resistance of the whole polymer.

The monomer unit shown by the general formula [8] includes the derived from p- or m-hydroxystyrene derivatives and p- or m-hydroxy-α-methylstyrene derivatives, which is specifically exemplified by p- or m-1-methoxy-1-methylethoxystyrene, p- or m-1-benzyloxy-1-methylethoxystyrene, p- or m-1-benzyloxyethoxystyrene, p- or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or m-1-(2-chloroethoxy)ethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-methoxypropoxystyrene, p- or m-1-ethoxypropoxystyrene, p- or m-1-methoxybutoxystyrene, p- or m-1-methoxycyclohexyloxystyrene, p- or m-1-ethoxy-1-cyclohexylmethoxystyrene, p- or m-1-cyclohexyloxyethoxystyrene, p- or m-(α-ethoxybenzyl)oxystyrene, p- or m-[α-ethoxy-(4-methylbenzyl)]oxystyrene, p- or m-[α-ethoxy-(4-methoxybenzy)]oxystyrene, p- or m-[α-ethoxy-(4-bromobenzyl)]oxystyrene, p- or m-1-ethoxy-2-methylpropoxystyrene, etc. and p- or m-hydroxy-α-methylstyrene derivatives having the same substituents as the p- or m-hydroxystyrene derivatives mentioned above, etc.

Specific examples of the monomer unit shown by the general formula [9] are monomer units derived from p- or m-vinylphenol, p- or m-hydroxy-α-methylstyrene, etc.

The monomer unit shown by the general formula [10] includes one derived from styrene, p- or m-methylstyrene, p- or m-tert-butylstyrene, p- or m-methoxystyrene, p- or m-ethoxystyrene, p- or m-isopropoxystyrene, p- or m-tert-butoxystyrene, p- or m-cyclohexyloxystyrene, p- or m-1-methylcyclohexyoxystyrene, p- or m-1-methylcyclopentyloxystyrene, p- or m-tetrahydropyranyloxystyrene, p- or m-tetrahydrofuranyloxystyrene, p- or m-acetyloxystyrene, p- or m-isobutanoyloxystyrene, p- or m-pivaloyloxystyrene, p- or m-cyclohexylcarbonyloxystyrene, p- or m-benzoyloxystyrene, p- or m-(4-methylbenzoyl)oxystyrene, p- or m-1-naphthoyloxystyrene, p- or m-2-naphthoyloxystyrene, p- or m-methoxycarbonyloxystyrene, p- or m-ethoxycarbonyloxystyrene, p- or m-isopropoxycarbonyloxystyrene, p- or m-isobutoxycarbonyloxystyrene, p- or m-sec-butoxycarbonyloxystyrene, p- or m-tert-butoxycarbonyloxystyrene, p- or m-isopentyloxycarbonyloxystyrene, p- or m-tert-pentyloxycarbonyloxystyrene, 1-methylcyclopentyl p- or m-vinylphenoxy acetate, 1-methylcyclohexyl p- or m-vinylphenoxy acetate, tetrahydropyranyl p- or m-vinylphenoxy acetate, tert-butyl p- or m-vinylphenoxy acetate, etc. and α-methylstyrene derivatives having the same substituents as the styrene derivatives mentioned above.

The monomer unit of the formula [28] includes those derived from methyl acrylate, ethyl acrylate, n-propyl acrylate, tert-butyl acrylate, cyclohexyl acrylate, isobornyl acrylate, norbornyl acrylate, methyl methacrylate, ethyl methacrylate, n-propyl methacrylate, tert-butyl methacrylate, cyclohexyl methacrylate, isobornyl methacrylate, norbornyl methacrylate, etc.

In the polymer of the formula [24], [1] or [25], the ratio of the monomer unit of the formula [8] and the monomer unit of the formula [26] in the polymer of the formula [24], the ratio of the monomer unit of the formula [8] and the monomer unit of the formula [10] in the polymer of the formula [1], or the ratio of the monomer unit [8] and the monomer unit of the formula [28] in the polymer of the formula [25] is usually 10 to 90% by mole, as a total of the monomer units in individual polymers. From the viewpoint of making resolution, heat resistance, adhesiveness to the substrate and mask linearity of the resist composition of the present invention remarkably good, the range of 20 to 50% by mole is preferable.

The ratio of the monomer unit shown by the general formula [26], [10] or [28] in the polymer shown by the general formula [24], [1] or [25] is generally 0 to 25 mole % respectively. From viewpoints of improving roughness of side wall and mask linearity and also reducing influence of proximity effect with inhibiting reduction of resolution ability, the range of 0 to 20 mole % is preferable.

Further, in a case of using a combination of the polymer shown by the general formula [11] and the polymer shown by the general formula [12] of the present invention, a ratio of the monomer unit shown by the above general formula [8] and the monomer unit shown by the general formula [10] contained in the polymer shown by the general formula [11] is generally 10 to 90 mole % in total, and any of the ratio within the above range can be usable in the resist compositions of the present invention. From a viewpoint of improving remarkably resolution ability, heat resistance, adhesion to substrates and mask linearity, the range of 20 to 50 mole % is preferable.

The ratio of the monomer unit shown by the general formula [10] or [28] contained in the polymer shown by the general formula [11] or [27] is generally 5 to 25 mole % respectively, and from viewpoints of improving roughness of side wall and mask linearity and also reducing influence of proximity effect with inhibiting reduction of resolution ability, 10 to 20 mole % is preferable.

The ratio of the monomer unit shown by the above general formula [8] contained in the polymer shown by the general formula [12] is generally 10 to 90 mole %, and from viewpoints of improving resolution ability, inhibiting influence by delay time and improving adhesion to substrates, the range of 20 to 50 mole % is preferable.

Preferable examples of the combination of two kinds of the polymers of the formula [1] include (i) a first polymer wherein $R^1$ and $R^2$ are independently a hydrogen atom or a methyl group; any one of $R^3$ and $R^4$ is a hydrogen atom, or a straight-chain, branched or cyclic alkyl group having 1 to 6 carbon atoms, and another of $R^3$ and $R^4$ is a straight-chain, branched or cyclic alkyl group having 1 to 6 carbon atoms; $R^5$ is a straight-chain, branched or cyclic alkyl group having 1 to 10 carbon atoms or an aralkyl group; $R^6$ is a straight-chain, branched or cyclic alkoxy group having 1 to 8 carbon atoms, a saturated heterocyclic oxy group or a group of the formula:

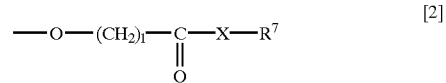

[2]

wherein $R^7$ is a straight-chain or branched alkyl group aving 1 to 8 carbon atoms, an aryl group or a saturated eterocyclic oxy group; X is a direct link or an oxygen atom; l is zero or an integer of 1; m and n are independently an integer; and k is an integer, provided that $0.10 \leq (m+k)/(m+n+k) \leq 0.90$ and $0 \leq k/(m+n+k) \leq 0.25$, and (ii) a second polymer wherein k is zero; and $R^1$, $R^2$, $R^3$, $R^4$, $R^5$, m and n are the same as the first polymer.

More preferable examples of the combination of two kinds of the polymers of the formula [1] include (i) a first polymer wherein $R^1$, $R^2$ and $R^3$ are hydrogen atoms; $R^4$ is a straight-chain, branched or cyclic alkyl group having 1 to 6 carbon atoms; $R^5$ is a straight-chain, branched or cyclic alkyl group having 1 to 6 carbon atoms; $R^6$ is a branched or cyclic alkoxy group having 3 to 8 carbon atoms, a tetrahydropyranyloxy group, a tetrahydrofuranyloxy group, an acetyloxy group, a pivaloyloxy group, a benzoyloxy group, a tert-butoxycarbonyloxy group, or a tert-butoxycarbonylmethyloxy group; m and n are independently an integer; k is an integer, provided that $0.10 \leq (m+k)/(m+n+k) \leq 0.90$ and $0 \leq k/(m+n+k) \leq 0.25$, and (ii) a second polymer wherein k is zero; and $R^1$, $R^2$, $R^3$, $R^4$, $R^5$, and m and n are the same as the first polymer.

Most preferable examples of the combination of two kinds of polymers of the formula [1] include (i) a first polymer wherein $R^1$, $R^2$ and $R^3$ are hydrogen atoms; $R^4$ is a straight-chain or branched alkyl group having 1 to 6 carbon atoms; $R^5$ is a straight-chain, branched or cyclic alkyl group having 1 to 6 carbon atoms; $R^6$ is an isopropoxy group, a tert-butoxy group, a tetrahydropyranyloxy group, a tetrahydrofuranyloxy group, an acetyloxy group, a pivaloyloxy group, a benzoyloxy group, a tert-butoxycarbonyloxy group, or a tert-butoxycarbonylmethyloxy group; m and n are independently an integer; k is an integer, provided that $0.10 \leq (m+k)/(m+n+k) \leq 0.90$ and $0 \leq k/(m+n+k) \leq 0.25$, and (ii) a second polymer wherein k is zero; $R^1$, $R^2$, $R^3$, $R^4$, $R^5$, m and n are the same as the first polymer.

Preferable examples of the combination of at least one polymer of the formula [1] and at least one polymer of the formula [25] include (i) at least one polymer of the formula [1] wherein $R^1$ and $R^2$ are independently a hydrogen atom or a methyl group; any one of $R^3$ and $R^4$ is a hydrogen atom, a straight-chain, branched or cyclic alkyl group having 1 to 6 carbon atoms, and another of $R^3$ and $R^4$ is a straight-chain, branched or cyclic alkyl group having 1 to 6 carbon atoms; $R^5$ is a straight-chain, branched or cyclic alkyl group having 1 to 10 carbon atoms or an aralkyl group; $R^6$ is a straight-chain, branched or cyclic alkoxy group having 1 to 8 carbon atoms, a saturated heterocyclic oxy group or a group of the formula:

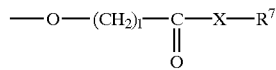

[2]

wherein $R^7$ is a straight-chain, branched or cyclic alkyl group having 1 to 8 carbon atoms, an aryl group, or a saturated heterocyclic group; X is a direct link or an oxygen atom; l is zero or an integer; m and n are independently an integer; k is zero or an integer, provided that $0.10 \leq (m+k)/(m+n+k) \leq 0.90$ and $0 \leq k/(m+n+k) \leq 0.25$, and (ii) at least one polymer of the formula [25] wherein $R^1$ and $R^2$ are independently a hydrogen atom or a methyl group; any one of $R^3$ and $R^4$ is a hydrogen atom or a straight-chain, branched or cyclic alkyl group having 1 to 6 carbon atoms and another of $R^3$ and $R^4$ is a straight-chain, branched or cyclic alkyl group having 1 to 6 carbon atoms; $R^5$ is a straight-chain, branched or cyclic alkyl group having 1 to 10 carbon atoms or an aralkyl group; $R^{23}$ is a straight-chain, branched or cyclic alkyl group having 1 to 6 carbon atoms, or a bridge-containing alicyclic hydrocarbon group having 7 to 9 carbon atoms; m and n are independently an integer; h is zero or an integer, provided that $0.10 \leq (m+h)/(m+n+h) \leq 0.90$ and $0 \leq h/(m+n+h) \leq 0.25$.

More preferable examples of the combination of at least one polymer of the formula [1] and at least one polymer of the formula [25] include (i) at least one polymer of the formula [1] wherein $R^1$, $R^2$ and $R^3$ are hydrogen atoms; $R^4$ is a straight-chain, branched, or cyclic alkyl group having 1 to 6 carbon atoms; $R^5$ is a straight-chain, branched or cyclic alkyl group having 1 to 6 carbon atoms; $R^6$ is a branched or cyclic alkoxy group having 3 to 8 carbon atoms, a tetrahydropyranyloxy group, a tetrahydrofuranyloxy group, an acetyloxy group, a pivaloyloxy group, a benzoyloxy group, a tert-butoxycarbonyloxy group, or a tert-butoxycarbonylmethyloxy group; m, n and k are independently an integer, provided that $0.10 \leq (m+k)/(m+n+k) \leq 0.90$ and $0 \leq k/(m+n+k) \leq 0.25$, and (ii) at least one polymer of the formula [25], wherein $R^1$, $R^2$ and $R^3$ are hydrogen atoms; $R^4$ is a straight-chain, branched or cyclic alkyl group having 1 to 6 carbon atoms; $R^5$ is a straight-chain, branched or cyclic alkyl group having 1 to 6 carbon atoms; $R^{23}$ is a straight-chain, branched or cyclic alkyl group having 1 to 6 carbon atoms or a bridge-containing alicyclic hydrocarbon group having 7 to 9 carbon atoms; m, n and h are independently an integer, provided that $0.10 \leq (m+h)/(m+n+h) \leq 0.90$ and $0 \leq h/(m+n+h) \leq 0.25$.

Most preferable examples of the combination of at least one polymer of the formula [1] and at least one polymer of the formula [25] include (i) at least one polymer of the formula [1], wherein $R^1$, $R^2$ and $R^3$ are hydrogen atoms; $R^4$ is a straight-chain, branched or cyclic alkyl group having 1 to 6 carbon atoms; $R^5$ is straight-chain, branched or cyclic alkyl group having 1 to 6 carbon atoms; $R^6$ is an isopropoxy group, a tert-butoxy group, a tetrahydropyranyloxy group, a tetrahydrofuranyloxy group, an acetyloxy group, a pivaloyloxy group, a benzoyloxy group, or a tert-butoxycarbonyloxy group; m, n and k are independently an integer, provided that $0.10 \leq (m+k)/(m+n+k) \leq 0.90$ and $0 \leq k/(m+n+k) \leq 0.25$, and (ii) at least one polymer of the formula [25], wherein $R^1$, $R^2$ and $R^3$ are hydrogen atoms; $R^4$ is a straight-chain, branched or cyclic alkyl group having 1 to 6 carbon atoms; $R^5$ is a straight-chain, branched or cyclic alkyl group having 1 to 6 carbon atoms; $R^{23}$ is a methyl group, a tert-butyl group, a cyclohexyl group, an isobornyl group or a norbornyl group; m, n and h are independently an integer, provided that $0.10 \leq (m+h)/(m+n+h) \leq 0.90$ and $0 \leq h/(m+n+h) \leq 0.25$.

Preferable examples of the combination of two kinds of polymers of the formula [25] include (i) a first polymer wherein $R^1$ and $R^2$ are independently a hydrogen atom or a methyl group; any one of $R^3$ and $R^4$ is a hydrogen atom or a straight-chain, branched or cyclic alkyl group having 1 to 6 carbon atoms and another $R^3$ and $R^4$ is a straight-chain, branched or cyclic alkyl group having 1 to 6 carbon atoms; $R^5$ is a straight-chain, branched or cyclic alkyl group having 1 to 10 carbon atoms or an aralkyl group; $R^{23}$ is a straight-chain, branched or cyclic alkyl group having 1 to 6 carbon atoms or a bridge-containing alicyclic hydrocarbon group having 7 to 9 carbon atoms; m, n and k are independently an integer, provided that $0.10 \leq (m+h)/(m+n+h) \leq =0.90$ and $0 \leq h/(m+n+h) \leq 0.25$, and (ii) a second polymer wherein h is zero; $R^1$, $R^2$, $R^3$, $R^4$, $R^5$, m and n are the same as the first polymer.

More preferable examples of the combination of two kinds of polymers of the formula [25] include (i) a first polymer wherein $R^1$, $R^2$ and $R^3$ are hydrogen atoms; $R^4$ is a straight-chain, branched or cyclic alkyl group having 1 to 6 carbon atoms; $R^5$ is a straight-chain, branched or cyclic alkyl group having 1 to 6 carbon atoms; $R^{23}$ is a straight-chain, branched or cyclic alkyl group having 1 to 6 carbon atoms or a bridge-containing alicyclic hydrocarbon group having 7 to 9 carbon atoms; m, n and h are independently an integer, provided that $0.10 \leq (m+h)/(m+n+h) \leq 0.90$ and $0 \leq h/(m+n+h) \leq 0.25$, and (ii) a second polymer wherein h is zero; $R^1$, $R^2$, $R^3$, $R^4$, $R^5$, m and n are the same as the first polymer.

Most preferable examples of the combination of two kinds of polymers of the formula [25] include (i) a first polymer wherein $R^1$, $R^2$ and $R^3$ are hydrogen atoms; $R^4$ is a straight-chain, branched or cyclic alkyl group having 1 to 6 carbon atoms; $R^5$ is a straight-chain, branched or cyclic alkyl group having 1 to 6 carbon atoms; $R^{23}$ is a methyl group, a tert-butyl group, a cyclohexyl group, an isobornyl group or a norbornyl group; m, n and h are independently an integer, provided that $0.10 \leq (m+h)/(m+n+h) \leq 0.90$ and $0 \leq h/(m+n+h) \leq 0.25$, and (ii) a second polymer wherein h is zero; $R^1$, $R^2$, $R^3$, $R^4$, $R^5$, m and n are the same as the first polymer.

When two kinds of polymers are selected from the formula [1], the ratio of the first polymer to the second polymer is preferably 95:5 to 5:95 by weight.

When two kinds of polymers are selected from the polymer of the formula [1] and the polymer of the formula [25], the ratio of the polymer [1] to the polymer [25] is preferably 95:5 to 5:95 by weight.

When two kinds of polymers are selected from the formula [25], the ratio of the first polymer to the second polymer is preferably 95:5 to 5:95 by weight.

The average molecular weight of the polymer shown by the general formulae [24], [1] and [25] may not be specifically limited so long as usable as resist compositions and is, as a preferable range, generally 3,000 to 50,000, more preferably 5,000 to 25,000, in the terms of a weight average molecular weight (Mw) measured by GPC method using polystyrene as a standard. Further the ratio of a weight average molecular weight of the polymer shown by the general formula [24], [1] or [25] to the number average molecular weight thereof (dispersion: Mw/Mn) is preferably 1.0 to 2.5. Particularly, when the dispersion of the polymer of the formula [1] is more preferably 1.0 to 1.5, the solvingout speed to a developing solution upon development becomes homogeneous, resulting in making side wall shape good and heat resistance high.

The specific examples of the terpolymers shown by the general formula [11] are:

poly(p-1-methoxy-1-methylethoxystyrene/p-hydroxystyrene/styrene), poly((p-1-methoxy-1-methylethoxystyrene/p-hydroxystyrene/p-methylstyrene), poly(p-1-methoxy-1-methylethoxystyrene/p-hydroxystyrene/p-methoxystyrene), poly(p-1-methoxy-1-methylethoxystyrene/p-hydroxystyrene/p-tert-butoxystyrene), poly(p-1-methoxy-1-methylethoxystyrene/p-hydroxystyrene/p-1-methylcyclohexyloxystyrene), poly(p-1-methoxy-1-methylethoxystyrene/p-hydroxystyrene/p-tert-butoxycarbonyloxystyrene), poly(p-1-methoxy-1-methylethoxystyrene/p-hydroxystyrene/tert-butyl p-vinylphenoxy acetate), poly(p-1-methoxy-1-methylethoxystyrene/p-hydroxystyrene/p-ethoxycarbonyloxystyrene), poly(p-1-methoxy-1-methylethoxystyrene/p-hydroxystyrene/1-methylcyclohexyl p-vinylphenoxy acetate), poly(p-1-methoxy-1-methylethoxystyrene/p-hydroxystyrene/p-tetrahydropyranyloxystyrene), poly(m-1-methoxy-1-methylethoxystyrene/m-hydroxystyrene/m-tert-butoxystyrene), poly(p-1-methoxy-2-methylpropoxystyrene/p-hydroxystyrene/p-tert-butoxystyrene), poly(p-1-methoxy-1-n-propoxyethoxystyrene/p-hydroxystyrene/p-tert-butoxystyrene), poly(p-1-benzyloxy-1-methylethoxystyrene/p-hydroxystyrene/styrene), poly(p-1-benzyloxy-1-methylethoxystyrene/p-hydroxystyrene/p-methylstyrene), poly(p-1-benzyloxy-1-methylethoxystyrene/p-hydroxystyrene/p-isopropoxystyrene), poly(p-1-benzyloxy-1-methylethoxystyrene/p-hydroxystyrene/p-tert-butoxystyrene), poly(p-1-benzyloxyethoxystyrene/p-hydroxystyrene/p-isopropoxystyrene), poly(p-1-benzyloxyethoxystyrene/p-hydroxystyrene/p-tert-butoxystyrene), poly(p-1-benzyloxyethoxystyrene/p-hydroxystyrene/p-tert-butoxycarbonyloxystyrene), poly(p-1-ethoxyethoxystyrene/p-hydroxystyrene/styrene), poly(p-1-ethoxyethoxystyrene/p-hydroxystyrene/p-methylstyrene), poly(p-1-ethoxyethoxystyrene/p-hydroxystyrene/p-isopropylstyrene), poly(p-1-ethoxyethoxystyrene/p-hydroxystyrene/p-methoxystyrene), poly(p-1-ethoxyethoxystyrene/p-hydroxystyrene/p-ethoxystyrene), poly(p-1-ethoxyethoxystyrene/p-hydroxystyrene/p-isopropoxystyrene), poly(p-1-ethoxyethoxystyrene/p-hydroxystyrene/p-tert-butoxystyrene), poly(p-1-ethoxyethoxystyrene/p-hydroxystyrene/p-1-methylcyclopentyloxystyrene), poly(p-1-ethoxyethoxystyrene/p-hydroxystyrene/p-cyclohexyloxystyrene), poly(p-1-ethoxyethoxystyrene/p-hydroxystyrene/p-1-methylcyclohexyloxystyrene), poly(p-1-ethoxyethoxystyrene/p-hydroxystyrene/p-methoxycarbonyloxystyrene), poly(p-1-ethoxyethoxystyrene/p-hydroxystyrene/p-ethoxycarbonyloxystyrene), poly(p-1-ethoxyethoxystyrene/p-hydroxystyrene/p-isopropoxycarbonyloxystyrene), poly(p-1-ethoxyethoxystyrene/p-hydroxystyrene/p-tert-butoxycarbonyloxystyrene), poly(p-1-ethoxyethoxystyrene/p-hydroxystyrene/p-isobutoxycarbonyloxystyrene), poly(p-1-ethoxyethoxystyrene/p-hydroxystyrene/p-isopentyloxycarbonyloxystyrene), poly(p-1-ethoxyethoxystyrene/p-hydroxystyrene/p-acetyloxystyrene), poly(p-1-ethoxyethoxystyrene/p-hydroxystyrene/p-pivaloyloxystyrene), poly(p-1-ethoxyethoxystyrene/p-hydroxystyrene/p-cyclohexyloxycarbonyloxystyrene), poly(p-1-ethoxyethoxystyrene/p-hydroxystyrene/p-benzoyloxystyrene), poly(p-1-ethoxyethoxystyrene/p-hydroxystyrene/p-tetrahydrofuranyloxystyrene), poly(p-1-ethoxyethoxystyrene/p-hydroxystyrene/p-1-naphthoyloxystyrene), poly(p-1-ethoxyethoxystyrene/p-hydroxystyrene/p-tetrahydropyranyloxystyrene), poly(p-1-ethoxyethoxystyrene/p-hydroxystyrene/1-methylcyclohexyl p-vinylphenoxy acetate), poly(p-1-ethoxyethoxystyrene/p-hydroxystyrene/tert-butyl p-vinylphenoxy acetate), poly(p-1-ethoxyethoxystyrene/p-hydroxystyrene/ tetrahydropyranyl p-vinylphenoxy acetate), poly(m-1-ethoxyethoxystyrene/m-hydroxystyrene/m-tert-butoxycarbonyloxystyrene), poly(m-1-ethoxyethoxystyrene/m-hydroxystyrene/m-tert-butoxystyrene), poly(p-1-methoxyethoxystyrene/p-hydroxystyrene/ styrene), poly(p-1-methoxyethoxystyrene/p-hydroxystyrene/p-methylstyrene), poly(p-1-methoxyethoxystyrene/p-hydroxystyrene/m-methylstyrene), poly(p-1-methoxyethoxystyrene/p-hydroxystyrene/p-2-naphthoyloxystyrene), poly(p-1-methoxyethoxystyrene/p-hydroxystyrene/p-tert-butylstyrene), poly(p-1-methoxyethoxystyrene/p-hydroxystyrene/p-methoxystyrene), poly(p-1-methoxyethoxystyrene/p-hydroxystyrene/p-ethoxystyrene), poly(p-1-methoxyethoxystyrene/p-hydroxystyrene/p-isopropoxystyrene), poly(p-1-methoxyethoxystyrene/p-hydroxystyrene/p-tert-butoxystyrene), poly(p-1-methoxyethoxystyrene/p-hydroxystyrene/p-1-methylcyclohexyloxystyrene), poly(p-1-methoxyethoxystyrene/p-hydroxystyrene/ tetrahydropyranyl p-vinylphenoxy acetate), poly(p-1-methoxyethoxystyrene/p-hydroxystyrene/p-tetrahydropyranyloxystyrene), poly(p-1-methoxyethoxystyrene/p-hydroxystyrene/p-ethoxycarbonyloxystyrene), poly(p-1-methoxyethoxystyrene/p-hydroxystyrene/p-tert-butoxycarbonyloxystyrene), poly(p-1-methoxyethoxystyrene/p-hydroxystyrene/p-isobutyloxycarbonyloxystyrene), poly(p-1-methoxyethoxystyrene/p-hydroxystyrene/tert-butyl p-vinylphenoxy acetate), poly(p-1-methoxyethoxystyrene/p-hydroxystyrene/1-methylcyclohexyl p-vinylphenoxy acetate), poly(m-1-methoxyethoxystyrene/m-hydroxystyrene/m-tert-butoxystyrene), poly(p-1-isobutoxyethoxystyrene/m-hydroxystyrene/p-methoxystyrene), poly(p-1,1-dimethylethoxyethoxystyrene/m-hydroxystyrene/m-methoxystyrene), poly(p-1,1-dimethylethoxyethoxystyrene/p-hydroxystyrene/p-tert-butoxystyrene), poly(p-1-n-propoxyethoxystyrene/p-hydroxystyrene/p-tert-butoxystyrene), poly(p-1-ethoxy-n-propoxystyrene/p-hydroxystyrene/p-isopropoxystyrene), poly(p-1-ethoxy-n-propoxystyrene/p-hydroxystyrene/p-tert-butoxystyrene), poly(p-1-methoxy-n-propoxystyrene/p-hydroxystyrene/p-tert-butoxystyrene), poly(p-1-ethoxy-n-propoxystyrene/p-hydroxystyrene/p-pivaloyloxystyrene), poly(p-1-ethoxy-n-propoxystyrene/p-hydroxystyrene/p-tetrahydropyranyloxystyrene), poly(p-1-ethoxy-n-propoxystyrene/p-hydroxystyrene/p-tert-butoxycarbonyloxystyrene), poly(p-1-ethoxy-n-propoxystyrene/p-hydroxystyrene/p-methylbenzoyloxystyrene), poly(p-1-methoxy-n-propoxystyrene/p-hydroxystyrene/p-tert-butoxycarbonyloxystyrene), poly(p-1-ethoxy-n-butoxystyrene/p-hydroxystyrene/p-tert-butoxystyrene), poly(p-1-cyclohexyloxyethoxystyrene/p-hydroxystyrene/styrene), poly(p-1-cyclohexyloxyethoxystyrene/p-hydroxystyrene/p-tert-butoxycarbonyloxystyrene), poly(p-1-cyclohexyloxyethoxystyrene/p-hydroxystyrene/p-tert-butoxystyrene), poly(p-1-cyclohexyloxyethoxystyrene/p-hydroxystyrene/p-tetrahydropyranyloxystyrene), poly(p-1-cyclohexyloxyethoxystyrene/p-hydroxystyrene/p-pivaloyloxystyrene), poly(p-1-cyclohexyloxyethoxystyrene/p-hydroxystyrene/p-isopropoxystyrene), poly(p-1-methoxycyclohexyloxystyrene/p-hydroxystyrene/p-tert-butoxystyrene), poly(p-1-ethoxycyclohexyloxymethoxystyrene/p-hydroxystyrene/p-tert-butoxystyrene), poly[p-[α-ethoxy-(p-methylbenzyl)]oxystyrene/p-hydroxystyrene/p-tert-butoxystyrene], poly[p-[α-ethoxy-(p-bromobenzyl)]oxystyrene/p-hydroxystyrene/p-tert-butoxystyrene], etc.

Specific examples of the binary polymers shown by the general formula [12] are:

poly(p-1-methoxy-1-methylethoxystyrene/p-hydroxystyrene), poly(p-1-benzyloxy-1-methylethoxystyrene/p-hydroxystyrene), poly(p-1-ethoxyethoxystyrene/p-hydroxystyrene), poly(p-1-methoxyethoxystyrene/p-hydroxystyrene), poly(p-1-n-butoxyethoxystyrene/p-hydroxystyrene), poly(p-1-isobutoxyethoxystyrene/p-hydroxystyrene), poly(p-1,1-dimethylethoxy-1-methylethoxystyrene/p-hydroxystyrene), poly(p-1-methoxy-n-propoxystyrene/p-hydroxystyrene), poly(p-1-ethoxy-n-propoxystyrene/p-hydroxystyrene), poly(p-1-cyclohexyloxyethoxystyrene/p-hydroxystyrene), poly(p-1,1-dimethylethoxyethoxystyrene/p-hydroxystyrene), poly(p-1-ethoxycyclohexylmethoxystyrene/p-hydroxystyrene), poly[p-(α-ethoxybenzyl)oxystyrene/p-hydroxystyrene], poly[p-[α-ethoxy-(p-methylbenzyl)]oxystyrene/p-hydroxystyrene, etc.

Preferable examples of terpolymers of the formula [27] include:

poly(p-1-ethoxypropoxystyrene/p-hydroxystyrene/methyl methacrylate), poly(p-1-ethoxypropoxystyrene/p-hydroxystyrene/ethyl methacrylate), poly(p-1-ethoxypropoxystyrene/p-hydroxystyrene/tert-butyl methacrylate), poly(p-1-ethoxypropoxystyrene/p-hydroxystyrene/cyclohexyl methacrylate), poly(p-1-ethoxypropoxystyrene/p-hydroxystyrene/isobornyl methacrylate), poly(p-1-ethoxypropoxystyrene/p-hydroxystyrene/norbornyl methacrylate), poly(p-1-ethoxyethoxystyrene/p-hydroxystyrene/methyl acrylate), poly(p-1-ethoxyethoxystyrene/p-hydroxystyrene/tert-butyl acrylate), poly(p-1-ethoxyethoxystyrene/p-hydroxystyrene/cyclohexyl acrylate), poly(p-1-ethoxyethoxystyrene/p-hydroxystyrene/isobornyl acrylate), poly(p-1-ethoxyethoxystyrene/p-hydroxystyrene/methyl methacrylate), poly(p-1-ethoxyethoxystyrene/p-hydroxystyrene/tert-butyl methacrylate), poly(p-1-ethoxyethoxystyrene/p-hydroxystyrene/isobornyl methacrylate), poly(p-1-ethoxypropoxystyrene/p-hydroxystyrene/methyl acrylate), poly(p-1-ethoxypropoxystyrene/p-hydroxystyrene/tert-butyl acrylate), poly(p-1-ethoxypropoxystyrene/p-hydroxystyrene/cyclohexyl acrylate), poly(p-1-ethoxypropoxystyrene/p-hydroxystyrene/isobornyl acrylate), poly(p-1-ethoxypropoxystyrene/p-hydroxystyrene/norbornyl acrylate), poly(p-1-isobutoxyethoxystyrene/p-hydroxystyrene/methyl acrylate),
poly(p-1-isobutoxyethoxystyrene/p-hydroxystyrene/tert-butyl acrylate),
poly(p-1-isobutoxyethoxystyrene/p-hydroxystyrene/cyclohexyl acrylate),
poly(p-1-isobutoxyethoxystyrene/p-hydroxystyrene/isobornyl acrylate),
poly(p-1-isobutoxyethoxystyrene/p-hydroxystyrene/methyl methacrylate),
poly(p-1-isobutoxyethoxystyrene/p-hydroxystyrene/cyclohexyl methacrylate),
poly(p-1-cyclohexyloxyethoxystyrene/p-hydroxystyrene/methyl acrylate),
poly(p-1-cyclohexyloxyethoxystyrene/p-hydroxystyrene/tert-butyl acrylate),
poly(p-1-cyclohexyloxyethoxystyrene/p-hydroxystyrene/cyclohexyl acrylate),
poly(p-1-cyclohexyloxyethoxystyrene/p-hydroxystyrene/isobornyl acrylate),
poly(p-1-cyclohexyloxyethoxystyrene/p-hydroxystyrene/tert-butyl methacrylate),
poly(p-1-cyclohexyloxyethoxystyrene/p-hydroxystyrene/cyclohexyl methacrylate),
poly(p-1-cyclohexyloxyethoxystyrene/p-hydroxystyrene/isobornyl methacrylate), etc.

The polymer shown by the general formula [1] among the polymers of the formula [24] can be produced, for example, by the following methods a) to d).

a) Method-1 (Method for Production of the Polymer of the General Formula [1] Wherein k≠0 and $R^6$ is a Hydrogen Atom, an Alkyl Group or a Straight Chained Alkoxy Group)

A monomer shown by the following general formula: shown by the following general formula:

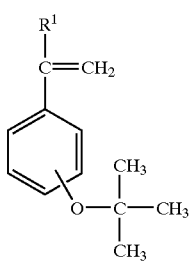

[13]

wherein $R^1$ is as defined above, and an optional amount of a monomer of the following general formula:

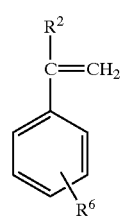

[14]

wherein $R^2$ and $R^6$ are as defined above, are subjected to a polymerization reaction by a conventional polymer production method in the presence of a radical polymerization initiator [for instance, an azo type polymerization initiator such as 2,2'-azobisisobutylonitrile, 2,2'-azobis(2-methylbutylonitrile), 2,2'-azobis(2,4-dimethylvaleronitrile), 2,2'-azobis(methyl 2-methylpropionate), 2,2'-azobis(ethyl 2-methylpropionate) and 2,2'-azobis(methyl 2-methylbutyrate), a peroxide type polymerization initiator such as benzoyl peroxide, lauroyl peroxide, bis(4-tert-butylcyclohexyl)peroxydicarbonate, di-tert-butyl peroxide, tert-butylperoxy 2-ethylhexanoate, tert-butylperoxybenzoate and 1,1-bis(tert-butylperoxy)-3,3,5-trimethylcyclohexane] in an organic solvent such as toluene, 1,4-dioxane, 1,2-dimethoxyethane, tetrahydrofuran, isopropanol, 2-methoxypropanol, 1,3-dioxolane, ethyl acetate and methylethyl ketone under a nitrogen or argon gas stream at 50 to 120° C. for 1 to 10 hours.

As the polymerization initiator, non-nitrile type initiators such as 2,2'-azobis(methyl 2-methylpropionate), 2,2'-azobis(ethyl 2-methylpropionate) and 2,2'-azobis(methyl 2-methylbutyrate) are preferable, because they show high solubility and thus can easily give a low molecular weight polymer and also are advantageous from viewpoints of safety and toxicity.

Further, in order to obtain polymers having a narrow dispersion, it is preferable to conduct an anion living polymerization method in the presence of a catalyst such as n-butyllithium, sec-butyllithium, naphthalene sodium, tert-butyllithium, cummyl potassium and naphthalene potassium in a dehydrated organic solvent such as ethyl ether, 1,2-dimethoxyethane, tetrahydrofuran, methyl ethyl ketone, 1,3-dioxolane, ethyl acetate and toluene under a nitrogen or argon gas stream at −78 to 25° C. for 1 to 10 hours. After the polymerization, a conventional after-treatment for obtaining polymers to separate a copolymer of the following general formula:

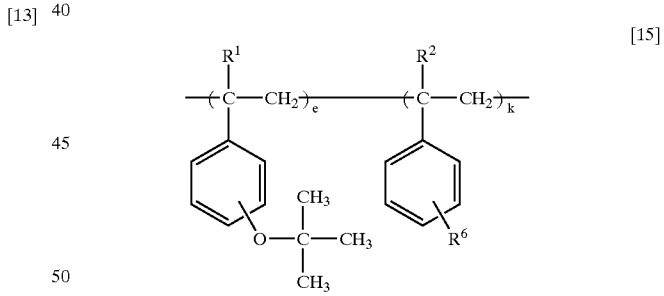

[15]

wherein $R^1$, $R^2$, $R^6$ and k are as defined above; and e is an integer, provided that $0.75 \leq e/(k+e) \leq 0.99$.

Then, the copolymer is reacted with a suitable acid [e.g. an inorganic acid such as sulfuric acid, phosphoric acid, hydrochloric acid, and hydrobromic acid, Lewis acid, an organic acid such as p-toluene sulfonic acid, 10-camphor sulfonic acid, malonic acid and oxalic acid are preferable] in an organic solvent such as tetrahydrofuran, acetone, methanol, ethanol, isopropanol, n-propanol, n-butanol, sec-butanol, tert-butanol, 1,4-dioxane and 1,3-dioxolane at 30 to 110° C. for 1 to 20 hours, whereby the functional group, tert-butyl group, is completely removed. After the reaction, a conventional after-treatment for obtaining polymers is conducted to separate a hydroxystyrene copolymer of the following general formula:

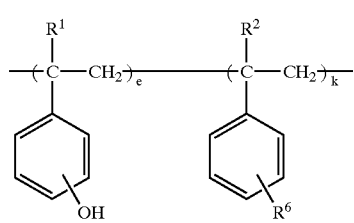

[16]

wherein $R^1$, $R^2$, $R^6$, e and k are as defined above. Then this copolymer is reacted with an appropriate amount of an ethenyl ether compound of the following general formula:

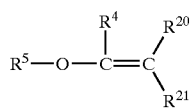

[17]

wherein $R^4$ and $R^5$ are as defined above; $R^{20}$ is a hydrogen atom, a straight-chain or branched alkyl group having 1 to 5 carbon atoms, a straight-chain or branched haloalkyl group having 1 to 5 carbon atoms or a phenyl group which may be substituted; $R^{21}$ is a hydrogen atom or an alkyl group having 1 to 3 carbon atoms; and $R^{20}$ and $R^{21}$ may form together a methylene chain, in an organic solvent such as tetrahydrofuran, acetone, methyl ethyl ketone, 1,4-dioxane, 1,3-dioxolane, methylene chloride, 1,2-dimethoxyethane, ethyl ether and ethyl acetate in the presence of a suitable catalyst [e.g. sulfuric acid, hydrochloric acid, phosphorus oxychloride, p-toluene sulfonic acid, 10-camphor sulfonic acid, chlorosulfonic acid -pyridine salt, pyridine sulfate, pyridine p-toluene sulfonate, etc.] at 10 to 100° C. for 1 to 30 hours, whereby an appropriate amount of the functional group of the formula [7] is chemically introduced.

Alternatively, a copolymer shown by the general formula [16] may be reacted with an appropriate amount of a compound of the formula:

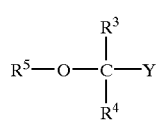

[18]

wherein $R^3$, $R^4$ and $R^5$ are as defined above; and Y is a halogen atom, in an organic solvent such as tetrahydrofuran, acetone, methyl ethyl ketone, 1,4-dioxane, 1,3-dioxolane, methylene chloride, 1,2-dimethoxyethane, ethyl ether, N,N-dimethylformamide, N,N-dimethylactamide and ethyl acetate in the presence of a suitable dehydrohalogenizing agent [e.g. ammonia, dimethylamine, trimethylamine, diethylamine, triethylamine, pyridine, piperidine, morpholine, picoline, etc.] at −10 to 100° C. for 1 to 30 hours, whereby an appropriate amount of the functional group of the formula [7] is chemically introduced. After the reaction, after-treatment is conducted according to a conventional method for obtaining polymers to separate the polymer shown by the above general formula [1].

b) Method-2 (Method for Production of the Polymer of the General Formula [1] Wherein k≠0 and $R^6$ is a tert-Butoxy Group)

The monomer shown by the above general formula [13] is polymerized by the same manner as in the Method-1, followed by conducting after-treatment by a conventional manner for obtaining polymers to separate a homopolymer shown by the following general formula:

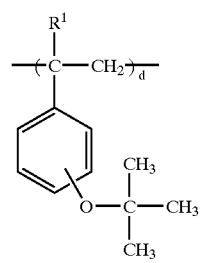

[19]

wherein $R^1$ is as defined above; and d is an integer. Then, this homopolymer is reacted with a suitable acid [e.g. inorganic acid such as sulfuric acid, phosphoric acid, hydrochloride acid and hydrobromic acid, Lewis acid and organic acid such as p-toluene sulfonic acid, 10-camphor sulfonic acid, malonic acid and oxalic acid] in an organic solvent such as tetrahydrofuran, acetone, 1,4-dioxane, 1,3-dioxolane, methanol, ethanol, n-propanol, isopropanol, n-butanol, sec-butanol and tert-butanol at 30 to 100° C. for 1 to 10 hours so as to remove desiredly and partially the functional group, tert-butyl group. After the reaction, after-treatment is conducted by a conventional manner for obtaining polymers to separate a hydroxystyrene copolymer of the following general formula:

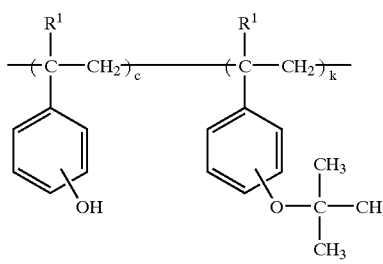

[20]

wherein $R^1$ and k are as defined above; and c=m+n. Then, the functional group shown by the above general formula [7] is introduced into this polymer by the same manner as in the Method-1, followed by conducting after-treatment by a conventional manner for obtaining polymers to separate the polymer shown by the above general formula [1].

c) Method-3 (Method for Production of the Polymer of the General Formula [1] Wherein k=0)

The monomer shown by the above general formula [13] or the following general formula:

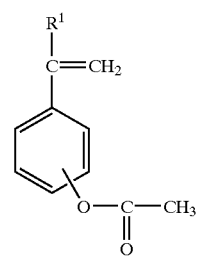

[21]

wherein $R^1$ is as defined above, is respectively polymerized after a similar manner to the Method-1, followed by conducting after-treatment by a conventional manner for obtaining polymers to separate the homopolymer shown by the above general formula [19] or the following general formula:

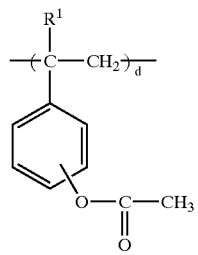

[22]

wherein $R^1$ and d are as defined above. Then, this homopolymer is subjected to a reaction in a solvent such as tetrahydrofuran, 1,4-dioxane, 1,3-dioxolane, ethyl acetate, methanol, ethanol, n-propanol, isopropanol, n-butanol, sec-butanol, tert-butanol and water, if necessary, under nitrogen gas streams in the presence of a suitable base [e.g. sodium hydroxide, potassium hydroxide, aqueous ammonium solution, hydroxyamine, various aqueous tetraalkylammonium hydroxide solutions, various trialkylamines, various triaralkylamines, etc.] or a suitable acid [e.g. inorganic acid such as sulfuric acid, hydrochloric acid, phosphoric acid and hydrobromic acid, Lewis acid, organic acid such as p-toluene sulfonic acid, 10-camphor sulfonic acid, malonic acid and oxalic acid] at 10 to 70° C. for 30 minutes to 10 hours, whereby the functional group, the tert-butyl group or the acetyl group is removed completely. After the reaction, after-treatment is conducted by a conventional manner for obtaining polymers to separate the hydroxystyrene polymer of the following general formula:

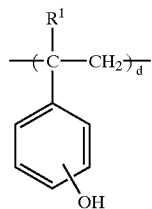

[23]

wherein $R^1$ and d are as defined above. The functional group shown by the above general formula [7] is introduced into the homopolymer by the same method as in the Method-1, followed by conducting after-treatment by a conventional manner for obtaining polymers to separate the polymer shown by the above general formula [1].

d) Method-4 (Method for Production of the Polymer Shown by the General Formula [1] Wherein k≠0 and $R^6$ is a Branched or Cyclic Alkoxy Group, a Saturated Heterocyclic Oxy Group or a Group of the Formula [2])

The homopolymer obtained in the above Method-3 which is shown by the general formula [23] is reacted with a suitable amount of a protecting agent for a hydroxy group such as a dialkyl dicarbonate such as di-tert-butyl dicarbonate, a chloroalkyl carbonate such as chloromethyl carbonate, 2,3-dihydrofuran, 3,4-dihydro-2H-pyrane, tert-butyl monochloroacetate, 1-methylcyclohexyl monochloroacetate, isobutene, dialkyl sulfuric acid, alkyl iodide and 1-methylcyclohexyl chloride in an organic solvent such as tetrahydrofuran, 1,4-dioxane, ethyl acetate, methyl ethyl ketone, acetone, methylene chloride, 1,3-dioxolane, methanol, ethanol, n-propanol, isopropanol, n-butanol, sec-butanol, tert-butanol and methylene chloride in the presence of a suitable base (e.g. potassium hydroxide, sodium hydroxide, sodium carbonate, potassium carbonate, triethylamine, N-methyl-2-pyrrolidone, piperidine, various tetraalkylammonium hydroxide aqueous solutions, various trialkylamines, various triaralkylamines, etc.) at 10 to 100° C. for 30 minutes to 30 hours, followed by conducting after-treatment by a conventional manner for obtaining polymers to give the copolymer of the above general formula [16].

Further, the functional group shown by the above general formula [7] is introduced into the copolymer by the same method as in the Method-1, followed by conducting after-treatment by a conventional manner for obtaining polymers to separate the polymer shown by the above general formula [1].

The polymer of the formula [25] can be synthesized in the same manner as mentioned above for producing the polymer of the formula [1] except for using a monomer of the formula:

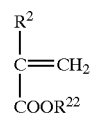

[30]

wherein $R^2$ and $R^{22}$ are as defined above, in place of the monomer of the formula [14].

In the resist compositions of the present invention, in addition to the polymers of the present invention, one or more kinds of the compounds shown by the following general formula [3] and one or more kinds of the compounds shown by the following general formula [4] or [6] are, as a photo-sensitive compound capable of generating an acid by radiation (hereinafter abbreviated as "photoacid generator"), incorporated as an additional component, and those components are generally put into use in the form of being dissolved in a solvent.

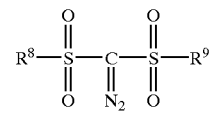

[3]

wherein $R^8$ and $R^9$ are as defined above,

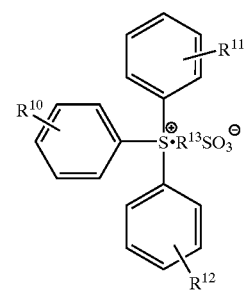

[4]

wherein $R^{10}$, $R^{11}$, $R^{12}$ and $R^{13}$ are as defined above,

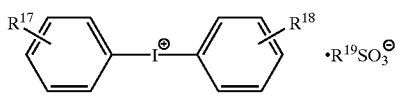

[6]

wherein $R^{17}$, $R^{18}$ and $R^{19}$ are as defined above.

The branched or cyclic alkyl group having 3 to 8 carbon atoms shown by $R^8$ in the general formula [3] includes an isopropyl group, a cyclopropyl group, an isobutyl group, a sec-butyl group, a tert-butyl group, an isopentyl group, a tert-pentyl group, a cyclopentyl group, an 1-methylcyclopentyl group, an isohexyl group, a cyclohexyl group, an 1-methylcyclohexyl group, an isoheptyl group, a tert-octyl group, etc.

The straight-chain, branched or cyclic alkyl group having 1 to 8 carbon atoms shown by $R^9$ in the general formula [3] includes a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, an 1-methylcyclohexyl group, an n-heptyl group, an isoheptyl group, an octyl group, a tert-octyl group, etc.

The aralkyl group shown by $R^9$ in the general formula [3] includes a benzyl group, a phenethyl group, a phenylpropyl group, a methylbenzyl group, a methylphenethyl group, an ethylbenzyl group, etc.

The straight-chain, branched or cyclic alkyl group having 1 to 6 carbon atoms shown by $R^{10}$, $R^{11}$ and $R^{12}$ in the general formula [4] includes a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an 1-methylcyclopentyl, an n-hexyl group, an isohexyl group, a cyclohexyl group, etc.

The straight-chain, branched or cyclic alkoxy group having 1 to 6 carbon atoms shown by $R^{10}$, $R^{11}$ and $R^{12}$ includes a methoxy group, an ethoxy group, an n-propoxy group, an isopropoxy group, a cyclopropoxy group, an n-butoxy group, an isobutoxy group, a tert-butoxy group, a sec-butoxy group, an n-pentyloxy group, an isopentyloxy group, a cyclopentyloxy group, an 1-methylpentyloxy group, an 1-methylcyclopentyloxy group, an n-hexyloxy group, an isohexyloxy group, a cyclohexyloxy group, etc.

The straight-chain, branched or cyclic alkyl group having 1 to 12 carbon atoms shown by $R^{16}$ in the general formula [5] includes a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a cyclopentyl group, an 1-methylpentyl group, an 1-methylcyclopentyl group, an n-hexyl group, an isohexyl group, a cyclohexyl group, an heptyl group, an octyl group, a nonyl group, a decyl group, an undecyl group, a dodecyl group, etc. and the straight-chain or branched alkoxy group having 1 to 4 carbon atoms includes a methoxy group, an ethoxy group, an n-propoxy group, an isopropoxy group, an n-butoxy group, an isobutoxy group, a tert-butoxy group, a sec-butoxy group, etc.

The halogen atom shown by $R^{10}$ to $R^{12}$ in the general formula [4] and that shown by $R^{14}$ to $R^{16}$ in the general formula [5] includes chlorine, bromine, iodine and fluorine.

The straight or branched alkyl group having 1 to 4 carbon atoms shown by $R^{17}$ and $R^{18}$ in the general formula [6] includes a methyl group, an ethyl group, an n-propyl group, an isopropyl group, an n-butyl group, an isobutyl group, a tert-butyl group, a sec-butyl group, etc. and the straight chained or branched alkoxy group having 1 to 4 carbon atoms includes a methoxy group, an ethoxy group, an n-propoxy group, an isopropoxy group, an n-butoxy group, an isobutoxy group, a tert-butoxy group, a sec-butoxy group, etc.

In the phenyl group substituted by the straight, branched or cyclic alkyl having 1 to 12 carbon atoms, which is shown by $R^{19}$ in the general formula [6], said alkyl group includes a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a cyclopentyl group, an 1-methylpentyl group, an 1-methylcyclopentyl group, an n-hexyl group, an isohexyl group, a cyclohexyl group, an heptyl group, an octyl group, a nonyl group, a decyl group, an undecyl group, a dodecyl group, etc.

Specific examples of preferable photoacid generators used in the present invention are as follows.

Photoacid generators of the formula [3]:
1-cyclohexylsulfonyl-1-(1,1-dimethylethylsulfonyl) diazomthane, bis(1,1-dimethylethylsulfonyl) diazomethane, bis(1-methylethylsulfonyl) diazomethane, bis(cyclohexylsulfonyl)diazomethane, bis(1,1-dimethylpropylsulfonyl)diazomethane, 1-n-butylsulfonyl-1-(1,1-dimethylethylsulfonyl) diazomethane, 1-(1-methylethylsulfonyl)-1-benzylsulfonyldiazomethane, bis(tert-octylsulfonyl) diazomethane, etc.

Photoacid generators of the formula [4]:
triphenylsulfonium/dodecylbenzenesulfonate, triphenylsulfonium/p-toluenesulfonate, triphenylsulfonium/10-camphorsulfonate, triphenylsulfonium/2,4,5-trichlorobenzenesulfonate, triphenylsulfonium/3-trifluoromethylbenzenesulfonate, triphenylsulfonium/pyridine-3-sulfonate, diphenyl-p-tolylsulfonium/dodecylbenzenesulfonate, diphenyl-p-tolylsulfonium/p-toluenesulfonate, diphenyl-p-tolylsulfonium/10-camphorsulfonate, diphenyl-p-tolylsulfonium/benzenesulfonate, diphenyl-p-tolylsulfonium/2,4,5-trichlorobenzenesulfonate, diphenyl-p-tolylsulfonium/2,5-dichlorobenzenesulfonate, diphenyl-p-tolylsulfonium/4-n-octylbenzenesulfonate, diphenyl-p-tolylsulfonium/4-methoxybenzenesulfonate, diphenyl-p-tolylsulfonium/4-tert-butylbenzenesulfonate, diphenyl-p-tolylsulfonium/4-fluorobenzenesulfonate, diphenyl-p-tolylsulfonium/4-chlorobenzenesulfonate, diphenyl-p-tolylsulfonium/3-trifluoromethylbenzenesulfonate, diphenyl-p-tolylsulfonium/pyridine-3-sulfonate, diphenyl-p-tolylsulfonium/4-ethylbenzenesulfonate, diphenyl-p-tolylsulfonium/2,4-dimethylbenzenesulfonate, diphenyl-p-tolylsulfonium/2,5-dimethylbenzenesulfonate, diphenyl-o-tolylsulfonium/p-toluenesulfonate, diphenyl-o-tolylsulfonium/trifluoromethanesulfonate, diphenyl-o-tolylsulfonium/10-camphorsulfonate, diphenyl-o-tolylsulfonium/2,4-dimethylbenzenesulfonate, diphenyl-o-tolylsulfonium/2,5-dimethylbenzenesulfonate, diphenyl-o-tolylsulfonium/benzenesulfonate, diphenyl-o-tolylsulfonium/4-tert-butylbenzenesulfonate, diphenyl-o-tolylsulfonium/3-trifluoromethylbenzenesulfonate, p-tert-butylphenyldiphenylsulfonium/p-toluenesulfonate, p-tertbutylphenyldiphenylsulfonium/10-camphorsulfonate, p-tert-butylphenyldiphenylsulfonium/4-methoxybenzenesulfonate, p-tert-butoxyphenyldiphenylsulfonium/4-chlorobenzenesulfonate, p-cyclohexylphenyldiphenylsulfonium/p-toluenesulfonate, p-cyclohexylphenyldiphenylsulfonium/10-camphorsulfonate, p-methoxyphenyldiphenylsulfonium/p-toluenesulfonate, p-methoxyphenyldiphenylsulfonium/10-camphorsulfonate, p-tert-butoxyphenyldiphenylsulfonim/p-toluenesulfonate, p-tert-butoxyphenyldiphenylsulfonium/10-camphorsulfonate, p-tert-butoxyphenyldiphenylsulfonium/p-chlorobenzenesulfonate, triphenylsulfonium/1-naphthalenesulfonate, triphenylsulfonium/2-naphthalenesulfonate, diphenyl p-tolylsulfonium/1-naphthalenesulfonate, diphenyl p-tolylsulfonium/2-naphthalenesulfonate, p-tert-butylphenylsulfonium/1-naphthalenesulfonate, p-tert-butyldiphenylsulfonium/1-naphthalenesulfonate, diphenyl-p-phenylthiophenylsulfonium/p-toluenesulfonate, diphenyl-p-phenylthiophenylsulfonium/10-camphorsulfonate, etc.

Photoacid generators of the formula [6]:
diphenyliodonium/p-toluenesulfonate, diphenyliodonium/10-camphorsulfonate, p-methoxyphenylphenyliodonium/p-toluenesulfonate, p-methoxyphenylphenyliodonium/10-camphorsulfonate, bis(p-methylphenyl)iodonium/p-toluenesulfonate, bis(p-methylphenyl)iodonium/benzenesulfonate, bis(p-tert-butylphenyl)iodonium/p-toluenesulfonate, bis(p-tert-butylphenyl)iodonium/benzenesulfonate, bis(p-tert-butoxyphenyl)iodonium/p-toluenesulfonate, bis(p-tert-butoxyphenyl)iodonium/10-camphorsulfonate, bis(p-tert-butoxyphenyl)iodonium/benzenesulfonate, diphenyliodonium/1-naphthalenesulfonate, diphenyliodonium/2-naphthalenesulfonate, bis(p-tert-butylphenyl)iodonium/1-naphthalenesulfonate, bis(p-tert-butylphenyl)iodonium/2-naphthalenesulfonate, etc.

Among the above photoacid generators, those of the formula [3] can easily be synthesized according to JP-A 4-210960. The photoacid generators of the formula [4] can easily be synthesized according to Hashimoto et al "Nippon-Kagaku-Zasshi, 87(10), p 63 (1966) and Y. Endo, "Chem. Pharm. Bull.", 29(12), p 3753 (1981). The photoacid generators of the formula [6] can easily be synthesized according to F. M. Beringer et al, "J. Am. Chem. Soc.", 81, p 342 (1959), and F. M. Beringer et al, "J. Am. Chem. Soc.", 75, p 2705 (1953).

The most valuable characteristics of the present resist composition lie in that the use of two or more kinds of the polymers shown by the general formula [24] together with the combination use of the photoacid generator shown by the general formula [3], which shows high light transmittance around 248.4 nm so as to keep high transparency of a resist composition, shows low temperature dependency in heat treatment after exposure (PEB) and can generate a weak acid by exposure, with the photoacid generator shown by the general formula [4] or [6], which shows high efficacy in acid generation by predetermined exposure dose and can generate a strong acid, can improve roughness of side wall while resolution ability, DOF and pattern size homogeneity can be kept even under such ultra fine design rule such as 0.20 μm or less, more specifically 0.18 μm or less, and also can improve of pattern at foot portion (improvement of footing) and further can remove scum. From the viewpoint of improvement of pattern at foot portion and removal of scum, a combination of the photoacid generator shown by the general formula [3] with one shown by the general formula [4] is preferable.

The photoacid generators shown by the general formula [4] or [6] are said as an onium salt, and the characteristic feature of the present invention lies in that the counter anion of the onium salt is one having an aromatic ring such as benzenesulfonate and p-, m- or o-toluenesulfonate or an aliphatic ring (multiple ring) such as 10-camphorsulfonate, and due to this characteristic feature, there is observed such effect that no influence by delay time is affected and thus no size variation occurs and that rectangular pattern shape can be obtained, as compared with conventional formulations wherein onium salts containing trifluoromethanesulfonate as a counter anion have been used.

The photoacid generators shown by the general formula [4] or [6] wherein the counter anion is replaced by known $CF_3SO_3^-$, $PF_6^-$, $AsF_6^-$, $SbF_6^-$ and $BF_4^-$ which generates an ultra strong acid by exposure can never be used in the present invention from viewpoints of difficulty in pattern size control due to influence of delay time, bad pattern shape and low storage stability.

The ratio of the two or more kinds of the photoacid generators to be used in the present invention is not specifically limited so long as the object of the present invention can be attained. There can be used 10 to 100 parts by weight, preferably 10 to 50 parts by weight of the photoacid generators of the formula [4] and/or [6] per 100 parts by weight of one or more kinds of the photoacid generator of the formula [3].

The solvent used in the resist composition of the present invention is not specifically limited so long as it can dissolve the polymer, the photoacid generator and additives such as a basic compound, a deep ultraviolet light absorbents, acidic compounds and surfactants which are used upon necessity, and generally one having good film-forming ability and having no absorption around 220 to 400 nm is preferable. The solvent includes, for example, ① ether group-containing alkylene glycol esters, ② carboxylic acid esters, ③ amide compounds, ④ ketone compounds, ⑤ lactone compounds, ⑥ alkylene glycol ether compounds, ⑦ N-alkylpyrrolidones, etc. These solvents can be used singly or as a mixture thereof. Among these solvents, lactones or a combination of a lactone compound and an ether group-containing alkylene glycol ester is preferable from the viewpoints of inhibition of generation of very fine particles and good storage stability. Specific examples are: ① methyl Cellosolve acetate, ethyl Cellosolve acetate, propylene glycol monomethylether acetate, propylene glycolmonoethylether acetate, etc.; ② methyl lactate, ethyl lactate, 2-ethoxyethyl acetate, methyl pyruvate, ethyl pyruvate, methyl 3-methoxypropionate, ethyl 3-methoxypropionate, etc.; ③ N,N-dimethylformamide, N,N-dimethylacetamide; ④ cyclohexane, methyl ethyl ketone, 2-heptanone; ⑤ compounds of the formula:

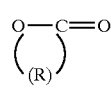

[31]

wherein R is a straight-chain or branched alkylene group having 2 to 4 carbon atoms; [e.g. an ethylene group, a propylene group, a butylene group, a methylethylene group, a methylpropylene group, an ethylethylene group, etc.], for example, β-propiolactone, β-butyrolactone, γ-butyrolactone, γ-valerolactone, δ-valerolactone; ⑥ 1,4-dioxane, diethylene glycol monomethyl ether, diethylene glycol dimethyl ether, ethylene glycol monoisopropyl ether, etc. ⑦ N-methyl-2-pyrrolidone, etc. Examples of a combination of a lactone compound and an ether group-containing alkylene glycol ester is a combination of propylene glycol monomethyl ether acetate and β-propionelactone or γ-butyrolactone.

The ratio of the polymer to the photoacid generator in the resist composition of the present invention is generally 1 to 30 parts by weight, preferably 1 to 20 parts by weight of the photoacid generator per 100 parts by weight of the polymer.

The amount of the solvent in the resist composition of the present invention is not specifically limited so long as there occurs no trouble upon coating on a substrate a positive type resist material obtained by dissolving the polymer and the photoacid generator of the present invention as well as other additives to be used upon necessity in the solvent. There is usually used 1 to parts by weight, preferably 1.5 to 10 parts by weight of the solvent per part by weight of the polymer.

The resist composition of the present invention is generally composed of above mentioned three components (i.e. the polymer (a), the photoacid generator (b) and the solvent (c)). There may additionally be incorporated such components as basic compounds, a deep ultraviolet (UV) absorbents, and acidic compounds and a sensitivity adjusting agent upon necessity for the purpose of improving side wall shape and scum and footing on the interface between the resin and the substrate. Further, a surfactant may be added to the resist composition for the purpose of improving film-forming ability, striation and wetting ability.

As the basic compound used in the resist composition of the present invention upon necessary, there can be used pyridine, piperidine, picoline, methylamine, triethylamine, propylamine, tri-n-butylamine, tri-n-octylamine, dioctylmethylamine, tri-n-benzylamine, dicyclohexylamine, dicyclohexylmethylamine, N-methylpyrrolidine, N-methylpyrrolidone, N-methylpiperidine, triethanolamine, triisopropanolamine, tri-n-propanolamine, dimethyldodecylamine, dimethylhexadecylamine, tris[2-(2-methoxyethoxy)ethyl]amine, tetramethylammonium hydroxide, tetraethylammonium hydroxide, tetra-n-propylammonium hydroxide, tetra-n-butylammonium hydroxide, polyvinyl pyridine, etc. These compounds can be used singly or as a mixture thereof.

The deep ultraviolet absorbent to be used upon necessity in the resist composition of the present invention includes 9-diazofluorene and its derivatives, 1-diazo-2-tetralone, 2-diazo-1-tetralone, 9-diazo-10-phenanthrone, 2,2',4,4'-tetrakis(o-naphthoquinonediazido-4-sulfonyloxy)benzophenone, 2,2',4,4'-tetrahydroxybenzophenone, 1,2,3-tris(o-naphthoquinonediazido-4-sulfonyloxy)propane, anthracene derivatives [e.g. 9-(2-methoxyethoxy)methylanthracene, 9-(2-ethoxyethoxy)methylanthracene, 9-pivaloyloxymethylanthracene, 9-butanoyloxymethylanthracene, 9-(4-methoxybutoxy)methylanthracene, etc.], 9-anthracenemethyl acetate, dihydroxyflavanone, diphenylsulfone, quercetin, trihydroxyflavanone, tetrahydroxyflavanone, 4',6-dihydroxy-2-naphthobenzophenone, 4,4'-dihydroxybenzophenone, 2,2',4,4'-tetrahydroxybenzophenone, etc., among which 2-diazo-10-phenanthrone and anthracene derivatives having strong absorption around 248.4 nm are preferable.

The acidic compound to be used upon necessity in the resist composition of the present invention includes phthalic acid, succinic acid, malonic acid, benzoic acid, salicylic acid, m-hydroxybenzoic acid, p-hydroxybenzoic acid, o-acetylbenzoic acid, o-acetyloxybenzoic acid, o-nitrobenzoic acid, thiosalicyclic acid, thioniconitic acid, diphenolic acid, etc. and also includes salicylaldehyde, succinimide, phthalimide, saccharine, ascorbic acid, etc.

The surfactant to be used upon necessity in the resist compositions of the present invention includes nonionic ones such as polyethylene glycol distearate, polyethylene glycol dilaurate, polyethylene glycol, polypropylene glycol, polyoxyethylene stearyl ether, polyoxyethylene lauryl ether, polyoxyethylene cetyl ether, polyoxyethylene nonyl ether and polyoxyethylene octyl phenyl ether; and other commercially available nonionic surfactants, fluorine-containing nonionic surfactants, fluorine-containing cationic surfactants, fluorine-containing anionic surfactants, cationic surfactants, anionic surfactant, etc. In the present invention, use is preferably made of surfactants, among the above, which show good resist film-forming ability including fluorine-containing surfactants such as Fluorad (a trade name of Sumitomo 3M, Ltd.), Surflon (a trade name of Asahi Glass Co., Ltd.), Unidyne (a trade name of Daikin Industries, Ltd.), Megafac (a trade name of Dainippon Ink & Chemicals, Incorp.) and Eftop (a trade name of Tohkemu Products Corp.), polyethylene glycol, polypropylene glycol, polyoxyethylene cetyl ether, etc.

The plasticizer includes diethyl phthalate, dibutyl phthalate, dipropyl phthalate, etc.

The resist composition of the present invention can be applied both to general semiconductor substrate and semiconductor having radiation absorptive coating (anti-reflective film), among which the application to the latter is much effective.

The semiconductor substrate includes those made of aluminum, polysilicone, aluminum-silicone, tungsten silicide, etc. The formation of anti-reflective film on the substrate can be attained by forming a film using an anti-reflective material such as $Si_3N_4$, $Ti_3N_4$, inorganic anti-reflective film (SiON, amorphous carbon, etc.) after a chemical vapor deposition (CVD) or sputtering method on the semiconductor substrate, or by spin coating of an organic type anti-reflection membrane material on the semiconductor substrate, followed by heat treatment.

Pattern formation using the resist composition of the present invention can be accomplished, for example, in the following way.

The resist composition of the present invention is coated on a semiconductor substrate such as silicone wafer or a semiconductor coating with an anti-reflective film to a coating thickness of 0.3 to 2.0 μm (about 0.1 to 0.5 μm in case it is used as a top layer in a three-layer coat), and is prebaked in an oven at 70 to 140° C. for 10 to 30 minutes or on a hot plate at 70 to 140° C. for 1 to 2 minutes. This resist film is exposed to deep ultraviolet light of 300 nm or less at an exposure dose of 1 to 100 mJ/cm$^2$, through a mask for forming a desired pattern, followed by baking on a hot plate at 70 to 150° C. for 1 to 2 minutes, and development using 0.1 to 5% tetramethylammonium hydroxide (TMAH) aqueous solution for about 0.5 to 3 minutes by a conventional method such as dipping, puddling or spraying to form the desired pattern on the substrate.

The developing solution used in the pattern formation process such as mentioned above is selected among an aqueous alkaline solution having such concentration as capable of increasing the difference between exposed portion and non-exposed portion in their solubility, generally, 0.01 to 20% by weight. The aqueous alkaline solution includes one containing an organic amine such as TMAH, choline and triethanolamine and one containing an inorganic alkaline such as NaOH and KOH.

The characteristic feature of the resist composition of the present invention lies in that two or more kinds of the polymers of the formula [24], are used in combination with the photoacid generator shown by the general formula [3]

and that shown by the general formula [4], or two or more kinds of the polymers shown by the general formula [24] are used in combination with the photoacid generator shown by the general formula [3] and that shown by the general formula [6]. Namely, the photoacid generator shown by the general formula [3] which has so far been used generates a weak acid and thus it is remarkably effective because of its small moving area and high transparency, while it causes problems, in accordance of trend of fining design rules, particularly when used alone, such as poor resolution ability and pattern shapes due to a low acid generation efficacy which results in varying dispersion of acid concentration in a resist membrane exposed to light. Thus, by using the photoacid generator shown by the general formula [4] or [6] which has high acid generation efficacy and can generate a strong acid having smaller moving area as compared with conventional similar onium salts in combination with the photoacid generator shown by the general formula [3], varying acid concentration in an exposed area which is a defect of the photoacid generator shown by the general formula [3] can be removed to give homogeneous (or uniform) acid concentration, and also variation of pattern size in accordance with time lapse after exposure (delay time) which is observed in using the photoacid generator shown by the general formula [4] or [6] alone can be inhibited, and therefore, high resolution ability and DOF which are required for ultra fine transcription technologies necessarily accompanied with 0.20 μm or less design rule, particularly 0.18 μm or less design rule can be attained, a stable pattern size can be maintained during the time lapse (delay time) from exposure to heat treatment and further improvement of substrate dependency and roughness of side wall can be realized while keeping the above mentioned characteristics. Still further, by the combination of specific photoacid generators, removal of footing and scum in a resist pattern which have been observed in using anti-reflective film (inorganic or organic anti-reflective film) becomes possible.

Use of two or more kinds of the polymers shown by the general formula [24] makes it possible to inhibit influence by the delay time and homogenize a pattern size in the surface of wafer due to the common monomer unit shown by the general formula [8] containing the functional group shown by the general formula [7] in those polymers which results in becoming alkaline soluble in short time by the act of the acid generated by exposure. This is a large difference from known resist materials in which two kinds of polymers are used.

Further, high heat resistance, high dry-etching resistance and strong adhesion to a substrate material can be attained because of the hydroxystyrene unit shown by the general formula [9] as an additional constituent unit.

Still further, because of the monomer unit of the formula [26], more concretely that of the formula [10] or [28] as an additional constituent unit, a ratio of the monomer unit shown by the general formula [8] in the polymer can be reduced which causes increasing a heat resistance of the whole polymer, increasing dry-etching resistance, inhibiting influence of proximity effect, reducing developing speed upon development, etc., resulting in improvement of roughness of side wall.

The monomer unit shown by the general formula [10] wherein $R^6$ is a branched or cyclic alkoxy group having 3 to 8 carbon atoms, a saturated heterocyclicoxy group or a group shown by the general formula [2] is changed into a hydroxystyrene unit soluble in alkaline developing solution by removing the functional group in the presence of acid, but in the polymer of the present invention, the monomer unit shown by the general formula [8] containing the functional group shown by the general formula [7] is more rapidly and easily changed into a hydroxystyrene unit by removing the protecting group by the act of an acid, and therefore the monomer unit shown by the general formula [10] does not directly affect so much to a chemical amplification effect.

However, this unit clearly gives contribution to dissolving speed in a developing solution and resolution ability, and for instance, as compared with a case of using polymers containing a monomer unit not (or hardly) influenced chemically by an act of an acid such as styrene, an alkyl-substituted styrene, a straight chained alkoxystyrene, etc. which corresponds to one wherein $R^6$ is a hydrogen atom, an alkyl group or a straight chained alkoxy group, the polymer mentioned above is preferable because of higher dissolving speed in a developing solution upon development and a much excellent resolution ability, DOF and a pattern shape.

It is confirmed that the resist composition of the present invention can generate an acid upon exposure by not only deep ultraviolet light and KrF excimer laser light but also i-line light, electron beams and soft X-ray beams so that chemical amplification is caused. Therefore, the resist composition of the present invention is one which can form a pattern utilizing a chemical amplification effect by irradiation with a low dose of deep ultraviolet light, KrF excimer laser light, i-line light, electron beams or soft X-ray beams.

The following is concrete explanation of the effect of the present invention. Namely, the part exposed by KrF excimer laser light, deep ultraviolet light, etc. can generate an acid by the following photo-reactions shown by the Equations 1 to 3.

Equation 1:

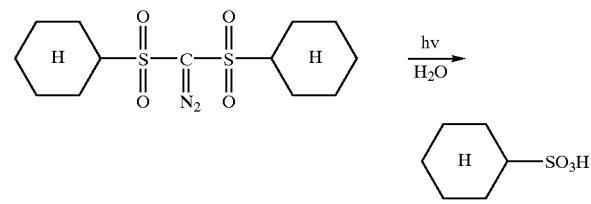

Equation 2:

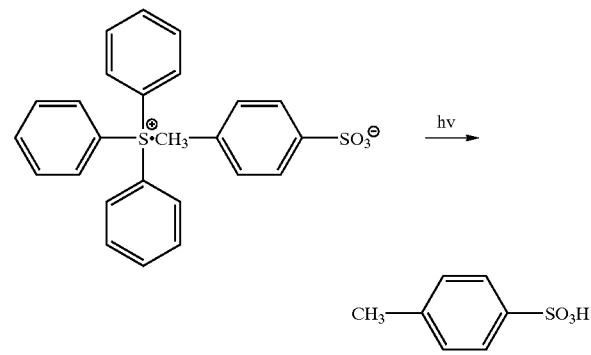

Equation 3:

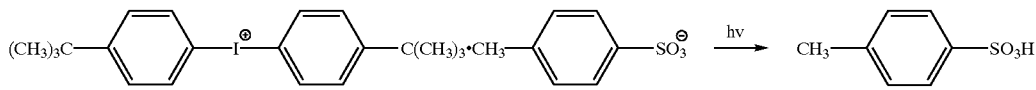

By heating after the exposure process, according to the following equation 4, the specific functional group (in the following Equation 4, it means an 1-ethoxyethoxy group) of the polymer is subjected to chemical change by the act of the acid to give a hydroxy group, whereby the polymer becomes alkaline soluble and dissolved out into the developing solution upon development.
Equation 4:

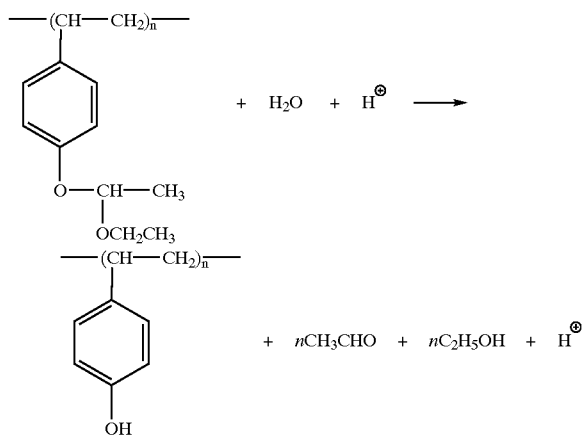

On the other hand, in the non-exposed portion, no chemical change occurs even by heating because of non-generation of acid and there occurs such an effect by the photoacid generator as protecting the hydrophilic group of the polymer used for the purpose of strengthening adhesive to the substrate material from being permeated in the developing solution. In this way, when the pattern formation is conducted by using the resist composition of the present invention, there occurs a large difference between the exposed portion and non-exposed portion in their solubility into the developing solution, and further strong adhesion of the polymer to the substrate material on the non-exposed portion, and therefore no peeling-off of the membrane upon development occurs which results in a pattern having good contrast can be formed. Further, as shown in the above equation 4, the acid generated by exposure can act also as a catalyst, and therefore it is enough to generate the necessary amount of the acid by exposure which results in reducing an amount of energy for exposure.

In the following, the present invention is further explained in details referring to Examples, Production Examples, Reference Examples and Comparative Examples, and the present invention is not limited thereto by any means.

A part of polymers used in the Examples and Comparative Examples (no Production Example is shown), photoacid generators, UV absorbents, etc. were synthesized according to the methods disclosed in Japanese Patent No. 2500533 (U.S. Pat. No. 5,216,135, EPC No. 440374); JP-A 4-211258 (U.S. Pat. No. 5,350,660, EPC No. 440374); JP-A 5-249682 (EPC Publication No. 520642); JP-A 4-251259; JP-A 10-48826; JP-A 10-53621; Y. Endo et al. Chem. Pharm. Bull., 29(12), 3753 (1981); Hashimoto et al. Nippon Kagakuzassi, 87(10), 63 (1966); F. M. Beringer et al., J. Am. Chem. Soc., 81, 342 (1959); M. Desbois et al., Bull. Chim. Soc. France, 1974, 1956 or C. D. Beard et al., J. Org. Chem., 38, 3673 (1973), the disclosure of these references being hereby incorporated by reference.

PRODUCTION EXAMPLE 1

Synthesis of Poly(p-1-ethoxyethoxystyrene/p-hydroxystyrene/p-tert-butoxystyrene)

(1) A catalytic amount of 2,2'-azobis(methyl 2-methyl propionate) was added to 35.2 g of p-tert-butoxystyrene in isopropanol, followed by conducting a polymerization reaction at 80° C. for 6 hours in a nitrogen gas stream. The reaction solution was cooled and poured into 1500 ml of aqueous methanol solution to precipitate out. The precipitated polymer was filtered, washed with methanol and dried under reduced pressure to give 33.4 g of poly(p-tert-butoxystyrene) as white powders. Mw: about 20000, Mw/Mn: 1.90 (GPC method: polystyrene as standard).

(2) 30.0 Grams of poly(p-tert-butoxystyrene) obtained in above (1) was dispersed in isopropanol, and 30 ml of concentrated hydrochloric acid was added thereto, followed by conducting a reaction at 70 to 80° C. for 4 hours with stirring. After cooling, the reaction solution was poured into 1500 ml of water to precipitate out. The precipitated polymer was filtered, washed with water and dried under reduced pressure to give 18.8 g of poly(p-hydroxystyrene/p-tert-butoxystyrene) as white powders. A ratio of p-hydroxystyrene unit and p-tert-butoxystyrene unit in the obtained polymer was about 94:6 by $^1$HNMR measurement. Mw: about 15000, Mw/Mn: 1.90 (GPC method: polystyrene as standard).

(3) 15.7 Grams of poly(p-hydroxystyrene/p-tert-butoxystyrene) obtained in above (2) and 3.2 g of ethylvinyl ether were dissolved in 140 ml of 1,4-dioxane and a catalytic amount of pyridinium p-toluenesulfonate was added thereto, followed by conducting a reaction at room temperature for 24 hours with stirring. After the reaction, the resultant was poured into 3000 ml of water to precipitate out. The precipitated polymer was filtered, washed with water and dried under reduced pressure to give 15.5 g of poly(p-1-ethoxyethoxystyrene/p-hydroxystyrene/p-tert-butoxystyrene) as white powders. A ratio of p-1-ethoxyethoxystyrene unit, p-hydroxystyrene unit and p-tert-butoxystyrene unit in the obtained polymer was about 30:64:6. Mw: about 18000, Mw/Mn: 1.90 (GPC method: polystyrene as standard).

PRODUCTION EXAMPLE 2

Synthesis of Poly(p-1-ethoxyethoxystyrene/p-hydroxystyrene/p-methylstyrene)

(1) 2,2'-Azobis(methyl 2-methylpropionate) was added to a mixture of 100 g (0.567 mole) of p-tert-butoxystyrene and 3.54 g (0.03 mole) of p-methylstyrene in 1,4-dioxane, followed by conducting a polymerization reaction at 80° C. for 6 hours under nitrogen gas streams. After cooling, the reaction solution was poured into 5000 ml of aqueous methanol solution to precipitate out. The precipitated polymer was filtered, washed with methanol and dried under reduced pressure to give 92.3 g of poly(p-tert-butoxystyrene/p-methylstyrene) as white powders. A ratio of p-tert-butoxystyrene unit and p-methylstyrene unit was about 95:5 by $^1$HNMR. Mw was about 20000 and Mw/Mn was 1.90 by GPC measurement using polystyrene as standard.

(2) 70 Grams of poly(p-tert-butoxystyrene/p-methylstyrene) obtained in above (1) was dissolved in 1,4-dioxane, and 100 ml of concentrated hydrochloric acid was added thereto, followed by conducting a reaction at 70 to 80° C. for 4 hours with stirring. After cooling, the reaction solution was poured into 5000 ml of water to precipitate out. The precipitated polymer was filtered, washed with water and dried under reduced pressure to give 47.6 g of poly(p-hydroxystyrene/p-methylstyrene) as white powders. A ratio of p-hydroxystyrene unit and p-methylstyrene unit in the obtained polymer was about 95:5 by $^1$HNMR measurement. Mw: about 14500, Mw/Mn: 1.89 (GPC method: polystyrene as standard).

(3) 15.0 Grams of poly(p-hydroxystyrene/p-methylstyrene) obtained in above (2) and 3.5 g of ethylvinyl ether were dissolved in 150 ml of 1,4-dioxane and a catalytic amount of pyridinium p-toluenesulfonate was added thereto, followed by conducting a reaction at room temperature for 24 hours with stirring. After the reaction, the resultant was poured into 5000 ml of water to precipitate out. The precipitated polymer was filtered, washed with water and dried under reduced pressure to give 11.5 g of poly(p-1-ethoxyethoxystyrene/p-hydroxystyrene/p-methylstyrene) as white powders. A ratio of p-1-ethoxyethoxystyrene unit, p-hydroxystyrene unit and p-methylstyrene unit in the obtained polymer was about 35:60:5 by $^1$HNMR measurement. Mw: about 18000, Mw/Mn: 1.86 by GPC method (polystyrene as standard).

PRODUCTION EXAMPLE 3

Synthesis of Poly(p-1-ethoxyethoxystyrene/p-hydroxystyrene/styrene)

(1) With the use of 81.1 g (0.46 mole) of p-tert-butoxystyrene and 4.6 g (0.04 mole) of styrene, the same polymerization reaction and after-treatment as Production example 2-(1) were conducted to give 77.1 g of poly(p-tert-butoxystyrene/styrene) as white powders. A ratio of p-tert-butoxystyrene unit and styrene unit in the obtained polymer was about 92:8 by $^1$HNMR. Mw: about 20000, molecular dispersion: 1.90 (GPC method; polystyrene as standard).

(2) With the use of 70 g of poly(p-tert-butoxystyrene/styrene) obtained in above (1), the same reaction and after-treatment as Production example 1-(2) were conducted to give 44.0 g of poly(p-hydroxystyrene/styrene) as white powders. A ratio of p-hydroxystyrene unit and styrene unit of the obtained polymer was about 92:8 by $^1$HNMR. Mw: about 15000, Mw/Mn: 1.89 (GPC method; polystyrene as standard).

(3) With the use of 15.0 g of poly(p-hydroxystyrene/styrene) obtained in above (2) and 3.2 g of vinylethyl ether, the same reaction and after-treatment as Production example 2-(3) were conducted to give 14.1 g of poly(p-1-ethoxyethoxystyrene/p-hydroxystyrene/styrene) as white powders. A ratio of p-1-ethoxyethoxystyrene unit, p-hydroxystyrene unit and styrene unit of the obtained polymer was about 32:60:8 by $^1$HNMR. Mw: about 18000, Mw/Mn: 1.85 (GPC method; polystyrene as standard).

PRODUCTION EXAMPLE 4

Synthesis of Poly(p-1-ethoxyethoxystyrene/p-hydroxystyrene/p-tert-butoxystyrene)

(1) 52.9 Grams of p-tert-butoxystyrene was dissolved in 150 ml of dried tetrahydrofuran, and 5.5 ml of n-butyllithium (1.6 mol, n-hexane solution) was added thereto at −78° C. under nitrogen gas streams, followed by conducting a reaction at −78 to −72° C. for 2 hours with stirring. 10 ml of methanol was added to a red reaction solution at −70° C. to terminate the polymerization reaction. Then, the reaction solution was poured into 1500 ml of methanol and the upper layer was discarded by decantation. The resulting viscous oily material was dried under reduced pressure to give 51.5 g of poly(p-tert-butoxystyrene) as white powders. Mw: about 22000, Mw/Mn: 1.12 (GPC: polystyrene as standard).

(2) 30.0 Grams of poly(p-tert-butoxystyrene) obtained in above (1) was dissolved in isopropanol, and 30 ml of concentrated hydrochloric acid was added thereto, followed by conducting a reaction at 70 to 80° C. for 4 hours with stirring. After cooling, the reaction solution was poured into 1500 ml of water to precipitate out. The precipitated polymer was filtered, washed with water and dried under reduced pressure to give 19.2 g of poly(p-hydroxystyrene/p-tert-butoxystyrene) as white powders. A ratio of p-hydroxystyrene unit and p-tert-butoxystyrene unit in the obtained polymer was about 90:10 by $^1$HNMR measurement. Mw: about 15500, Mw/Mn: 1.12 (GPC method: polystyrene as standard).

(3) 15.7 Grams of poly(p-hydroxystyrene/p-tert-butoxystyrene) obtained in above (2) and 3.2 g of ethylvinyl ether were dissolved in 150 ml of ethyl acetate, and a catalytic amount of p-toluenesulfonic acid was added thereto, followed by conducting a reaction at room temperature for 6 hours with stirring. After the reaction, the resultant was neutralized with triethylamine and concentrated. The viscous oily residue was dissolved in 100 ml of acetone and poured into 3000 ml of water to precipitate out. The precipitated polymer was filtered, washed with water and dried under reduced pressure to give 15.5 g of poly(p-1-ethoxyethoxystyrene/p-hydroxystyrene/p-tert-butoxystyrene) as white powders. A ratio of p-1-ethoxyethoxystyrene unit, p-hydroxystyrene unit and p-tert-butoxystyrene unit in the obtained polymer was about 30:60:10 by $^1$HNMR measurement. Mw: about 18200, Mw/Mn: 1.11 by GPC method (polystyrene as standard).

PRODUCTION EXAMPLE 5

Synthesis of Poly(p-1-methoxy-1-methylethoxystyrene/p-hydroxystyrene/p-tert-butoxystyrene)

15.7 Grams of poly(p-hydroxystyrene/p-tert-butoxystyrene) obtained by the same method as described in Production Example 4-(1) and(2) and 3.2 g of 2-methoxy-1-propene were dissolved in 120 ml of tetrahydrofuran and a catalytic amount of phosphorus oxychloride was added thereto, followed by conducting a reaction at room temperature for 16 hours with stirring. After the reaction, the resultant was poured into 5000 ml of water to precipitate out. The precipitated polymer was filtered, washed with water and dried under reduced pressure to give 14.3 g of poly(p-1-methoxy-1-methylethoxystyrene/p-hydroxystyrene/p-tert-butoxystyrene) as white powders. A ratio of p-1-methoxy-1-methylethoxystyrene unit, p-hydroxystyrene unit and p-tert-butoxystyrene unit of the obtained polymer was about 34:56:10 by $^1$HNMR. Mw: about 18000, Mw/Mn: 1.12 (GPC method; polystyrene as standard).

PRODUCTION EXAMPLE 6

Synthesis of Poly(p-1-ethoxy-n-propoxystyrene/p-hydroxystyrene/p-tert-butoxystyrene)

With the use of 15.7 g of poly(p-hydroxystyrene/p-tert-butoxystyrene) obtained by the same method as described in Production Example 4-(1) and (2) and 1.8 g of 1-ethoxy-1-propene, the same reaction and after-treatment as in Production Example 4-(3) was conducted to give 16.2 g of poly(p-1-ethoxy-n-propoxystyrene/p-hydroxystyrene/p-tert-butoxystyrene) as white powders. A ratio of p-1-ethoxy-n-propoxystyrene unit, p-hydroxystyrene unit and p-tert-butoxystyrene unit was about 23:67:10 by $^1$HNMR. Mw: about 18200, Mw/Mn: 1.11 (GPC method; polystyrene as standard).

PRODUCTION EXAMPLE 7

Synthesis of Poly(p-1-cyclohexyloxyethoxystyrene/p-hydroxystyrene/p-tert-butoxystyrene)

With the use of 15.7 g of poly(p-hydroxystyrene/p-tert-butoxystyrene) obtained by the same method as in Production Example 4-(1) and (2) and 3.2 g of cyclohexylvinyl ether, the same reaction and after-treatment as in Production Example 4-(3) was conducted to give 17.0 g of poly(p-1-cyclohexyloxyethoxystyrene/p-hydroxystyrene/p-tert-butoxystyrene) as white powders.

A ratio of p-1-cyclohexyloxyethoxystyrene unit, p-hydroxystyrene unit and p-tert-butoxystyrene unit was about 22:68:10 by $^1$HNMR. Mw: about 18200, Mw/Mn: 1.12 (GPC method; polystyrene as standard).

PRODUCTION EXAMPLE 8

Synthesis of Poly(p-1-ethoxyethoxystyrene/p-hydroxy-styrene/p-tetrahydropyranyloxystyrene)

(1) With the use of 32.4 g of p-acetyloxystyrene, the same living anion polymerization reaction and after-treatment as in Production Example 4-(1) were conducted to give 31.5 g of poly(p-acetyloxystyrene) as white powders. Mw: about 18000, Mw/Mn: 1.20 (GPC method: polystyrene as standard).

(2) 16.2 Grams of poly(p-acetyloxystyrene) obtained in above (1) was dissolved in 1,4-dioxane, and 25 ml of concentrated hydrochloric acid was added thereto, followed by refluxing for 4 hours with stirring. After the reaction, the reaction solution was poured into 1000 ml of water to precipitate out. The precipitated polymer was filtered, washed with water and dried under reduced pressure to give 11.4 g of poly(p-hydroxystyrene) as white powders. Mw: about 14000, Mw/Mn: 1.18 (GPC method: polystyrene as standard).

(3) 10.8 Grams of poly(p-hydroxystyrene) obtained in above (2) was dissolved in 72 ml of 1,4-dioxane, and 2.5 g of 3,4-dihydro-2H-pyrane and 0.05 g of pyridinium p-toluenesulfonate were added thereto, followed by conducting a reaction at 25 to 30° C. for 15 hours with stirring. The reaction solution is poured into 1000 ml of water to precipitate out. The precipitated polymer was filtered, washed with water and dried under reduced pressure to give 10.0 g of poly(p-hydroxystyrene/p-tetrahydropyranyloxystyrene) as white powders. A ratio of p-hydroxystyrene unit and p-tetrahydropyranyloxystyrene unit was about 90:10 by $^1$HNMR. Mw: about 15500, Mw/Mn: 1.18 (GPC method: polystyrene as standard).

(4) With the use of 9.5 g of poly(p-hydroxystyrene/p-tetrahydropyranyloxystyrene) obtained in above (3) and 2.5 g of ethylvinyl ether, the same reaction and after-treatment as in Production Example 4-(3) were conducted. The resulting polymer was filtered, washed with water and dried under reduced pressure to give 9.9 g of poly(p-1-ethoxyethoxystyrene/p-hydroxystyrene/p-tetrahydropyranyloxystyrene) as white powders. A ratio of p-1-ethoxyethoxystyrene unit, p-hydroxystyrene unit and p-tetrahydropyranyloxystyrene unit was about 30:60:10 by $^1$HNMR. Mw: about 18500, Mw/Mn: 1.18 (GPC method: polystyrene as standard).

PRODUCTION EXAMPLE 9

Synthesis of Poly(p-1-ethoxyethoxystyrene/p-hydroxystyrene/p-tert-butoxycarbonyloxystyrene)

(1) 35.3 Grams of poly(p-tert-butoxystyrene) obtained by the same method as described in Production Example 4-(1) was suspended in isopropanol and 50 ml of concentrated hydrochloric acid was added thereto, followed by refluxing for 4 hours with stirring. After cooling, the reaction solution was poured into 3000 ml of water to precipitate out. The precipitated polymer was filtered, washed with water and dried under reduced pressure to give 22.1 g of poly(p-hydroxystyrene) as white powders. Mw: about 15000, Mw.Mn: 1.12 (GPC method: polystyrene as standard).

(2) 16.2 Grams of poly(p-hydroxystyrene) obtained in above (1) was dissolved in 60 ml of ethyl acetate, and 5.6 g of di-tert-butyl dicarbonate and 5.5 g of triethylamine were added thereto, followed by conducting a reaction at room temperature for 4 hours with stirring. After the reaction, ethyl acetate was removed by distillation under reduced pressure and the residue was dissolved in 80 ml of acetone and poured into 1000 ml of water to precipitate out. The precipitated polymer was filtered, washed with water and dried under reduced pressure to give 12.2 g of poly(p-hydroxystyrene/p-tert-butoxycarbonyloxystyrene) as white powders. A ratio of p-hydroxystyrene unit and p-tert-butoxycarbonyloxystyrene unit was about 90:10 by $^1$HNMR. Mw: about 16700, Mw/Mn: 1.12 (GPC method: polystyrene as standard).

(3) With the use of 11.4 g of poly(p-hydroxystyrene/p-tert-butoxycarbonyloxystyrene) obtained in above (2) and 2.5 g of ethylvinyl ether, the same reaction and after-treatment as in Production Example 4-(3) were conducted to give 6.7 g of poly(p-1-ethoxyethoxystyrene/p-hydroxystyrene/p-tert-butoxycarbonyloxystyrene) as white powders. A ratio of p-1-ethoxyethoxystyrene unit, p-hydroxystyrene unit and p-tert-butoxycarbonyloxystyrene unit was about 30:60:10 by $^1$HNMR. Mw: about 20000, Mw/Mn: 1.12 (GPC method: polystyrene as standard).

PRODUCTION EXAMPLE 10

Synthesis of Poly(p-1-cyclohexyloxyethoxystyrene/p-hydroxystyrene/p-tert-butoxycarbonyloxystyrene)

With the use of 11.4 g of poly(p-hydroxystyrene/p-tert-butoxycarbonyloxystyrene) obtained by the same method as described in Production Example 9-(1) and (2) and 2.7 g of cyclohexylvinyl ether, the reaction and after-treatment were conducted by the same manner as in Production Example 4-(3) to give 13.2 g of poly(p-1-cyclohexyloxyethoxystyrene/p-hydroxystyrene/p-tert-butoxycarbonyloxystyrene) as white powders. A ratio of p-1-cyclohexyloxyethoxystyrene unit, p-hydroxystyrene unit and p-tert-butoxycarbonyloxystyrene of the obtained polymer was about 22:68:10 by $^1$HNMR. Mw: about 20000, Mw/Mn: 1.12 (GPC method: polystyrene as standard).

PRODUCTION EXAMPLE 11

Synthesis of Poly(p-1-methoxyethoxystyrene/p-hydroxystyrene/tert-butyl p-vinylphenoxyacetate)

(1) 16.2 Grams of poly(p-hydroxystyrene) obtained by the same manner as described in Production Example 9-(1), 2.7 g of tert-butyl monochloroacetate and 2.5 g of anhydrous potassium carbonate were suspended in 200 ml of acetone, followed by refluxing for 2 hours with stirring. After cooling, insolubles were removed by filtration, and the filtrate was poured in 3000 ml of water to precipitate out. The precipitated polymer was filtered, washed with water and dried under reduced pressure to give 15.8 g of poly(p-hydroxystyrene/tert-butyl p-vinylphenoxyacetate) as white powders. A ratio of p-hydroxystyrene unit and tert-butyl p-vinylphenoxyacetate unit of the obtained polymer was about 93:7 by $^1$HNMR. Mw: about 16500, Mw./Mn: 1.12 (GPC method: polystyrene as standard).

(2) With the use of 13.2 g of poly(p-hydroxystyrene/tert-butyl p-vinylphenoxyacetate) obtained in above (1) and 2.0 g of methylvinyl ether, the same reaction and after-treatment as in Production Example 4-(3) were conducted to give 11.0 g of poly(p-1-methoxyethoxystyrene/p-hydroxystyrene/tert-butyl p-vinylphenoxyacetate) as white powders. A ratio of p-1-methoxyethoxystyrene, p-hydroxystyrene unit and tert-butyl p-vinylphenoxyacetate was about 33:60:7 by $^1$NMR. Mw: about 20000, Mw/Mn: 1.12 (GPC method: polystyrene as standard).

PRODUCTION EXAMPLE 12

Synthesis of Poly(p-1-ethoxyethoxystyrene/p-hydroxystyrene/p-isopropoxystyrene)

(1) 16.2 Grams of poly(p-hydroxystyrene) obtained by the same method as described in Production Example 9-(1) and 1.3 g of isopropyl chloride were dissolved in 100 ml of acetone, and 1.8 g of triethylamine was added thereto, followed by conducting a reaction at 50 to 55° C. for 5 hours with stirring. The reaction solution was poured into 1000 ml of water and the upper layer was removed by decantation. The obtained viscous resinous material was dissolved in 75 ml of acetone and the resultant was poured into 500 ml of water.

The precipitated rubbery resin was dried under reduced pressure to give 15.4 g of poly(p-hydroxystyrene/p-isopropoxystyrene) as white powders. A ratio of p-hydroxystyrene unit and p-isopropoxystyrene unit of the obtained polymer was about 90:10 by $^1$HNMR. Mw: about 15500, Mw/Mn:1.12 (GPC method: polystyrene as standard).

(2) With the use of 15.0 g of poly(p-hydroxystyrene/p-isopropoxystyrene) obtained in above (1) and 3.0 g of ethylvinyl ether, the same reaction and after-treatment as described in Production Example 4-(3) were conducted to give 16.2 g of poly(p-1-ethoxyethoxystyrene/p-hydroxystyrene/p-isopropoxystyrene) as white powders. A ratio of p-1-ethoxyethoxystyrene, p-hydroxystyrene unit and p-isopropoxystyrene unit was about 30:60:10 by $^1$NMR. Mw: about 18000, Mw/Mn: 1.12 (GPC method: polystyrene as standard).

PRODUCTION EXAMPLE 13

Synthesis of Poly(p-1-ethoxyethoxystyrene/p-hydroxystyrene/p-benzoyloxystyrene)

(1) With the use of 16.2 g of poly(p-hydroxystyrene) obtained by the same manner as described in Production Example 9-(1), 2.3 g of benzoyl chloride and 1.8 g of triethylamine, the same reaction and after-treatment as described in Production Example 12-(1) were conducted to give 16.2 g of poly(p-hydroxystyrene/p-benzoyloxystyrene) as white powders. A ratio of p-hydroxystyrene unit and p-benzoyloxystyrene unit was about 90:10 by $^1$NMR. Mw: about 16000, Mw/Mn: 1.12 (GPC method: polystyrene as standard).

(2) With the use of 15.7 g of poly(p-hydroxystyrene/p-benzoyloxystyrene) obtained in above (1) and 3.0 g of ethylvinyl ether, the same reaction and after-treatment as described in Production Example 4-(3) were conducted to give 16.5 g of poly(p-1-ethoxyethoxystyrene/p-hydroxystyrene/p-benzoyloxystyrene) as white powders. A ratio of p-1-ethoxyethoxystyrene, p-hydroxystyrene unit and p-benzoyloxystyrene unit was about 30:60:10 by $^1$NMR. Mw: about 18800, Mw/Mn: 1.12 (GPC method: polystyrene as standard).

PRODUCTION EXAMPLE 14

Synthesis of Poly(p-1-ethoxyethoxystyrene/p-hydroxystyrene/p-pivaloyloxystyrene)

(1) With the use of 16.2 g of poly(p-hydroxystyrene) obtained by the same manner as described in Production Example 9-(1), 2.0 g of pivaloyl chloride and 1.8 g of triethylamine, the same reaction and after-treatment as described in Production Example 12-(1) were conducted to give 16.0 g of poly(p-hydroxystyrene/p-pivaloyloxystyrene) as white powders. A ratio of p-hydroxystyrene unit and p-pivaloyloxystyrene unit was about 90:10 by $^1$NMR. Mw: about 16000, Mw/Mn: 1.12 (GPC method: polystyrene as standard).

(2) With the use of 15.5 g of poly(p-hydroxystyrene/p-pivaloyloxystyrene) obtained in above (1) and 3.0 g of ethylvinyl ether, the same reaction and after-treatment as described in Production Example 4-(3) were conducted to give 16.7 g of poly(p-1-ethoxyethoxystyrene/p-hydroxystyrene/p-pivaloyloxystyrene) as white powders. A ratio of p-1-ethoxyethoxystyrene, p-hydroxystyrene unit and p-pivaloyloxystyrene unit was about 30:60:10 by $^1$NMR. Mw: about 18500, Mw/Mn: 1.12 (GPC method: polystyrene as standard).

PRODUCTION EXAMPLE 15

Synthesis of Poly(p-1-ethoxyethoxystyrene/p-hydroxystyrene)

(1) With the use of 105.9 g of poly(p-tert-butoxystyrene) [Mw: about 20000, Mw/Mn: 1.20 (GPC method: polystyrene as standard); Nippon Soda Co., Ltd.], the same reaction and after-treatment as described in Production Example 9-(1) were conducted to give 66.3 g of poly(p-hydroxystyrene) as white powders. Mw: about 14000, Mw/Mn: 1.20 (GPC method: polystyrene as standard).

(2) With the use of 16.2 g of poly(p-hydroxystyrene) obtained in the above (1) and 4.7 g of ethylvinyl ether, the same reaction and after-treatment as described in Production Example 4-(3) were conducted to give 18.2 g of poly(p-1-ethoxyethoxystyrene/p-hydroxystyrene) as white powders. A ratio of p-1-ethoxyethoxystyrene unit and p-hydroxystyrene unit was about 40:60 by $^1$NMR. Mw: about 17500, Mw/Mn: 1.18 (GPC method: polystyrene as standard).

PRODUCTION EXAMPLE 16

Synthesis of Poly(p-1-isobutoxyethoxystyrene/p-hydroxystyrene)

With the use of 16.2 g of poly(p-hydroxystyrene) obtained in Production example 15-(1) and 6.5 g of isobutylvinyl ether, the same reaction and after-treatment as described in Production Example 4-(3) were conducted to give 19.8 g of poly(p-1-isobutoxyethoxystyrene/p-hydroxystyrene) as white powders. A ratio of p-1-isobutoxyethoxystyrene unit and p-hydroxystyrene unit was about 40:60 by $^1$NMR. Mw: about 18500, Mw/Mn: 1.18 (GPC method: polystyrene as standard).

PRODUCTION EXAMPLE 17

Synthesis of Poly(p-1-ethoxy-n-propoxystyrene/p-hydroxystyrene)

With the use of 16.2 g of poly(p-hydroxystyrene) obtained in Production Example 15-(1) and 5.6 g of 1-ethyl-1-propenyl ether [Wako Pure Chemical Industries, Ltd.], the same reaction and after-treatment as described in Production Example 4-(3) were conducted to give 19.0 g of poly(p-1-ethoxy-n-propoxystyrene/p-hydroxystyrene) as white powders. A ratio of p-1-ethoxy-n-propoxystyrene unit and p-hydroxystyrene unit was about 40:60 by $^1$NMR. Mw: about 18000, Mw/Mn: 1.18 (GPC method: polystyrene as standard).

PRODUCTION EXAMPLE 18

Synthesis of Poly(p-tert-butoxycarbonyloxystyrene/p-hydroxystyrene)

With the use of 18.0 g of poly(p-hydroxystyrene) obtained in Production Example 15-(1) and 11.0 g of di-tert-butyl dicarbonate, the same reaction and after-treatment as described in Production Example 9-(2) were conducted to give 18.2 g of poly(p-tert-butoxycarbonyloxystyrene/p-hydroxystyrene) as white powders. A ratio of p-tert-butoxycarbonyloxystyrene unit and p-hydroxystyrene unit was about 30:70 by $^1$NMR. Mw: about 17500, Mw/Mn: 1.20 (GPC method: polystyrene as standard).

PRODUCTION EXAMPLE 19

Synthesis of Poly(p-tetrahydropyranyloxystyrene/p-hydroxystyrene)

16.2 Grams of poly(p-hydroxystyrene) [Mw: about 15000, Mw/Mn: 1.14 (GPC method: polystyrene as standard); Nippon Soda Co., Ltd.] was dissolved in 180 ml of 1,2-dimethoxyethane, and 4.1 g of 3,4-dihydro-2H-pyrane and 0.7 ml of sulfuric acid were added thereto, followed by conducting a reaction at 30 to 40° C. for 15 hours with stirring. After the reaction, the resultant was concentrated under reduced pressure, and the residue was neutralized in sodium carbonate and poured into 2000 ml of water to precipitate out. The precipitated polymer was filtered, washed with water and dried under reduced pressure to give 18.0 g of poly(p-tetrahydropyranyloxystyrene/p-hydroxystyrene) as white powders. A ratio of p-tetrahydropyranyloxystyrene unit and p-hydroxystyrene unit of the obtained polymer was about 30:70 by $^1$HNMR. Mw: about 18000, Mw/Mn:1.14 (GPC method: polystyrene as standard).

PRODUCTION EXAMPLE 20

Synthesis of Poly(p-tert-butoxystyrene/p-hydroxystyrene)

(1) With the use of 45.4 g (0.28 mole) of p-acetyloxystyrene, 21.2 g (0.12 mole) of p-tert-butoxystyrene and a catalytic amount of 2,2'-azobis(methyl 2-methylpropionate), the same reaction and after-treatment as in Production Example 2-(1) were conducted to give 59.7 g of poly(p-tert-butoxystyrene/p-acetyloxystyrene) as white powders. A ratio of p-acetyloxystyrene unit and p-tert-butoxystyrene unit was about 70:30 by $^1$HNMR. Mw: about 15000, Mw/Mn: 1.75 (GPC method: polystyrene as standard).

(2) With the use of 46.3 g of poly(p-acetyloxystyrene/p-tert-butoxystyrene) obtained in above (1) and 100 ml of 28% aqueous ammonium solution in 300 ml of isopropanol, refluxing was. conducted for 4 hours with stirring. The reaction solution was neutralized with acetic acid and concentrated under reduced pressure. The residue was dissolved in 150 ml of acetone and poured into 5000 ml of water to precipitate out. The precipitated polymer was filtered, washed with water and dried under reduced pressure to give 34.0 g of poly(p-hydroxystyrene/p-tert-butoxystyrene) as white powders. A ratio of p-tert-butoxystyrene unit and p-hydroxystyrene unit of the obtained polymer was about 30:70 by $^1$HNMR. Mw: about 12000, Mw/Mn: 1.70 (GPC method: polystyrene as standard).

PRODUCTION EXAMPLE 21

Synthesis of Poly(p-1-ethoxyethoxystyrene/p-hydroxystyrene/p-tert-butoxystyrene)

(1) With the use of 48.6 g (0.30 mole) of p-acetyloxystyrene, 17.6 g (0.10 mole) of p-tert-butoxystyrene and a catalytic amount of 2,2'-azobis(2,4-dimethylvaleronitrile), the same reaction and after-treatment as described in Production Example 2-(1) were conducted, and the resulting viscous resinous material was dissolved in 200 ml of acetone and poured into 1000 ml of 50% aqueous methanol solution. The precipitated resin was recovered by decantation and dried under reduced pressure to give 59.7 g of poly(p-acetyloxystyrene/p-tert-butoxystyrene) as white powders. A ratio of p-acetyloxystyrene unit and p-tert-butoxystyrene unit was about 3:1 by $^1$HNMR. Mw: about 10500, Mw/Mn: 1.32 (GPC method: polystyrene as standard).

(2) With the use of 46.3 g of poly(p-acetyloxystyrene/p-tert-butoxystyrene) obtained in above (1), the same reaction and after-treatment as described in Production Example 20-(2) were conducted to give 33.8 g of poly(p-tert-butoxystyrene/p-hydroxystyrene) as white powders. A ratio of p-tert-butoxystyrene unit and p-hydroxystyrene unit of the obtained polymer was about 1:3 by $^1$HNMR. Mw: about 8540, Mw/Mn: 1.30 (GPC method: polystyrene as standard).

(3) With the use of 26.8 g of poly(p-tert-butoxystyrene/p-hydroxystyrene) obtained in above (2), the same reaction and after-treatment as described in Production Example 4-(3) were conducted to give 25.0 g of poly(p-1-ethoxyethoxystyrene/p-hydroxystyrene/p-tert-butoxystyrene) as white powders. A ratio of p-1-ethoxyethoxystyrene unit, p-hydroxystyrene unit and p-tert-butoxystyrene unit of the obtained polymer was about 10:65:25 by $^1$HNMR. Mw: about 9200, Mw/Mn: 1.30 (GPC method: polystyrene as standard).

PRODUCTION EXAMPLE 22

Synthesis of Poly(p-1-ethoxy-n-propoxystyrene/p-hydroxystyrene/p-isopropoxystyrene)

15.0 Grams of poly(p-hydroxystyrene/p-isopropoxystyrene) obtained by the same manner as described in Production Example 12-(1) was reacted with 3.1 g of 1-ethoxy-n-propyl chloride, which was obtained by reaction of propionaldehyde, ethanol and hydrogen chloride and distillation of the product, in 150 ml of pyridine at 20 to 30° C. for 6 hours, and the reaction solution was poured in water, and the precipitated viscous oily material was subjected to the same reaction and after-treatment as described in Production Example 4-(3) were carried out to give 16.5 g of poly(p-1-ethoxy-n-propoxystyrene/p-hydroxystyrene/p-isopropoxystyrene) as pale yellowish powders. A ratio of p-1-ethoxy-n-propoxystyrene unit, p-hydroxystyrene unit and p-isopropoxystyrene unit was about 26:64:10 by $^1$HNMR. Mw: about 18200, Mw/Mn: 1.12 (GPC method: polystyrene as standard).

PRODUCTION EXAMPLE 23

Synthesis of Poly(p-1-ethoxy-n-propoxystyrene/p-hydroxystyrene/p-pivaloyloxystyrene)

With the use of 15.5 g of poly(p-hydroxystyrene/p-pivaloyloxystyrene) obtained by the same manner as described in Production Example 14-(1) and 3.0 g of 1-ethoxy-n-propyl chloride, the same reaction and after-treatment as described in Production Example 22 were conducted to give 16.5 g of poly(p-1-ethoxy-n-propoxystyrene/p-hydroxystyrene/p-pivaloyloxystyrene) as pale yellowish powders. A ratio of p-1-ethoxy-n-propoxystyrene unit, p-hydroxystyrene unit and p-pivaloyloxystyrene unit was about 23:67:10 by $^1$HNMR. Mw: about 18800, Mw/Mn: 1.12 (GPC method: polystyrene as standard).

PRODUCTION EXAMPLE 24

Synthesis of Poly(p-1-ethoxyethoxystyrene/p-hydroxystyrene/styrene)

(1) The same reaction and after-treatment using 81.1 g (0.46 mole) of p-tert-butoxystyrene and 4.6 g (0.04 mole) of styrene as described in Production Example 4-(1) were conducted to give 80.5 g of poly(p-tert-butoxystyrene/styrene) as white powders. Then, the polymer was subjected to the same reaction and after-treatment as described in Production Example 9-(1) to give 44.0 g of poly(p-hydroxystyrene/styrene) as white powders. A ratio of p-hydroxystyrene unit and styrene unit was about 92:8 by $^1$HNMR. Mw: about 15500, Mw/Mn: 1.08 (GPC method: polystyrene as standard).

(2) With the use of 15.0 g of poly(p-hydroxystyrene/styrene) obtained in above (1) and 3.2 g of vinylethyl ether, the same reaction and after-treatment as described in Production Example 4-(3) were conducted to give 15.0 g of poly(p-1-ethoxyethoxystyrene/p-hydroxystyrene/styrene) as white powders. A ratio of p-1-ethoxyethoxystyrene unit, p-hydroxystyrene unit and styrene unit was about 32:60:8 by $^1$HNMR. Mw: about 18300, Mw/Mn: 1.06 (GPC method: polystyrene as standard).

PRODUCTION EXAMPLE 25

Synthesis of Poly(p-1-methoxyethoxystyrene/p-hydroxystyrene/p-tert-butylstyrene)

(1) With the use of 100 g (0.567 mole) of p-tert-butoxystyrene and 5.3 g (0.03 mole) of p-tert-butylstyrene, the same polymerization reaction and after-treatment as described in Production Example 2-(1) were conducted. Then, the resulting viscous resinous material was dissolved in 300 g of acetone and poured into 2000 ml of 50% aqueous methanol solution and precipitated resin was subjected to decantation. This process step was conducted further twice, and the resultant was dried under reduced pressure to give 94.5 g of poly(p-tert-butoxystyrene/p-tert-butylstyrene) as white powders. Then, 70 g of the polymer was subjected to the same reaction and after-treatment as described in Production Example 9-(1) to give 48.5 g of poly(p-hydroxystyrene/p-tert-butylstyrene) as white powders. A ratio of p-hydroxystyrene unit and p-tert-butylstyrene unit was about 94:6 by $^1$HNMR. Mw: about 16000, Mw/Mn: 1.29 (GPC method: polystyrene as standard).

(2) With the use of 15.0 g of poly(p-hydroxystyrene/p-tert-butylstyrene) obtained in above (1) and 2.8 g of 1-methoxyethyl chloride, which was obtained by reacting acetaldehyde, methanol and hydrogenchloride, followed by distillation, the same reaction and after-treatment as described in Production Example 22 were conducted to give 15.8 g of poly(p-1-methoxyethoxystyrene/p-hydroxystyrene/p-tert-butylstyrene) as white powders. A ratio of p-1-methoxyethoxystyrene unit, p-hydroxystyrene unit and p-tert-butylstyrene unit was about 30:64:6 by $^1$HNMR. Mw: about 19000, Mw/Mn: 1.25 (GPC method: polystyrene as standard).

PRODUCTION EXAMPLE 26

Synthesis of Poly(p-1-ethoxyethoxystyrene/p-hydroxystyrene/cyclohexyl acrylate)

(1) In 250 ml of isopropanol, 176.3 g (1.0 mole) of p-tert-butoxystyrene and 16.2 g (0.105 mole) of cyclohexyl acrylate were dissolved, followed by addition of 2,2'-azobisisobutyronitrile in a nitrogen stream to carry out the polymerization reaction at 75° C. for 6 hours. After cooling the reaction solution, the reaction product was poured into 5,000 ml of an aqueous solution of methanol for depositing polymer. The deposited polymer was filtered, washed with methanol and dried under reduced pressure to give 172.5 g of white powders of poly(p-tert-butoxystyrene/cyclohexyl acrylate). The resulting polymer had the p-tert-butoxystyrene unit and the cyclohexyl acrylate unit in a ratio of about 90:10 by mole according to $^1$HNMR and $^{13}$CNMR measurements. Mw was about 20,600 and Mw/Mn was 1.55, when measured by GPC using polystyrene as standard.

(2) The poly(p-tert-butoxystyrene/cyclohexyl acrylate) obtained in above (1) in an amount of 130.5 g was subjected to the same reaction and after-treatment as described in Production Example 1-(2) to give 85.5 g of white powders of poly(p-hydroxystyrene/cyclohexyl acrylate). The resulting polymer had the p-hydroxystyrene unit and the cyclohexyl acrylate unit in a ratio of about 90:10 by mole according to $^1$HNMR measurement. Mw was about 14,800 and Mw/Mn was 1.50, when measured by GPC using polystyrene as standard.

(3) The poly(p-hydroxystyrene/cyclohexyl acrylate) obtained in (2) in an amount of 24.7 g and 4.6 g of ethyl vinyl ether were dissolved in ethyl acetate, followed by addition of pyridinium p-toluenesulfonate to carry out the reaction at room temperature for 6 hours with stirring. After treating the reaction solution in the same manner as described in Production Example 1-(3), 26.1 g of poly(p-1-ethoxyethoxystyrene/p-hydroxystyrene/cyclohexyl acrylate) as white powders. The resulting polymer had the p-1-ethoxyethoxystyrene unit, the p-hydroxystyrene unit and the cyclohexyl acrylate unit in a ratio of about 30:60:10 by $^1$HNMR and $^{13}$CNMR measurements. Mw was about 17,500 and Mw/Mn was 1.50, when measured by GPC using polystyrene as standard.

PRODUCTION EXAMPLE 27

Synthesis of Poly(p-1-ethoxyethoxystyrene/p-hydroxystyrene/isobornyl acrylate)

(1) In 250 ml of isopropanol, 176.3 g (1.0 mole) of p-tert-butoxystyrene and 21.9 g (0.105 mole) of isobornyl acrylate were dissolved, followed by addition of 2,2'-azobis(methyl 2-methylpropionate) in a nitrogen stream to carry out the polymerization reaction at 75° C. for 6 hours. After treating the reaction solution in the same manner as described in Production Example 26-(1), 177.4 g of poly(p-tert-butoxystyrene/isobornyl acrylate) was obtained as white powders. The resulting polymer had the p-tert-butoxystyrene unit and the isobornyl acrylate unit in a ratio of about 90:10 according to $^1$HNMR and $^{13}$CNMR measurements. Mw was about 23,600 and Mw/Mn was 1.60, when measured by GPC using polystyrene as standard.

(2) The poly(p-tert-butoxystyrene/isobornyl acrylate) obtained in above (1) in an amount of 125.6 g was subjected to the same reaction and after-treatment as described in Production Example 1-(2) to give 81.2 g of poly(p-hydroxystyrene/isobornyl acrylate) as white powders. The resulting polymer had the p-hydroxystyrene unit and the isobornyl acrylate unit in a ratio of about 90:10 according to $^1$HNMR measurement. Mw was about 17,000 and Mw/Mn was 1.55, when measured by GPC using polystyrene as standard.

(3) Using 25.8 g of the poly(p-hydroxystyrene/isobornyl acrylate) obtained in above (2) and 4.6 g of ethyl vinyl ether, the same reaction and after-treatment as described in Production Example 26-(3) were carried out to give 25.9 g of poly(p-1-ethoxyethoxystyrene/p-hydroxystyrene/isobornyl acrylate) as white powders. The resulting polymer had the p-1-ethoxyethoxystyrene unit, the p-hydroxystyrene unit and the isobornyl acrylate unit in a ratio of about 30:60:10 by weight according to $^1$HNMR and $^{13}$CNMR measurements. Mw was about 20,000 and Mw/Mn was 1.55, when measured by GPC using polystyrene as standard.

PRODUCTION EXAMPLE 28

Synthesis of Poly(p-1-ethoxy-n-propoxystyrene/p-hydroxystyrene/tert-butyl methacrylate)

(1) In 125 ml of isopropanol, 73.1 g (0.5 mole) of p-acetoxystyrene and 7.1 g (0.05 mole) of tert-butyl methacrylate were dissolved, followed by addition of 2,2'-azobis(2,4-dimethylvaleronitrile) in a nitrogen stream to carry out polymerization the reaction at 70° C. for 7 hours. After treating the reaction solution in the same manner as described in Production Example 26-(1), 72.5 g of poly(p-acetoxystyrene/tert-butyl methacrylate) was obtained as white powders. The resulting polymer had the p-acetoxystyrene unit and the tert-butyl methacrylate unit in a ratio of about 92:8 by $^1$HNMR and $^{13}$CNMR measurements. Mw was about 15,800 and Mw/Mn was 1.70, when measured by GPC using polystyrene as standard.

(2) In 1,000 ml of acetone, 73.0 g of the poly(p-acetoxystyrene/tert-butyl methacrylate) obtained in above (1) was dissolved, followed by addition of 125 g of 25% ammonia water to carry out the reaction at room temperature for 20 hours with stirring. After condensing the reaction solution under reduced pressure, 500 ml of ethyl acetate and 5,000 ml of water were added, followed by stirring, standing still, separation of an organic layer, washing with a diluted aqueous solution of hydrochloric acid and washing with water. After condensing the organic layer under reduced pressure, the residue was dissolved in 150 ml of acetone, followed by pouring into 2,000 ml of water to deposit polymer. The deposited polymer was filtered and dried under reduced pressure to give 54.8 g of poly(p-hydroxystyrene/tert-butyl methacrylate) as white powders. The resulting polymer has the p-hydroxystyrene unit and the tert-butyl methacrylate unit in a ratio of about 92:8 by $^1$HNMR measurement. Mw was about 13,200 and Mw/Mn was 1.60, when measured by GPC using polystyrene as standard.

(3) Using 29.5 g of the poly(p-hydroxystyrene/tert-butyl methacrylate) obtained in above (2) and 5.5 g of 1-ethoxy-1-propene, the reaction and after-treatment were conducted in the same manner as described in Production Example 1-(3) to give 31.5 g of poly(p-1-ethoxy-n-propoxystyrene/p-hydroxystyrene/tert-butyl methacrylate) as white powders. The resulting polymer had the p-1-ethoxy-n-propoxystyrene unit, the p-hydroxystyrene unit and the tert-butyl methacrylate unit in a ratio of about 30:62:8 by $^1$HNMR and $^{13}$CNMR measurements. Mw was about 16,000 and Mw/Mn was 1.60, when measured by GPC using polystyrene as standard.

PRODUCTION EXAMPLE 29

Synthesis of Poly(p-1-cyclohexyloxyethoxystyrene/p-hydroxystyrene/methyl methacrylate)

(1) In 120 ml of isopropanol, 88.1 g (0.5 mole) of p-tert-butoxystyrene and 5.0 g (0.05 mole) of methyl methacrylate were dissolved, followed by addition of 2,2'-azobis(2,4-dimethylvaleronitrile) in a nitrogen stream to carry out the polymerization reaction at 70° C. for 6 hours. After treating the reaction solution in the same manner as described in Production Example 26-(1), 83.8 g of poly(p-tert-butoxystyrene/methyl methacrylate) was obtained as white powders. The resulting polymer had the p-tert-butoxystyrene unit and the methyl methacrylate unit in a ratio of about 90:10 by $^1$HNMR and $^{13}$CNMR measurements. Mw was about 17,600 and Mw/Mn was 1.75, when measured by GPC using polystyrene as standard.

(2) Using 67.5 g of the poly(p-tert-butoxystyrene/methyl methacrylate) obtained in above (1), the reaction and after-treatment were carried out in the same manner as described in Production Example 1-(2) to give 40.5 g of poly(p-hydroxystyrene/methyl methacrylate) as white powders. The resulting polymer had the p-hydroxystyrene unit and the methyl methacrylate unit in a ratio of about 90:10 by $^1$HNMR measurement. Mw was about 12,300 and Mw/Mn was 1.70, when measured by GPC using polystyrene as standard.

(3) Using 23.6 g of the poly(p-hydroxystyrene/methyl methacrylate) obtained in above (2) and 7.0 g of cyclohexyl vinyl ether, the reaction and after-treatment were carried out in the same manner as described in Production Example 1-(3) to give 26.0 g of poly(p-1-cyclohexyloxyethoxystyrene/p-hydroxystyrene/methyl methacrylate) as white powders. The resulting polymer had the p-1-cyclohexyloxyethoxystyrene unit, the p-hydroxystyrene unit and the methyl methacrylate unit in a ratio of about 25:65:10 by $^1$HNMR and $^{13}$CNMR measurements. Mw was about 15,500 and Mw/Mn was 1.70, when measured by GPC using polystyrene as standard.

EXAMPLE 1

A photoresist composition having the following ingredients was prepared.

poly(p-1-ethoxyethoxystyrene/p-hydroxystyrene/p-tert-butoxycarbonyloxystyrene) [Mw=20000; Mw/Mn=1.12: polymer in Production Example 9] 4.5 g poly(p-1-cyclohexyloxyethoxystyrene/p-hydroxystyrene/
p-tert-butoxystyrene) [Mw=18200; Mw/Mn=1.12:
polymer in Production Example 7] 1.5 g bis(cyclohexylsulfonyl)diazomethane 0.3 g triphenylsulfonium/p-toluenesulfonate 0.05 g triethanolamine 0.1 g propylene glycol monomethylether acetate 28.7 g A pattern formation using the above resist composition is explained referring to FIG. 1.

Figure 1B:
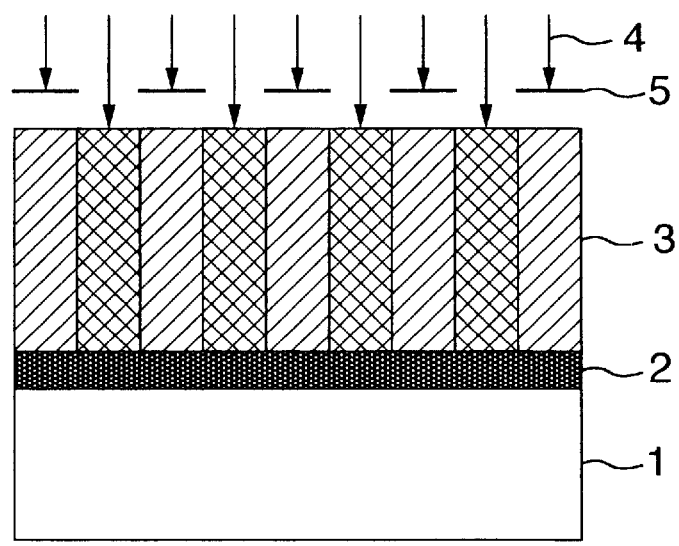
Figure 1C:
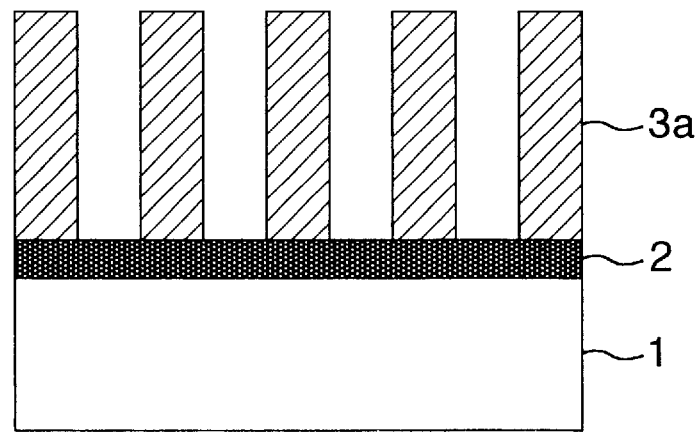

A material for forming anti-reflective coating (DUV-32; mfd. by Brewer Science Co., weakly basic) was spin-coated on the silicone substrate 1 and subjected to heat treatment at 200° C. for 60 seconds on a hot plate to form an anti-reflective film of 0.52 μm thick. The above resist composition 3 was spin-coated on the resulting anti-reflective film 2, followed by pre-baking at 100° C. for 90 seconds on a hot plate to give resist composition film of 0.7 μm thick (FIG. 1A). Then, with the use of KrF excimer laser stepper (NA 0.55), laser light 4 of 248.4 nm was selectively irradiated thereon through a mask 5 (FIG. 1B), and the resultant was post-baked at 110° C. for 90 seconds on a hot plate, followed by developing using an alkaline developing solution (2.38% aqueous tetramethylammonium hydroxide solution) for 60 seconds, whereby only the exposed portion of the resist film was dissolved out to form a positive type pattern 3 a (FIG. 1C). The resulting positive type pattern had a rectangular shape and 0.15 μm line and space (hereinafter abbreviated as L & S) resolution ability under 30 mJ/cm² exposure dose. When exposure by defocus was conducted, there was observed no pattern deterioration up to ±0.7 μm under 0.18 μm L & S, and thus satisfactory DOF was attained. Further, a side wall of the pattern was smooth and no scum was observed.

For the purpose of measurement of a heat resistance of the resist composition of the present invention, the pattern obtained in the above was baked at 130° C. for 4 minutes on a hot plate and the cross sections of the patterns of 0.40 μm and 0.18 μm L & S were investigated by a scanning electron microscope (SEM) to find that the rectangular shape of the pattern was not changed even after the heat treatment and thus heat resistance of the resist film was recognized.

A pattern size change as the time lapse from exposure to heat treatment (PED) was measured on the above resist film to find that there was no change on 0.18 μm L & S pattern size even after 4 hours time lapse and thus it was recognized as stable.

A pattern formation was conducted on a Ti₃N₄ substrate using the above resist composition to obtain such result that a 0.15 μm L & S rectangular pattern could be resolved at 24 mJ/cm² exposure dose. When exposure was conducted by defocus, there was observed no deterioration in 0.18 μm L & S pattern size until ±0.7 μm and thus satisfactory DOF could be obtained.

After storage of the above-prepared resist composition at 23° C. for 1 month or 3 months, a pattern was formed on an anti-reflective film after the same manner as described above to find that a 0.15 μm L & S positive type pattern could be resolved at the same exposure dose and further that DOF at 0.18 μm L & S was up to ±0.7 μm. Thus satisfactory storage stability could be recognized.

EXAMPLES 2 TO 25

Photoresist compositions as described in the following Tables 1 to 12 were prepared.

TABLE 1

| | | |
|---|---|---|
| EXAMPLE 2 | Poly (p-1-ethoxyethoxystyrene/p-hydroxystyrene/p-tert-butoxystyrene) [MW 18000, Mw/Mn = 1.90: polymer in Production Example 1] | 4.5 g |
| | Poly (p-1-ethoxyethoxystyrene/p-hydroxystyrene/styrene) [Mw 18000; Mw/Mn = 1.85: polymer in Production Example 3] | 1.5 g |
| | Bis(cyclohexylsulfonyl)diazomethane | 0.3 g |
| | Triphenylsulfonium/p-toluenesulfonate | 0.05 g |
| | Tri-n-octylamine | 0.1 g |
| | Fluorine-containing nonionic surfactant [commercially available product] | 0.1 g |
| | Propylene glycol monomethyl ether acetate | 28.5 g |
| EXAMPLE 3 | Poly (p-1-methoxy-1-methylethoxystyrene/p-hydroxystyrene/p-tert-butoxystyrene) [Mw 18000, Mw/Mn = 1.12: polymer in Production Example 5] | 4.0 g |
| | Poly (p-1-ethoxyethoxystyrene/p-hydroxystyrene/p-tetrahydropyranyloxystyrene) [Mw 18500; Mw/Mn = 1.18: polymer in Production Example 8] | 2.0 g |
| | Bis (1,1-dimethylethylsulfonyl) diazomethane | 0.3 g |
| | p-tert-Butylphenyldiphenylsulfonium/p-toluenesulfonate | 0.05 g |
| | Tri-n-butylamine | 0.1 g |
| | Propylene glycol monomethyl ether acetate | 28.5 g |

TABLE 2

| | | |
|---|---|---|
| EXAMPLE 4 | Poly (p-1-ethoxyethoxystyrene/p-hydroxystyrene/p-tert-butoxycarbonyloxystyrene) [Mw 20000, Mw/Mn = 1.12] | 3.5 g |
| | Poly (p-1-ethoxy-n-propoxystyrene/p-hydroxystyrene/p-tert-butoxystyrene) [Mw 18200; Mw/Mn = 1.11: polymer in Production Example 6] | 2.5 g |
| | Bis(1,1-dimethylethylsulfonyl)diazomethane | 0.2 g |
| | p-tert-Butylphenyldiphenylsulfonium/p-toluenesulfonate | 0.1 g |
| | Diphenolic acid | 0.1 g |
| | Fluorine-containing nonionic surfactant [commercially available product] | 0.1 g |
| | Ethyl lactate | 6.0 g |
| | Propylene glycol monomethyl ether acetate | 22.0 g |
| EXAMPLE 5 | Poly (p-1-ethoxyethoxystyrene/p-hydroxystyrene/p-tert-butoxystyrene) [Mw 18000, Mw/Mn = 1.90] | 4.5 g |
| | Poly (p-1-ethoxyethoxystyrene/p-hydroxystyrene/p-methylstyrene) [Mw 18000; Mw/Mn = 1.86: polymer in Production Example 2] | 1.5 g |
| | Bis (cyclohexylsulfonyl)diazomethane | 0.3 g |
| | p-Cyclohexylphenyldiphenylsulfonium/p-toluenesulfonate | 0.05 g |
| | Salicylic acid | 0.1 g |
| | Fluorine-containing nonionic surfactant [commercially available product] | 0.1 g |
| | Ethyl lactate | 6.5 g |
| | Propylene glycol monomethyl ether acetate | 22.0 g |

TABLE 3

| | | |
|---|---|---|
| EXAMPLE 6 | Poly (p-1-ethoxyethoxystyrene/p-hydroxystyrene/p-isopropoxystyrene) [Mw 18000, Mw/Mn = 1.12: polymer of Production Example 12] | 5.0 g |
| | Poly (p-1-ethoxyethoxystyrene/p-hydroxystyrene/p-benzoyloxystyrene) [Mw 18800; Mw/Mn = 1.12: polymer in Production Example 13) | 1.0 g |
| | Bis(cyclohexylsulfonyl)diazomethane | 0.3 g |
| | Triphenylsulfonium/p-toluenesulfonate | 0.05 g |
| | Propylene glycol monomethyl ether acetate | 28.6 g |

TABLE 3-continued

| EXAMPLE 7 | Poly (p-1-ethoxyethoxystyrene/p-hydroxy-styrene/p-tert-butoxystyrene) [Mw 18200, Mw/Mn = 1.11: polymer in Production Example 4] | 4.5 g |
|---|---|---|
| | Poly (p-1-cyclohexyoxyethoxystyrene/p-hydroxystyrene/p-tert-butoxycarbonyloxy-styrene) [Mw 20000; Mw/Mn = 1.12: polymer in Production Example 10] | 1.5 g |
| | Bis(1-methylethylsulfonyl)diazomethane | 0.3 g |
| | p-Tolyldiphenylsulfonium/10-camphorsulfonate | 0.05 g |
| | γ-Butyrolactone | 1.5 g |
| | Propylene glycol monomethyl ether acetate | 27.0 g |

TABLE 4

| EXAMPLE 8 | Poly (p-1-ethoxyethoxystyrene/p-hydroxy-styrene) [Mw 17500, Mw/Mn = 1.18: polymer of Production Example 15) | 2.5 g |
|---|---|---|
| | Poly (p-1-ethoxy-n-propoxystyrene/p-hydroxy-styrene) [Mw 18000; Mw/Mn = 1.18: polymer in Production Example 17] | 2.5 g |
| | Poly (p-1-isobutoxyethoxystyrene/p-hydroxy-styrene) [Mw 18500; Mw/Mn = 1.18: polymer in Production Example 16] | 1.0 g |
| | Bis(cyclohexylsulfonyl)diazomethane | 0.3 g |
| | p-tert-Butylphenyldiphenylsulfonium/p-toluenesulfonate | 0.05 g |
| | Succinimide | 0.1 g |
| | Propylene glycol | 0.1 g |
| | Propylene glycol monomethyl ether acetate | 28.5 g |
| EXAMPLE 9 | Poly (p-1-methoxyethoxystyrene/p-hydroxy-styrene/tert-butyl p-vinylphenoxyacetate) [Mw 20000, Mw/Mn = 1.12: polymer in Production Example 11] | 3.5 g |
| | Poly (p-1-ethoxy-n-propoxystyrene/p-hydroxy-styrene) [Mw 18000; Mw/Mn = 1.18) | 2.5 g |
| | Bis(1,1-dimethylethylsulfonyl)diazomethane | 0.3 g |
| | p-Cyclohexylphenyldiphenylsulfonium/p-toluenesulfonate | 0.05 g |
| | γ-Butyrolactone | 5.0 g |
| | Propylene glycol monomethyl ether acetate | 28.5 g |

TABLE 5

| EXAMPLE 10 | Poly (p-1-ethoxyethoxystyrene/p-hydroxy-styrene/p-pivaloyloxystyrene) [Mw 18500, Mw/Mn = 1.12: polymer of Production Example 14] | 5.0 g |
|---|---|---|
| | Poly (p-1-ethoxyethoxystyrene/p-hydroxy-styrene) [Mw 17500; Mw/Mn = 1.18] | 1.0 g |
| | Bis(cyclohexylsulfonyl)diazomethane | 0.3 g |
| | Diphenyl-p-tolylsulfonium/p-toluene-sulfonate | 0.05 g |
| | Dicyclohexylmethylamine | 0.1 g |
| | γ-Butyrolactone | 1.0 g |
| | Propylene glycol monomethyl ether acetate | 28.5 g |
| EXAMPLE 11 | Poly (p-1-ethoxyethoxystyrene/p-hydroxy-styrene/p-isopropoxystyrene) [Mw 18000, Mw/Mn = 1.12] | 5.0 g |
| | Poly (p-1-ethoxy-n-propoxystyrene/p-hydroxy-styrene) [Mw 17500; Mw/Mn = 1.18] | 1.0 g |
| | Bis(cyclohexylsulfonyl)diazomethane | 0.3 g |
| | Diphenyl-p-tolylsulfonium/p-toluene-sulfonate | 0.05 g |
| | Fluorine-containing nonionic surfactant | 0.1 g |
| | γ-Butyrolactone | 1.0 g |
| | Propylene glycol monomethyl ether acetate | 28.5 g |

TABLE 6

| EXAMPLE 12 | Poly (p-1-ethoxyethoxystyrene/p-hydroxy-styrene/p-tert-butoxystyrene) [Mw 18200, Mw/Mn = 1.11] | 4.0 g |
|---|---|---|
| | Poly (p-cyclohexyloxyethoxystyrene/p-hydroxystyrene/p-tert-butoxystyrene) [Mw 18200; Mw/Mn = 1.12] | 2.0 g |
| | Bis(cyclohexylsulfonyl)diazomethane | 0.3 g |
| | p-tert-Butylphenyldiphenylsulfonium/10-camphorsulfonate | 0.1 g |
| | Polyoxyethylenecetyl ether | 0.1 g |
| | 9-Diazo-10-phenanthrone | 0.1 g |
| | Fluorine-containing nonionic surfactant | 0.1 g |
| | Propylene glycol monomethyl ether acetate | 22.6 g |
| EXAMPLE 13 | poly (p-1-ethoxyethoxystyrene/p-hydroxy-styrene) [Mw 17500, Mw/Mn = 1.18] | 4.0 g |
| | Poly (p-1-isobutoxyethoxystyrene/p-hydroxy-styrene) [Mw 18500; Mw/Mn = 1.18] | 2.0 g |
| | Bis(1,1-dimethylethylsulfonyl)diazomethane | 0.3 g |
| | p-Tolyldiphenylsulfonium/p-toluenesulfonate | 0.05 g |
| | Succinimide | 0.1 g |
| | Propylene glycol | 0.1 g |
| | γ-Butyrolactone | 1.0 g |
| | Propylene glycol monomethyl ether acetate | 22.6 g |

TABLE 7

| EXAMPLE 14 | Poly (p-1-ethoxyethoxystyrene/p-hydroxy-styrene/p-tert-butoxystyrene) [Mw 18200, Mw/Mn = 1.11] | 4.5 g |
|---|---|---|
| | Poly (p-1-ethoxyethoxystyrene/p-hydroxy-styrene/p-tert-butoxystyrene) [Mw 9200; Mw/Mn = 1.30] | 1.5 g |
| | Bis(cyclohexylsulfonyl)diazomethane | 0.3 g |
| | Diphenyl-p-tolylsulfonium/p-toluene-sulfonate | 0.05 g |
| | γ-Butyrolactone | 1.0 g |
| | Propylene glycol monomethyl ether acetate | 28.6 g |
| | Poly (p-1-ethoxyethoxystyrene/p-hydroxy-styrene/p-tert-butoxystyrene) [Mw 18200, Mw/Mn = 1.11] | 3.5 g |
| EXAMPLE 15 | Poly (p-1-ethoxy-n-propoxystyrene/p-hydroxystyrene/p-tert-butoxystyrene) [Mw 18200; Mw/Mn = 1.11] | 2.5 g |
| | Bis(1-methylethylsulfonyl)diazomethane | 0.2 g |
| | Bis(cyclohexylsulfonyl)diazomethane | 0.1 g |
| | p-tert-Butylphenyldiphenylsulfonium/p-toluenesulfonate | 0.1 g |
| | Dicyclohexylmethylamine | 0.1 g |
| | Fluorine-containing nonionic surfactant | 0.1 g |
| | 2-Heptanone | 28.5 g |

TABLE 8

| EXAMPLE 16 | Poly (p-1-ethoxyethoxystyrene/p-hydroxy-styrene/p-tert-butoxystyrene) [Mw 18200, Mw/Mn = 1.11] | 4.0 g |
|---|---|---|
| | Poly (p-ethoxyethoxystyrene/p-hydroxy-styrene/p-tert-butoxycarbonyloxystyrene) [Mw 20000; Mw/Mn = 1.12] | 2.0 g |
| | Bis(cyclohexylsulfonyl)diazomethane | 0.3 g |
| | Bis(p-tert-butylphenyl)iodonium/p-toluene-sulfonate | 0.05 g |
| | Propylene glycol monomethyl ether acetate | 28.7 g |
| EXAMPLE 17 | Poly (p-1-ethoxy-n-propoxystyrene/p-hydroxystyrene/p-pivaloyloxystyrene) [Mw 18800, Mw/Mn = 1.12: polymer in Production example 23] | 4.5 g |
| | Poly (p-1-ethoxy-n-propoxystyrene/p-hydroxystyrene) [Mw 18000; Mw/Mn = 1.18] | 1.5 g |
| | Bis(cyclohexylsulfonyl)diazomethane | 0.3 g |
| | Diphenyl-p-tolylsulfonium/p-toluene-sulfonate | 0.05 g |
| | Dicyclohexylamine | 0.1 g |
| | Fluorine-containing nonionic surfactant | 0.1 g |
| | γ-Butyrolactone | 0.05 g |
| | Propylene glycol monomethyl ether acetate | 28.5 g |

TABLE 9

| EXAMPLE 18 | Poly (p-1-ethoxy-n-propoxystyrene/p-hydroxystyrene/p-isopropoxystyrene) [Mw 18200, Mw/Mn = 1.12: polymer in Production example 22] | 5.0 g |
|---|---|---|
| | Poly (p-1-ethoxy-n-propoxystyrene/p-hydroxystyrene) [Mw 18000; Mw/Mn = 1.18] | 1.0 g |
| | Bis(cyclohexylsulfonyl)diazomethane | 0.3 g |
| | Diphenyl-p-tolylsulfonium/p-toluene-sulfonate | 0.05 g |
| | Dicyclohexylamine | 0.1 g |
| | Fluorine-containing nonionic surfactant | 0.1 g |
| | γ-Butyrolactone | 0.05 g |
| | Propylene glycol monomethyl ether acetate | 28.5 g |
| EXAMPLE 19 | Poly (p-1-ethoxy-n-propoxystyrene/p-hydroxystyrene/p-isopropoxystyrene) [Mw 18200, Mw/Mn = 1.12] | 5.0 g |
| | Poly (p-1-ethoxyethoxystyrene/p-hydroxystyrene) [Mw 17500; Mw/Mn = 1.18] | 1.0 g |
| | Bis(cyclohexylsulfonyl)diazomethane | 0.3 g |
| | Diphenyl-p-tolylsulfonium/p-toluene-sulfonate | 0.05 g |
| | Dicyclohexylamine | 0.1 g |
| | Fluorine-containing nonionic surfactant | 0.1 g |
| | γ-Butyrolactone | 1.0 g |
| | Ethyl lactate | 3.5 g |
| | Propylene glycol monomethyl ether acetate | 25.0 g |

TABLE 10

| EXAMPLE 20 | Poly (p-1-ethoxy-n-propoxystyrene/p-hydroxystyrene/p-pivaloyloxystyrene) [Mw 18800, Mw/Mn = 1.12) | 4.5 g |
|---|---|---|
| | Poly (p-1-ethoxyethoxystyrene/p-hydroxystyrene) [Mw 17500; Mw/Mn = 1.18] | 1.5 g |
| | Bis(1,1-dimethylethylsulfonyl)diazomethane | 0.3 g |
| | p-tert-Butylphenyldiphenylsulfonium/p-toluenesulfonate | 0.05 g |
| | Triethanolamine | 0.1 g |
| | Fluorine-containing nonionic surfactant | 0.05 g |
| | γ-Butyrolactone | 3.5 g |
| | Propylene glycol monomethyl ether acetate | 26.0 g |
| EXAMPLE 21 | Poly (p-1-ethoxyethoxystyrene/p-hydroxystyrene/p-pivaloyloxystyrene) [Mw 18500, Mw/Mn = 1.12] | 5.0 g |
| | Poly (p-1-ethoxyethoxystyrene/p-hydroxystyrene) [Mw 17500; Mw/Mn = 1.18] | 1.0 g |
| | Bis(cyclohexylsulfonyl)diazomethane | 0.3 g |
| | Diphenyl-p-tolylsulfonium/p-toluene-sulfonate | 0.05 g |
| | Dicyclohexylamine | 0.1 g |
| | γ-Butyrolactone | 1.0 g |
| | Ethyl lactate | 3.5 g |
| | Propylene glycol monomethyl ether acetate | 25.0 g |

TABLE 11

| EXAMPLE 22 | Poly (p-1-ethoxyethoxystyrene/p-hydroxystyrene/p-isopropoxystyrene) [Mw 18000, Mw/Mn = 1.12] | 5.0 g |
|---|---|---|
| | Poly (p-1-ethoxy-n-propoxystyrene/p-hydroxystyrene) [Mw 18000; Mw/Mn = 1.18] | 1.0 g |
| | Bis(cyclohexysulfonyl)diazomethane | 0.3 g |
| | Diphenyl-p-tolylsulfonium/p-toluene-sulfonate | 0.05 g |
| | Dicyclohexylamine | 0.1 g |
| | Fluorine-containing nonionic surfactant | 0.1 g |
| | γ-Butyrolactone | 1.0 g |
| | Ethyl lactate | 3.5 g |
| | Propylene glycol monomethyl ether acetate | 25.5 g |

TABLE 11-continued

| EXAMPLE 23 | Poly (p-1-ethoxyethoxystyrene/p-hydroxystyrene/p-tert-butoxystyrene) [Mw 18200, Mw/Mn = 1.11] | 5.0 g |
|---|---|---|
| | Poly (p-1-ethoxyethoxystyrene/p-hydroxystyrene/styrene) [Mw 18300; Mw/Mn = 1.06: polymer in Production example 24] | 2.0 g |
| | Bis(cyclohexylsulfonyl)diazomethane | 0.3 g |
| | Diphenyl-p-tolylsulfonium/p-toluene-sulfonate | 0.1 g |
| | Dicyclohexylmethylamine | 0.1 g |
| | Fluorine-containing nonionic surfactant | 0.1 g |
| | γ-Butyrolactone | 0.1 g |
| | Propylene glycol monomethyl ether acetate | 25.5 g |

TABLE 12

| EXAMPLE 24 | Poly (p-1-methoxyethoxystyrene/p-hydroxystyrene/p-tert-butylstyrene) [Mw 19000, Mw/Mn = 1.25: polymer in Production example 25] | 4.0 g |
|---|---|---|
| | Poly (p-ethoxy-n-propoxystyrene/p-hydroxy styrene)[Mw 18000; Mw/Mn = 1.18] | 2.0 g |
| | Bis(1,1-dimethylethylsulfonyl)diazomethane | 0.3 g |
| | p-tert-Butylphenyldiphenylsulfonium/p-toluenesulfonate | 0.1 g |
| | Dicyclohexylmethylamine | 0.1 g |
| | Pyridine | 0.2 g |
| | γ-Butyrolactone | 0.1 g |
| | Propylene glycol monomethyl ether acetate | 25.5 g |
| EXAMPLE 25 | Poly (p-1-ethoxyethoxystyrene/p-hydroxystyrene/p-tert-butoxystyrene) [Mw 18200, Mw/Mn = 1.11] | 4.0 g |
| | Poly (p-1-ethoxyethoxystyrene/p-hydroxystyrene) [Mw 17500; Mw/Mn = 1.18] | 2.0 g |
| | Bis(cyclohexylsulfonyl)diazomethane | 0.3 g |
| | Diphenyl-p-tolylsulfonium/p-toluene-sulfonate | 0.05 g |
| | γ-Butyrolactone | 0.1 g |
| | Propylene glycol monomethyl ether acetate | 27.5 g |

With the use of each of the above resist compositions, a pattern formation was conducted by the same manner as described in Example 1. Evaluation result on an anti-reflective film is shown in Tables 13 to 18 and that on a $Ti_3N_4$ plate is shown in Tables 19 and 20.

TABLE 13

| Ex. | Exposure dose mJ/cm² | Resolution ability μm L&S | Line width change as time lapse from exposure to heat treatment (μm L & S) | | | DOF (0.18 μm) (μm) |
|---|---|---|---|---|---|---|
| | | | 0 min. | after 30 min. | after 4 hr. | |
| 2 | 26 | 0.16 | 0.18 | 0.18 | 0.18 | ±0.6 |
| 3 | 26 | 0.15 | 0.18 | 0.18 | 0.18 | ±0.7 |
| 4 | 30 | 0.15 | 0.18 | 0.18 | 0.18 | ±0.7 |
| 5 | 26 | 0.16 | 0.18 | 0.18 | 0.18 | ±0.6 |
| 6 | 32 | 0.15 | 0.18 | 0.18 | 0.18 | ±0.7 |
| 7 | 30 | 0.15 | 0.18 | 0.18 | 0.18 | ±0.7 |
| 8 | 24 | 0.15 | 0.18 | 0.18 | 0.18 | ±0.7 |
| 9 | 26 | 0.15 | 0.18 | 0.18 | 0.18 | ±0.7 |
| 10 | 26 | 0.15 | 0.18 | 0.18 | 0.18 | ±0.7 |
| 11 | 28 | 0.15 | 0.18 | 0.18 | 0.18 | ±0.7 |
| 12 | 30 | 0.15 | 0.18 | 0.18 | 0.18 | ±0.7 |
| 13 | 24 | 0.15 | 0.18 | 0.18 | 0.18 | ±0.7 |
| 14 | 30 | 0.15 | 0.18 | 0.18 | 0.18 | ±0.7 |
| 15 | 28 | 0.15 | 0.18 | 0.18 | 0.18 | ±0.7 |

TABLE 14

| Ex. | Exposure dose mJ/cm² | Resolution ability μm L&S | Line width change as time lapse from exposure to heat treatment (μm L & S) | | | DOF (0.18 μm) (μm) |
|---|---|---|---|---|---|---|
| | | | 0 min. | after 30 min. | after 4 hr. | |
| 16 | 23 | 0.15 | 0.18 | 0.18 | 0.18 | ±0.7 |
| 17 | 28 | 0.14 | 0.18 | 0.18 | 0.18 | ±0.7 |
| 18 | 26 | 0.14 | 0.18 | 0.18 | 0.18 | ±0.7 |
| 19 | 26 | 0.14 | 0.18 | 0.18 | 0.18 | ±0.7 |
| 20 | 28 | 0.14 | 0.18 | 0.18 | 0.18 | ±0.7 |
| 21 | 26 | 0.14 | 0.18 | 0.18 | 0.18 | ±0.7 |
| 22 | 28 | 0.14 | 0.18 | 0.18 | 0.18 | ±0.7 |
| 23 | 28 | 0.15 | 0.18 | 0.18 | 0.18 | ±0.7 |
| 24 | 28 | 0.15 | 0.18 | 0.18 | 0.18 | ±0.7 |
| 25 | 24 | 0.15 | 0.18 | 0.18 | 0.18 | ±0.7 |

TABLE 15

| Ex. | Pattern shape | Side wall Roughness | Scum |
|---|---|---|---|
| 2 | rectangular | good | no |
| 3 | rectangular | good | no |
| 4 | rectangular | good | no |
| 5 | rectangular | good | no |
| 6 | rectangular | good | no |
| 7 | rectangular | good | no |
| 8 | rectangular | good | no |
| 9 | rectangular | good | no |
| 10 | rectangular | good | no |
| 11 | rectangular | good | no |
| 12 | rectangular | good | no |
| 13 | rectangular | good | no |
| 14 | rectangular | good | no |
| 15 | rectangular | good | no |

TABLE 16

| Ex. | Pattern shape | Side wall Roughness | Scum |
|---|---|---|---|
| 16 | rectangular | good | no |
| 17 | rectangular | good | no |
| 18 | rectangular | good | no |
| 19 | rectangular | good | no |
| 20 | rectangular | good | no |
| 21 | rectangular | good | no |
| 22 | rectangular | good | no |
| 23 | rectangular | good | no |
| 24 | rectangular | good | no |
| 25 | rectangular | good | no |

TABLE 17

| Ex. | Heat resist-ance | Line width change as time lapse of storage (μm L & S) | | | DOF change as time lapse of storage 0.18 μm L & S (μm) | |
|---|---|---|---|---|---|---|
| | | Before Storage | after 1 month storage | after 3 month storage | after 1 month storage | after 3 month storage |
| 2 | good | 0.18 | 0.18 | 0.18 | ±0.6 | ±0.6 |
| 3 | good | 0.18 | 0.18 | 0.18 | ±0.7 | ±0.7 |
| 4 | good | 0.18 | 0.18 | 0.18 | ±0.7 | ±0.7 |
| 5 | good | 0.18 | 0.18 | 0.18 | ±0.6 | ±0.6 |
| 6 | good | 0.18 | 0.18 | 0.18 | ±0.7 | ±0.7 |
| 7 | good | 0.18 | 0.18 | 0.18 | ±0.7 | ±0.7 |
| 8 | good | 0.18 | 0.18 | 0.18 | ±0.7 | ±0.7 |
| 9 | good | 0.18 | 0.18 | 0.18 | ±0.7 | ±0.7 |
| 10 | good | 0.18 | 0.18 | 0.18 | ±0.7 | ±0.7 |
| 11 | good | 0.18 | 0.18 | 0.18 | ±0.7 | ±0.7 |
| 12 | good | 0.18 | 0.18 | 0.18 | ±0.7 | ±0.7 |
| 13 | good | 0.18 | 0.18 | 0.18 | ±0.7 | ±0.7 |
| 14 | good | 0.18 | 0.18 | 0.18 | ±0.7 | ±0.7 |
| 15 | good | 0.18 | 0.18 | 0.18 | ±0.7 | ±0.7 |

TABLE 18

| Ex. | Heat resist-ance | Line width change as time lapse of storage (μm L & S) | | | DOF change as time lapse of storage 0.18 μm L & S (μm) | |
|---|---|---|---|---|---|---|
| | | Before Storage | after 1 month storage | after 3 month storage | after 1 month storage | after 3 month storage |
| 16 | good | 0.18 | 0.18 | 0.18 | ±0.7 | ±0.7 |
| 17 | good | 0.18 | 0.18 | 0.18 | ±0.7 | ±0.7 |
| 18 | good | 0.18 | 0.18 | 0.18 | ±0.7 | ±0.7 |
| 19 | good | 0.18 | 0.18 | 0.18 | ±0.7 | ±0.7 |
| 20 | good | 0.18 | 0.18 | 0.18 | ±0.7 | ±0.7 |
| 21 | good | 0.18 | 0.18 | 0.18 | ±0.7 | ±0.7 |
| 22 | good | 0.18 | 0.18 | 0.18 | ±0.7 | ±0.7 |
| 23 | good | 0.18 | 0.18 | 0.18 | ±0.7 | ±0.7 |
| 24 | good | 0.18 | 0.18 | 0.18 | ±0.7 | ±0.7 |
| 25 | good | 0.18 | 0.18 | 0.18 | ±0.7 | ±0.7 |

TABLE 19

| Ex. | Exposure dose mJ/cm² | Resolution Ability $Ti_3N_4$; 0.7 μm thick | DOF (0.18 μm L & S) | Side wall roughness | Pattern shape |
|---|---|---|---|---|---|
| 2 | 22 | 0.16 | ±0.6 | good | good |
| 3 | 22 | 0.15 | ±0.7 | good | good |
| 4 | 24 | 0.15 | ±0.7 | good | good |
| 5 | 22 | 0.16 | ±0.6 | good | good |
| 6 | 28 | 0.15 | ±0.7 | good | good |
| 7 | 25 | 0.15 | ±0.7 | good | good |
| 8 | 21 | 0.15 | ±0.7 | good | good |
| 9 | 22 | 0.15 | ±0.7 | good | good |
| 10 | 22 | 0.15 | ±0.7 | good | good |
| 11 | 25 | 0.15 | ±0.7 | good | good |
| 12 | 25 | 0.15 | ±0.7 | good | good |
| 13 | 21 | 0.15 | ±0.7 | good | good |
| 14 | 25 | 0.15 | ±0.7 | good | good |
| 15 | 24 | 0.15 | ±0.7 | good | good |

TABLE 20

| Ex. | Exposure dose mJ/cm$^2$ | Resolution Ability Ti$_3$N$_4$; 0.7 µm thick | DOF (0.18 µm L & S) | Side wall roughness | Pattern shape |
|---|---|---|---|---|---|
| 16 | 20 | 0.15 | ±0.7 | good | good |
| 17 | 24 | 0.15 | ±0.7 | good | good |
| 18 | 22 | 0.15 | ±0.7 | good | good |
| 19 | 22 | 0.15 | ±0.7 | good | good |
| 20 | 24 | 0.15 | ±0.7 | good | good |
| 21 | 22 | 0.15 | ±0.7 | good | good |
| 22 | 24 | 0.15 | ±0.7 | good | good |
| 23 | 24 | 0.15 | ±0.7 | good | good |
| 24 | 24 | 0.15 | ±0.7 | good | good |
| 25 | 21 | 0.15 | ±0.7 | good | good |

As is clear from the Tables 13 to 20, any of the resist compositions of Examples 2 to 25 similarly to the composition of Example 1 could form a good positive type pattern and could resolve 0.15 to 0.16 µm L & S on an anti-reflective film. Further more than ±0.6 µm of DOF could be obtained under 0.18 µm L & S. Still further, even after 4 hours time lapse, 0.18 µm L & S could be resolved without any problem, and no pattern size variation was observed, similarly to the resist composition of Example 1, namely no influence by PED was observed. Any of the resist composition of Examples 2 to 25 could show good characteristics even when Ti$_3$N$_4$ and other substrate were used, and no problem concerning substrate dependency was raised. Further in those resist compositions of Example 2 to 25, no problem concerning storage stability was observed.

COMPARATIVE EXAMPLE 1

A resist composition having the following formulation was prepared.

poly(p-1-ethoxyethoxystyrene/p-hydroxystyrene) [Mw 17500; Mw/Mn=1.18; polymer of Production Example 15] 4.0 g poly(p-tert-butoxycarbonyloxystyrene/p-hydroxystyrene) [Mw 17500; Mw/Mn=1.20; polymer of Production Example 18] 2.0 g bis(cyclohexylsulfonyl)diazomethane 0.2 g bis(2,4-dimethylphenylsulfonyl)diazomethane 0.1 g salicylic acid 0.1 g N,N-dimethylacetamide 0.2 g Propyleneglycol monomethyl ether acetate 28.5 g A pattern formation was conducted using the above resist composition after the similar manner to Example 1. A positive type pattern of 0.16 µm L & S could be resolved at an exposure dose of 30 mJ/cm 2, but the shape was such a poor one as taper. DOF at 0.18 µm was ±0.3 µm. When a pattern formation was conducted after storage at 23° C. for 1 month, pattern size variation of more than ±10% was observed, and thus this resist composition was of poor ability and storage stability.

COMPARATIVE EXAMPLE 2

A resist composition of the following formulation was prepared.

poly(p-tetrahydropyranyloxystyrene/p-hydroxystyrene) [Mw 18000; Mw/Mn=1.14: polymer of Production Example 19] 6.0 g bis(1-methylethylsulfonyl)diazomethane 0.3 g triphenylsulfonium/p-toluenesulfonate 0.05 g propylene glycol monomethyl ether acetate 28.5 g A pattern formation was conducted using the above resist composition after a similar manner to Example 1. A positive type pattern of 0.18 µm L & S could be resolved at an exposure dose of 32 mJ/cm$^2$, but the shape was such a poor one as taper. DOF at 0.18 µm was ±0 µm. Thus this resist composition was poor in its ability.

COMPARATIVE EXAMPLE 3

A resist composition of the following formulation was prepared.

poly(p-tert-butoxystyrene/p-hydroxystyrene) [Mw 12000; Mw/Mn=1.70: polymer of Production Example 20] 6.0 g bis(1,1-dimethylethylsulfonyl)diazomethane 0.3 g triphenylsulfonium/p-toluenesulfonate 0.05 g propylene glycol monomethyl ether acetate 28.5 g A pattern formation was conducted using the above resist composition after a similar manner to Example 1. A positive type pattern of 0.18 µm L & S could be resolved at an exposure dose of 30 mJ/cm$^2$, but the shape was such a poor one as taper, and a pattern of 0.16 µm L & S could not be resolved. DOF at 0.18 µm was ±0.1 µm. Thus this resist composition was poor in its ability.

COMPARATIVE EXAMPLE 4

A resist composition of the following formulation was prepared.

poly(p-tert-butoxycarbonyloxystyrene/p-hydroxystyrene) [Mw 17500; Mw/Mn=1.20] 6.0 g bis(cyclohexylsulfonyl)diazomethane 0.3 g triphenylsulfonium/trifluoromethanesulfonate 0.05 g propylene glycol monomethyl ether acetate 28.5 g A pattern formation was conducted using the above resist composition after a similar manner to Example 1. A positive type pattern of 0.20 µm L & S could be resolved at an exposure dose of 33 mJ/cm (footing), but a pattern of 0.18 µm L & S could not be resolved. Thus this resist composition was poor in its ability.

COMPARATIVE EXAMPLES 5 TO 26

For the control purpose, resist compositions of the formulations shown in Table 21, to 28 were prepared, respectively, and pattern formations were conducted after a similar manner to Example 1 and the evaluation results are shown in Table 29 and 30.

TABLE 21

| Com. Ex. 5 | Poly (p-tert-butoxystyrene/p-hydroxystyrene) [Mw 12000; Mw/Mn = 1.70] | 6.0 g |
|---|---|---|
| | Bis(1,1-dimethylethylsulfonyl)diazomethane | 0.2 g |
| | Bis(p-toluenesulfonyl)diazomethane | 0.1 g |
| | Propylene glycol monomethyl ether acetate | 28.5 g |
| Com. Ex. 6 | Poly (p-1-ethoxyethoxystyrene/p-hydroxystyrene/p-tert-butoxycarbonyloxystyrene) [Mw 20000; Mw/Mn = 1.12: polymer of Production Example 9] | 6.0 g |
| | Bis(cyclohexylsulfonyl)diazomethane | 0.2 g |
| | Bis(2,4-dimethylphenylsulfonyl)diazomethane | 0.1 g |
| | Propylene glycol monomethyl ether acetate | 28.5 g |
| Com. Ex. 7 | Poly (p-1-ethoxyethoxystyrene/p-hydroxystyrene) [Mw 17500; Mw/Mn = 1.18] | 6.0 g |
| | Bis(cyclohexylsulfonyl)diazomethane | 0.2 g |
| | Triphenylsulfonium/p-toluenesulfonate | 0.1 g |
| | Propylene glycol monomethyl ether acetate | 28.7 g |

TABLE 21-continued

| | | |
|---|---|---|
| Com. Ex. 8 | Poly (p-1-ethoxyethoxystyrene/p-hydroxy-styrene/styrene) [Mw 18000; Mw/Mn = 1.85: polymer of Production example 3] | 6.0 g |
| | Diphenyliodonium hexafluorophosphate [commercially available product] | 0.2 g |
| | Diethylene glycol dimethyl ether | 28.7 g |

TABLE 22

| | | |
|---|---|---|
| Com. Ex. 9 | Poly (p-1-ethoxyethoxystyrene/p-hydroxy-styrene/p-tert-butoxystyrene) [Mw 18000; Mw/Mn = 1.90: polymer of Production Example 1] | 6.0 g |
| | Triphenylsulfonium/trifluoromethanesulfonate | 0.3 g |
| | Propylene glycol monomethyl ether acetate | 28.7 g |
| Com. Ex. 10 | Poly (p-1-ethoxyethoxystyrene/p-hydroxy-styrene/p-tert-butoxystyrene) [Mw 18200; Mw/Mn = 1.11: polymer of Production Example 4] | 4.0 g |
| | Poly (p-1-ethoxyethoxystyrene/p-hydroxy-styrene) [Mw 17500; Mw/Mn = 1.18] | 2.0 g |
| | Tris(trichloromethyl)-s-triazine | 1.1 g |
| | Triethanolamine | 0.1 g |
| | Propylene glycol monomethyl ether acetate | 27.5 g |
| Com. Ex. 11 | Poly (p-1-ethoxyethoxystyrene/p-hydroxy-styrene/p-tert-butoxystyrene) (Mw 18000; Mw/Mn = 1.90] | 4.5 g |
| | Poly (p-1-ethoxyethoxystyrene/p-hydroxy-styrene/p-tert-butoxystyrene) [Mw 9200; Mw/Mn = 1.30: polymer of Production Example 21] | 1.5 g |
| | Diphenyl-p-tolylsulfonium/p-toluenesulfonate | 0.3 g |
| | Propylene glycol monomethyl ether acetate | 28.7 g |

TABLE 23

| | | |
|---|---|---|
| Com. EX. 12 | Poly (p-1-ethoxyethoxystyrene/p-hydroxy-styrene/p-tert-butoxystyrene) [Mw 18000; Mw/Mn = 1.90] | 4.5 g |
| | Poly (p-1-ethoxyethoxystyrene/p-hydroxy-styrene/p-tert-butoxystyrene) [Mw 9200; Mw/Mn = 1.30] | 1.5 g |
| | Bis(1,1-dimethylethylsulfonyl)diazomethane | 0.2 g |
| | Bis(p-toluenesulfonyl)diazomethane | 0.1 g |
| | Propylene glycol monomethyl ether acetate | 28.5 g |
| Com. Ex. 13 | Poly (p-1-ethoxyethoxystyrene/p-hydroxy-styrene/p-tetrahydropyranyoxystyrene) [Mw 18500; Mw/Mn = 1.18; polymer of Production Example 8] | 6.0 g |
| | Bis(cyclohexylsulfonyl)diazomethane | 0.2 g |
| | 1,2,3-Tris (methanesulfonyloxy)benzene | 0.1 g |
| | Propylene glycol monomethyl ether acetate | 28.7 g |
| Com. Ex. 14 | Poly (p-1-ethoxyethoxystyrene/p-hydroxy-styrene) [Mw 17500; Mw/Mn = 1.18] | 3.5 g |
| | Poly (p-1-ethoxy-n-propoxystyrene/p-hydroxy-sytrene) [Mw 18000; Mw/Mn = 1.18: polymer of Production Example 17] | 2.5 g |
| | Triphenylsulfonium/trifluoromethanesulfonate | 0.2 g |
| | Propylene glycol monomethyl ether acetate | 28.5 g |

TABLE 24

| | | |
|---|---|---|
| Com. Ex. 15 | Poly (p-1-ethoxyethoxystyrene/p-hydroxy-styrene/p-tert-butoxystyrene) [Mw 9200; Mw/Mn = 1.30; polymer of Production example 21] | 2.5 g |
| | Poly (p-1-ethoxyethoxystyrene/p-hydroxy-styrene/p-tert-butoxycarbonyloxystyrene) [Mw 20000; Mw/Mn = 1.12] | 2.0 g |
| | Poly (p-1-isobutoxyethoxystyrene/p-hydroxy-styrene) [Mw 18500; Mw/Mn = 1.18: polymer of Production Example 16] | 1.5 g |
| | Bis(cyclohexylsulfonyl)diazomethane | 0.3 g |
| | Diphenyl-p-tolylsulfonium/perfluoro-octanesulfonate | 0.15 g |
| | Propylene glycol monomethyl ether acetate | 28.0 g |

TABLE 24-continued

| | | |
|---|---|---|
| Com. Ex. 16 | Poly (p-1-ethoxyethoxystyrene/p-hydroxy-styrene/p-tert-butoxystyrene) [Mw 18200; Mw/Mn = 1.11] | 2.5 g |
| | Poly (p-1-ethoxyethoxystyrene/p-hydroxy-styrene/p-tert-butoxycarbonyloxystyrene) [Mw 20000; Mw/Mn = 1.12] | 2.0 g |
| | Poly (p-1-ethoxy-n-propoxystyrene/p-hydroxystyrene) [Mw 18000; Mw/Mn = 1.18] | 1.5 g |
| | Bis(cyclohexylsulfonyl)diazomethane | 0.3 g |
| | Diphenyl-p-tolylsulfonium/perfluoro-butanesulfonate | 0.06 g |
| | Propylene glycol monomethyl ether acetate | 28.6 g |

TABLE 25

| | | |
|---|---|---|
| Com. Ex. 17 | Poly (p-1-ethoxyethoxystyrene/p-hydroxy-styrene/p-tert-butoxystyrene) [Mw 18000; Mw/Mn = 1.90] | 4.5 g |
| | Poly (p-1-ethoxyethoxystyrene/p-hydroxy-styrene/p-tert-butoxystyrene) [Mw 9200; Mw/Mn = 1.30] | 1.5 g |
| | Bis(cyclohexylsulfonyl)diazomethane | 0.3 g |
| | Diphenyl-p-tolylsulfonium/trifluoro-methanesulfonate | 0.1 g |
| | Propylene glycol monomethyl ether acetate | 28.6 g |
| Com. Ex. 18 | Poly (p-1-ethoxyethoxystyrene/p-hydroxy-styrene/p-tert-butoxystyrene) [Mw 18200; Mw/Mn = 1.11] | 4.0 g |
| | Poly (p-1-ethoxyethoxystyrene/p-hydroxy-styrene) [Mw 17500; Mw/Mn = 1.18] | 2.0 g |
| | Bis(cyclohexylsulfonyl)diazomethane | 0.3 g |
| | Diphenyl-p-tolylsulfonium/trifluoro-methanesulfonate | 0.05 g |
| | γ-Butyrolactone | 0.1 g |
| | Propylene glycol monomethyl ether acetate | 27.5 g |

TABLE 26

| | | |
|---|---|---|
| Com. Ex. 19 | Poly (p-1-ethoxyethoxystyrene/p-hydroxy-styrene/p-tert-butoxystyrene) [Mw 18200; Mw/Mn = 1.11] | 4.0 g |
| | Poly (p-1-ethoxyethoxystyrene/p-hydroxy styrene) [Mw 17500; Mw/Mn = 1.18] | 2.0 g |
| | Bis(cyclohexylsulfonyl)diazomethane | 0.2 g |
| | Bis(p-toluensulfonyl)diazomethane | 0.1 g |
| | γ-Butyrolactone | 0.1 g |
| | Propylene glycol monomethyl ether acetate | 27.5 g |
| Com. Ex. 20 | Poly (p-1-ethoxyethoxystyrene/p-hydroxy styrene) [Mw 17500; Mw/Mn = 1.18] | 4.0 g |
| | Poly (p-1-ethoxyethoxystyrene/p-hydroxy-styrene) [Mw 10200; Mw/Mn = 1.05] | 2.0 g |
| | Triphenylsulfonium/trifluoromethanesulfonate | 0.3 g |
| | Propylene glycol monomethyl ether acetate | 28.6 g |
| Com. Ex. 21 | Poly (p-1-ethoxyethoxystyrene/p-hydroxy-styrene/p-tert-butoxystyrene) [Mw 18200; Mw/Mn = 1.11] | 6.0 g |
| | Triphenylsulfonium/p-toluenesulfonate | 0.3 g |
| | Triethylamine | 0.1 g |
| | Propylene glycol monomethyl ether acetate | 28.6 g |

TABLE 27

| | | |
|---|---|---|
| Com. Ex. 22 | Poly (p-1-ethoxyethoxystyrene/p-hydroxy-styrene/p-tert-butoxycarbonyloxystyrene) [Mw 20000; Mw/Mn = 1.12] | 6.0 g |
| | Bis(cyclohexylsulfonyl)diazomethane | 0.3 g |
| | Triphenylsulfonium/trifluoromethanesulfonate | 0.05 g |
| | Propylene glycol monomethyl ether acetate | 28.6 g |
| Com. Ex. 23 | Poly (p-1-ethoxyethoxystyrene/p-hydroxy-styrene) [Mw 17500; Mw/Mn = 1.18] | 4.5 g |
| | Poly (p-tert-butoxycarbonyloxystyrene/p-hydroxystyrene) [Mw 17500; Mw/Mn = 1.20] | 1.5 g |
| | Bis(cyclohexylsulfonyl)diazomethane | 0.3 g |
| | Propylene glycol monomethyl ether acetate | 28.7 g |

TABLE 27-continued

| Com. Ex. 24 | Poly (p-1-ethoxyethoxystyrene/p-hydroxystyrene/p-tert-butoxystyrene) [Mw 18200; Mw/Mn = 1.11] | 6.0 g |
|---|---|---|
| | Bis(cyclohexylsulfonyl)diazomethane | 0.3 g |
| | Triphenylsulfonium/trifluoromethanesulfonate | 0.05 g |
| | Propylene glycol monomethyl ether acetate | 28.6 g |

TABLE 28

| Com. Ex. 25 | Poly (p-1-ethoxyethoxystyrene/p-hydroxystyrene) [Mw 17500; Mw/Mn = 1.18] | 4.5 g |
|---|---|---|
| | Poly (p-tert-butoxycarbonyloxystyrene/p-hydroxystyrene) [Mw 17500; Mw/Mn = 1.20] | 1.5 g |
| | Bis(p-tert-butylphenyl)iodonium/trifluoromethanesulfonate | 0.3 g |
| | Propylene glycol monomethyl ether acetate | 28.6 g |
| Com. Ex. 26 | Poly (p-1-ethoxyethoxystyrene/p-hydroxystyrene) [Mw 17500; Mw/Mn = 1.18] | 6.0 g |
| | P-triphenyldisulfone | 0.3 g |
| | Fluorine-containing nonionic surfactant [commercially available] | 0.1 g |
| | Propylene glycol monomethyl ether acetate | 28.6 g |

TABLE 29

| Com. Ex. | Exposure dose mJ/cm² | Resolution ability | DOF (0.18 µm L & S) | Pattern shape | Side wall Roughness |
|---|---|---|---|---|---|
| 5 | 50 | 0.24 µm L&S | — | footing | Good |
| 6 | 45 | 0.18 µm L&S | +0.1 µm | footing | no good |
| 7 | 30 | 0.18 µm L&S | +0.1 µm | no good shape | no good |
| 8 | 22 | 0.20 µm L&S | — | no good shape | no good |
| 9 | 26 | 0.18 µm L&S | +0 µm | no good shape | no good |
| 10 | 26 | 0.20 µm L&S | — | no good shape | no good |
| 11 | 22 | 0.18 µm L&S | +0.2 µm | no good shape | no good |
| 12 | 32 | 0.18 µm L&S | +0.2 µm | taper | no good |
| 13 | 24 | 0.18 µm L&S | +0 µm | taper | no good |
| 14 | 18 | 0.18 µm L&S | +0.2 µm | no good shape | no good |
| 15 | 30 | 0.16 µm L&S | +0.3 µm | no good shape | no good |
| 16 | 30 | 0.16 µm L&S | +0.3 µm | no good shape | no good |
| 17 | 27 | 0.16 µm L&S | +0.3 µm | no good shape | no good |
| 18 | 22 | 0.18 µm L&S | +0.2 µm | no good shape | no good |
| 19 | 26 | 0.18 µm L&S | +0.2 µm | taper | no good |
| 20 | 18 | 0.18 µm L&S | +0.2 µm | no good shape | no good |
| 21 | 22 | 0.16 µm L&S | +0.2 µm | taper | good |
| 22 | 30 | 0.18 µm L&S | +0.2 µm | taper | good |
| 23 | 36 | 0.18 µm L&S | +0.2 µm | footing | no good |
| 24 | 25 | 0.16 µm L&S | +0.3 µm | footing | no good |
| 25 | 26 | 0.18 µm L&S | +0.1 µm | no good shape | no good |
| 26 | 14 | 0.18 µm L&S | +0.1 µm | no good shape | no good |

TABLE 30

| Com. Ex. | Exposure Dose mJ/cm² | Line width change as time lapse. from exposure to heat treatment. (µm L & S) | | |
|---|---|---|---|---|
| | | 0 min. | After 30 min. | After 4 hr. |
| 15 | 30 | 0.18 | 0.16 | 0.15 |
| 16 | 30 | 0.18 | 0.16 | 0.15 |
| 17 | 27 | 0.18 | 0.16 | 0.15 |
| 18 | 22 | 0.18 | 0.16 | 0.15 |
| 19 | 26 | 0.18 | 0.18 | 0.18 |
| 20 | 18 | 0.18 | 0.16 | 0.15 |
| 21 | 22 | 0.18 | 0.18 | 0.16 |

Figure 2:
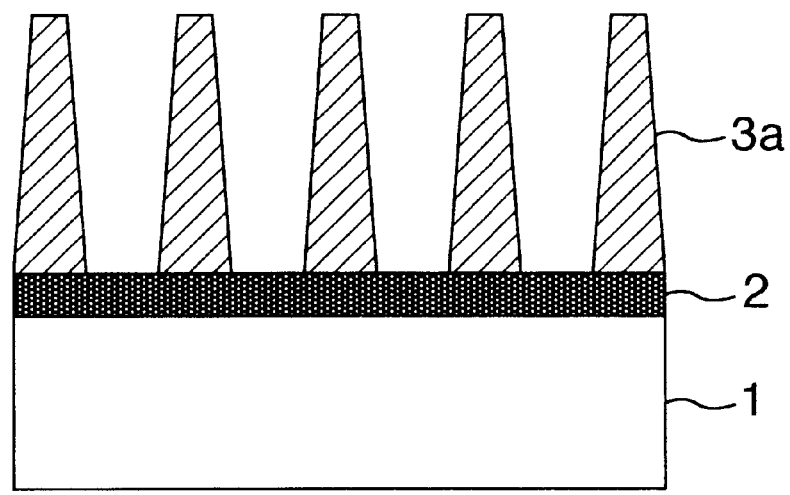
FIG. 2 is a cross-sectional view showing taper shapes observed in Comparative Examples 1 to 3, 12 to 13, 19, 21 to 22, 29 to 31, 40 to 41, 47, 49 and 56 to 57.
Figure 3:
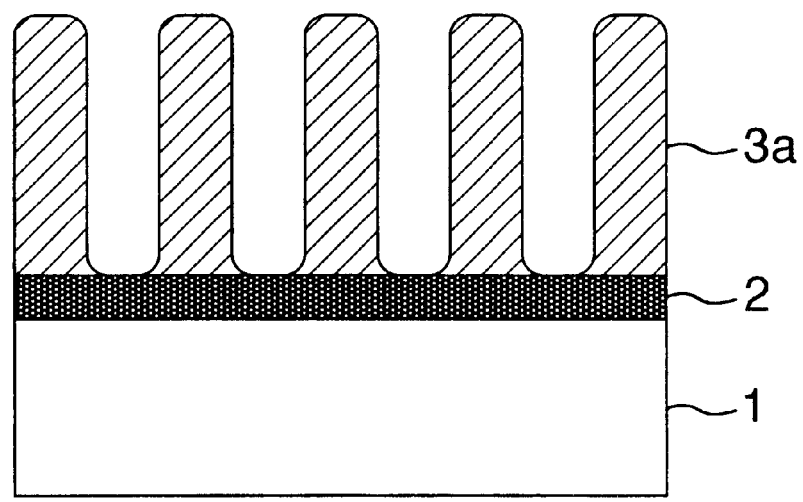
FIG. 3 is a cross-sectional view showing footings observed in Comparative Examples 4 to 6, 23 to 24, 32 to 34, 50 to 51 and 54 to 55.
Figure 4:
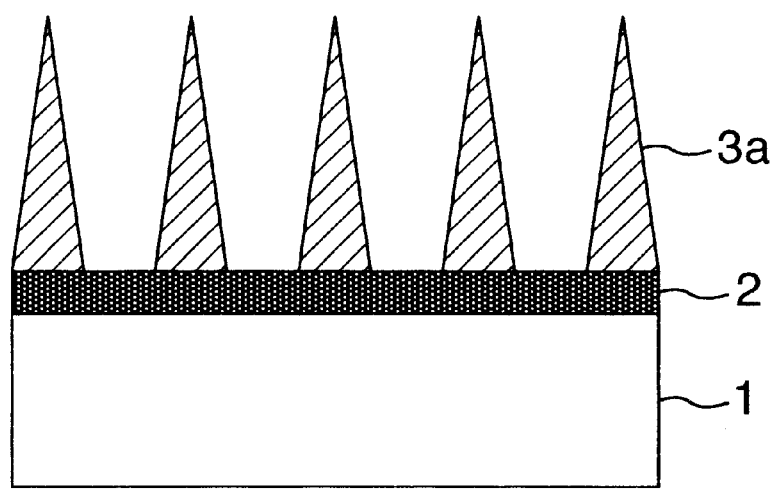
FIG. 4 is a cross-sectional view showing of poor shapes observed in Comparative Examples 7, 9, 11, 14, 35, 37, 39 and 42.
Figure 5:
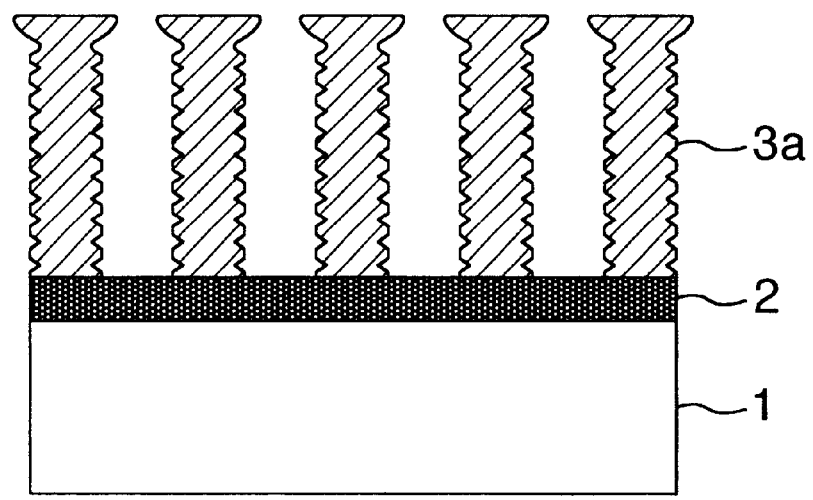
FIG. 5 is a cross-sectional view showing poor shapes observed in Comparative Examples 8, 10, 15 to 18, 20, 25 to 26, 36, 38, 43 to 46, 48 and 52 to 53.

Additionally, the tapers in Comparative Examples 1 to 3, Comparative Examples 12 to 13, Comparative Example 19 and Comparative Examples 21 to 22 are shown in FIG. 2, the footings in Comparative Examples 4 to 6 and Comparative Examples 23 to 24 are shown in FIG. 3, the no good shapes in Comparative Example 7, Comparative Example 9, Comparative Example 11 and Comparative Example 14 are shown in FIG. 4, and the no good shapes in Comparative Example 8, Comparative Example 10, Comparative Examples 15 to 18, Comparative Example 20 and Comparative Examples 25 to 26 are shown in FIG. 5.

As clear from Table 29 and FIGS. 2 to 5, in those Comparative Examples, the resolution ability is poor, the pattern shape is not good and DOF at 0.18 µm L & S is generally smaller, as compared with those of the resist compositions of the present invention.

Further, the resist composition composed of the formulation in Comparative Example 26 was prepared and pattern formation process was performed after 48 hours by a similar manner to Comparative Example 1, whereupon even non-exposed portion was dissolved in the developing solution to fail to form the pattern. This means that the resist composition having the formulation in Comparative Example 26 is instable in the state of a solution.

Still further, in Comparative Examples 15 to 18 and Comparative Examples 20 to 21, there was observed change in pattern size as the time lapse from exposure to heat treatment and thus it was clear that influence by delay time was affected.

Moreover, it was clear from comparison between Example 25 and Comparative Examples 18 and 20 that influence by the resolution ability, DOF, pattern shape and delay time was remarkably different according the kind of combination of the photoacid generators used, and thus the superiority of the composition of the present invention was clearly understood also from this point of view.

EXAMPLE 26

A resist composition of the following formulation was prepared.

Poly(p-1-ethoxyethoxystyrene/p-hydroxystyrene) [Mw 17500; Mw/Mn=1.18] 5.0 g

Poly(p-1-ethoxyethoxystyrene/p-hydroxystyrene/p-tetrahydropyranyloxystyrene) [Mw 18500; Mw/Mn= 1.18] 1.0 g Bis(1,1-dimethylethylsulfonyl)diazomethane 0.3 g p-tert-Butylphenyldiphenylsulfonium/p-toluenesulfonate 0.05 g Propylene glycol 0.1 g γ-Butyrolactone 0.5 g Propylene glycol monomethyl ether acetate 28.5 g Using the above resist composition, a contact hole (hereinafter abbreviated as C & H) pattern formation was conducted by the same manner as described in Example 1 except using a mask for contact hole, which resulted in resolution of 0.18 µm C & H at an exposure dose of 48 mJ/cm² with a rectangular form. DOF at 0.22 µm C & H was ±0.5 µm.

EXAMPLE 27

A resist composition of the following formulation was prepared.

Poly(p-1-ethoxyethoxystyrene/p-hydroxystyrene) [Mw 17500; Mw/Mn=1.18] 5.0 g

Poly(p-1-ethoxyethoxystyrene/p-hydroxystyrene/p-isopropoxystyrene) [Mw 18000; Mw/Mn=1.12] 1.0 g Bis(cyclohexylsulfonyl)diazomethane 0.3 g Diphenyl-p-tolylsulfonium/p-toluenesulfonate 0.05 g
Fluorine-containing surfactant 0.1 g
γ-Butyrolactone 1.0 g
Propylene glycol monomethyl ether acetate 28.5 g Using the above resist composition, a contact hole pattern formation was conducted by the same manner as described in Example 26, which resulted in resolution of 0.18 μm C & H at an exposure dose of 50 mJ/cm$^2$ with a rectangular form. DOF at 0.22 μm C & H was ±0.5 μm.

COMPARATIVE EXAMPLE 27

Contact hole pattern formation was conducted using the resist composition in Comparative Example 7 by the same manner as described in Example 26, which resulted in resolution of 0.20 μm C & H at an exposure dose of 65 mJ/cm$^2$ with a taper shape having round shape of the resist membrane surface. DOF at 0.22 μm C & H was such poor as ±0.1 μm.

COMPARATIVE EXAMPLE 28

Contact hole pattern formation was conducted using the resist composition in Comparative Example 1 by the same manner as described in Example 26, which resulted in resolution of 0.20 μm C & H at an exposure dose of 75 mJ/cm$^2$ with a taper shape having round shape of the resist membrane surface. DOF at 0.22 μm C & H was such poor as ±0.1 μm.

It becomes clear by comparison between the results in Examples 26 and 27 on one hand and those in Comparative Examples of 27 and 28 on the other hand that the use of mixture of two or more kinds of polymers containing an acetal group and two or more photoacid generators having special structures is superior from the view point of resolution ability, DOF and a pattern shape in a case of contact hole pattern formation.

Figure 6:
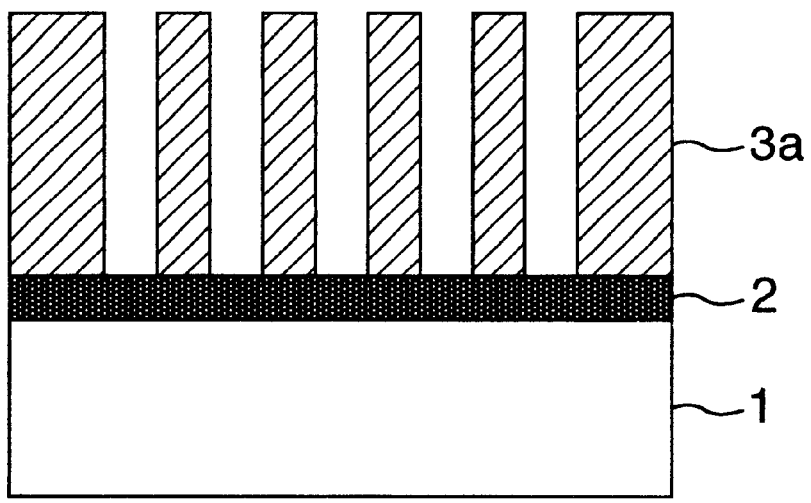
FIG. 6 is a cross-sectional view showing rectangular contact hole pattern obtained in Examples 26, 27, 55 and 56.
Figure 7:
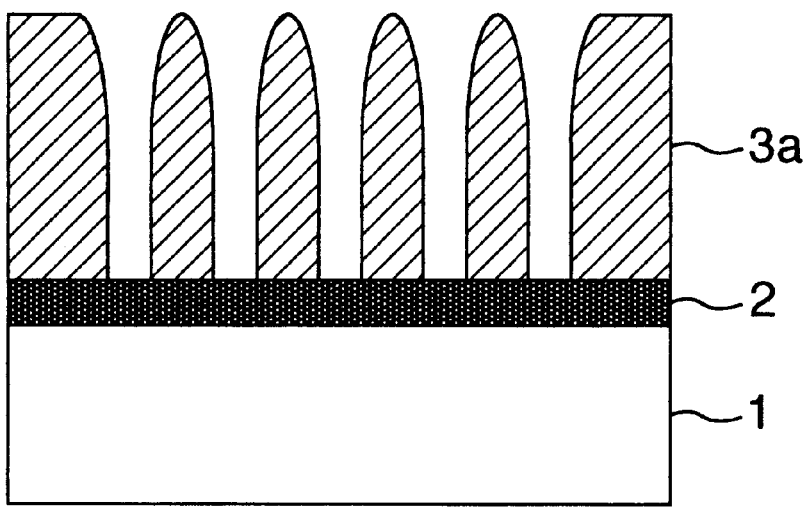
FIG. 7 is a cross-sectional view showing poor taper contact holes with round resist film surface obtained in Comparative Examples 27, 28, 58 and 59.

The cross sections of rectangular contact hole pattern obtained in Examples 26 and 27 are shown in FIG. 6, and the cross sections of contact hole pattern having poor pattern shapes with round taper shape in the resist membrane surface, which was obtained in Comparative Examples 27 and 28, are shown in FIG. 7.

EXAMPLE 28

A photoresist composition of the following formulation was prepared.

Poly(p-1-ethoxyethoxystyrene/p-hydroxystyrene/p-tert-butoxycarbonyloxystyrene) [Mw 20,000; Mw/Mn=1.12; polymer of Production Example 9] 4.5 g
Poly(p-1-cyclohexyloxyethoxystyrene/p-hydroxystyrene/p-tert-butoxystyrene) [Mw 18,200; Mw/Mn=1.12; polymer of Production Example 7] 1.5 g
Bis(cyclohexylsulfonyl)diazomethane 0.3 g
Triphenylsulfonium/p-toluenesulfonate 0.05 g
Triethanolamine 0.1 g
γ-butyrolactone 0.03 g
Propylene glycol monomethyl ether acetate 28.7 g The obtained positive type pattern had a rectangular shape and a 0.15 μm line and space (hereinafter abbreviated as L & S) resolution ability under 30 mJ/cm$^2$ exposure dose When exposure by defocus was conducted, there was observed no pattern deterioration up to ±0.7 μm at 0.18 μm L & S, and thus satisfactory DOF was attained. Further, the pattern side wall was smooth and no scum was observed.

For the purpose of measurement of heat resistance of the resist composition of the present invention, the pattern obtained in the above was baked at 130° C. for 4 minutes on a hot plate and the cross sections of the patterns of 0.40 μm and 0.18 μm L & S were examined by a scanning electron microscope (SEM) to find that the rectangular shape of the pattern was not changed even after the heat treatment and thus heat resistance of the resist membrane was recognized.

The pattern size change with the lapse of time from exposure to heat treatment (PED) was measured on the above resist membrane to find that there was no change of 0.18 μm L & S pattern size even after the lapse of 4 hours and thus it was recognized as stable.

A pattern formation was conducted on a $Ti_3N_4$ substrate using the above resist composition to find that a 0.15 μm L & S rectangular pattern could be resolved at an exposure dose of 24 mJ/cm . When exposure was conducted by defocus, there was observed no deterioration in 0.18 μm L & S pattern size until ±0.7 μm and thus satisfactory DOF could be obtained.

After storage of the above resist composition at 23° C. for 1 month or 3 months, a pattern was formed on an antireflection membrane in the same manner as above to find that a 0.15 μm L & S positive type pattern could be resolved at the same exposure dose and that DOF at 0.18 μm L & S was ±0.7 μm. Thus satisfactory storage stability was admitted.

EXAMPLES 29 TO 54

The photoresist compositions as described below were prepared.

EXAMPLE 29

Poly(p-ethoxyethoxystyrene/p-hydroxystyrene/p-tert-butoxystyrene) [Mw 18,000; Mw/Mn=1.90; polymer of Production Example 1] 4.5 g
Poly(p-1-ethoxyethoxystyrene/p-hydroxystyrene/styrene) [Mw 18,000; Mw/Mn=1.85; polymer of Production Example 3] 1.5 g
Bis(cyclohexylsulfonyl)diazomethane 0.3 g
Triphenylsulfonium/p-toluenesulfonate 0.05 g
Tri-n-octylamine 0.1 g
Fluorine-containing nonionic surfactant [commercial product] 0.1 g
γ-butyrolactone 0.05 g
Propylene glycol monomethyl ether acetate 28.5 g

EXAMPLE 30

Poly(p-1-methoxy-1-methylethoxystyrene/p-hydroxystyrene/p-tert-butoxystyrene) [Mw 18,000; Mw/Mn=1.12: polymer of Production Example 5] 4.0 g
Poly(p-1-ethoxyethoxystyrene/p-hydroxystyrene/p-tetrahydropyranyloxystyrene [Mw 18,500; Mw/Mn=1.18; polymer of Production Example 8] 2.0 g
Bis(1,1-dimethylethylsulfonyl)diazomethane 0.3 g
P-tert-butylphenyldiphenylsulfonium/p-toluenesulfonate 0.05 g
Tri-n-butylamine 0.1 g
γ-butyrolactone 0.05 g
Propylene glycol monomethyl ether acetate 28.5 g

EXAMPLE 31

Poly(p-1-ethoxyethoxystyrene/p-hydroxystyrene/p-tert-butoxycarbonyloxystyrene) [Mw 20,000; Mw/Mn=1.12] 3.5 g Poly(p-1-ethoxy-n-propoxystyrene/p-hydroxystyrene/p-tert-butoxystyrene) [Mw 18,200; Mw/Mn=1.11; polymer of Production Example 6] 2.5 g
Bis(1,1-dimethylethylsulfonyl)diazomethane 0.2 g
P-tert-butylphenyldiphenylsulfonium/p-toluenesulfonate 0.1 g
Diphenolic acid 0.1 g
Fluorine-containing nonionic surfactant [commercial product] 0.1 g
Dicyclohexylamine 0.1 g
Ethyl lactate 2.0 g
Propylene glycol monomethyl ether acetate 26.0 g

EXAMPLE 32

Poly(p-1-ethoxyethoxystyrene/p-hydroxystyrene/p-tert-butoxystyrene) [Mw 18,000; Mw/Mn=1.90] 4.5 g
Poly(p-1-ethoxyethoxystyrene/p-hydroxystyrene/p-methylstyrene) [Mw 18,000; Mw/Mn=1.86; polymer of Production Example 2] 1.5 g
Bis(cyclohexylsulfonyl)diazomethane 0.3 g
P-tert-butoxyphenyldiphenylsulfonium/p-tuluenesufonate 0.05 g
Salicylic acid 0.1 g
Fluorine-containing nonionic surfactant [commercial product] 0.1 g
Dicyclohexylmethylamine 0.1 g
Ethyl lactate 2.5 g
Propylene glycol monomethyl ether acetate 26.0 g

EXAMPLE 33

Poly(p-1-ethoxyethoxystyrene/p-hydroxystyrene/p-isopropoxystyrene) [Mw 18,000; Mw/Mn=1.12; polymer of Production Example 12] 5.0 g
Poly(p-1-ethoxyethoxystyrene/p-hydroxystyrene/p-benzoyloxystyrene) [Mw 18,800; Mw/Mn=1.12; polymer of Production Example 13] 1.0 g
Bis(cyclohexylsulfonyl)diazomethane 0.3 g
Triphenylsulfonium/p-toluenesulfonate 0.05 g
Dicyclohexylamine 0.1 g
Propylene glycol monomethyl ether acetate 28.6 g

EXAMPLE 34

Poly(p-1-ethoxyethoxystyrene/p-hydroxystyrene/p-tert-butoxystyrene) [Mw 18,200; Mw/Mn=1.11; polymer of Production Example 4] 4.5 g
Poly(p-1-cyclohexyloxyethoxystyrene/p-hydroxystyrene/p-tert-butoxycarbonyloxystyrene) [Mw 20,000; Mw/Mn=1.12; polymer of Production Example 10] 1.5 g
Bis(1,1-dimethylethylsulfonyl)diazomethane 0.3 g
Diphenyl-p-tolylsulfonium/10-camphorsulfonate 0.05 g
Triethanolamine 0.1 g
Dicyclohexylmethylamine 0.05 g
γ-butyrolactone 1.5 g
Propylene glycol monomethyl ether acetate 27.0 g

EXAMPLE 35

Poly(p-1-ethoxyethoxystyrene/p-hydroxystyrene) [Mw 17,500; Mw/Mn=1.18; polymer of Production Example 15] 2.5 g
Poly(p-1-ethoxy-n-propoxystyrene/p-hydroxystyrene) [Mw 18,000; Mw/Mn=1.18; polymer of Production Example 17] 2.5 g
Poly(p-1-isobutoxyethoxystyrene/p-hydroxystyrene) [Mw 18,500; Mw/Mn=1.18; polymer of Production Example 16] 1.0 g
Bis(cyclohexylsulfonyl)diazomethane 0.3 g
P-tert-butylphenyldiphenylsulfonium/p-toluenesulfonate 0.05 g
Tri-n-octylamine. 0.1 g
Succinimide 0.1 g
Propylene glycol 0.1 g
Propylene glycol monomethyl ether acetate 28.5 g

EXAMPLE 36

Poly(p-1-methoxyethoxystyrene/p-hydroxystyrene/tert-butyl p-vinylphenoxyacetate) [Mw=20,000; Mw/Mn 1.12; polymer of Production Example 11] 3.5 g
Poly(p-1-ethoxy-n-propoxystyrene/p-hydroxystyrene) [Mw 18,000; Mw/Mn=1.18] 2.5 g
Bis(1,1-dimethylethylsulfonyl)diazomethane 0.3 g
P-methoxyphenyldiphenylsulfonium/p-toluenesulfonate 0.05 g
Tri-n-butylamine 0.1 g
γ-butyrolactone 5.0 g
Propylene glycol monomethyl ether acetate 23.5 g

EXAMPLE 37

Poly(p-1-ethoxyethoxystyrene/p-hydroxystyrene/p-pivaloyloxystyrene) [Mw 18,500; Mw/Mn=1.12; polymer of Production Example 14] 5.0 g
Poly(p-1-ethoxyethoxystyrene/p-hydroxystyrene) [Mw 17,500; Mw/Mn=1.18] 1.0 g
Bis(cyclohexylsulfonyl)diazomethane 0.3 g
Diphenyl-p-tolylsulfonium/p-toluenesulfonate 0.05 g
Dicyclohexylmethylamine 0.1 g
γ-butyrolactone 1.0 g
Propylene glycol monomethyl ether acetate 28.5 g

EXAMPLE 38

Poly(p-1-ethoxyethoxystyrene/p-hydroxystyrene/p-isopropoxystyrene) [Mw=18,000; Mw/Mn=1.12] 5.0 g
Poly(p-1-ethoxyethoxystyrene/p-hydroxystyrene) [Mw= 17,500; Mw/Mn=1.18] 1.0 g
Bis(cyclohexylsulfonyl)diazomethane 0.3 g
Diphenyl-p-tolylsulfonium/p-toluenesulfonate 0.05 g
Dicyclohexylmethylamine 0.1 g
Fluorine-containing nonionic surfactant 0.1 g
γ-butyrolactone 1.0 g
Propylene glycol monomethyl ether acetate 28.5 g

EXAMPLE 39

Poly(p-1-ethoxyethoxystyrene/p-hydroxystyrene) [Mw 17,500; Mw/Mn=1.18] 4.0 g
Poly(p-1-isobutoxyethoxystyrene/p-hydroxystyrene) [Mw 18,500; Mw/Mn=1.18] 2.0 g
Bis(1,1-dimethylethylsulfonyl)diazomethane 0.3 g
Diphenyl-p-tolylsulfonium/p-toluenesulfonate 0.05 g
Tripropanolamine 0.1 g Succinimide 0.1 g
Propylene glycol 0.1 g
γ-butyrolactone 1.0 g
Propylene glycol monomethyl ether acetate 22.6 g

EXAMPLE 40

Poly(p-1-ethoxyethoxystyrene/p-hydroxystyrene/p-tert-butoxystyrene) [Mw 18,200; Mw/Mn=1.11] 4.5 g
Poly(p-1-ethoxyethoxystyrene/p-hydroxystyrene/p-tert-butoxystyrene) [Mw 9,200; Mw/Mn=1.30] 1.5 g
Bis(cyclohexylsulfonyl)diazomethane 0.3 g
Diphenyl-p-tolylsulfonium/p-toluenesulfonate 0.05 g
Tri-n-butylamine 0.1 g
γ-butyrolactone 1.0 g
Propylene glycol monomethyl ether acetate 28.6 g

EXAMPLE 41

Poly(p-1-ethoxyethoxystyrene/p-hydroxystyrene/p-tert-butoxystyrene) [Mw 18,200; Mw/Mn=1.11] 3.5 g
Poly(p-1-ethoxy-n-propoxystyrene/p-hydroxystyrene/p-tert-butoxystyrene [Mw 18,200; Mw/Mn=1.11] 2.5 g
Bis(1-methylethylsulfonyl)diazomethane 0.2 g
Bis(cyclohexylsulfonyl)diazomethane 0.1 g
Diphenyl-p-tolylsulfonium/p-toluenesulfonate 0.1 g
Dicyclohexylmethylamine 0.1 g
Fluorine-containing nonionic surfactant 0.1 g
2-heptanone 28.5 g

EXAMPLE 42

Poly(p-1-ethoxyethoxystyrene/p-hydroxystyrene/p-tert-butoxystyrene) [Mw 18,200; Mw/Mn=1.11] 4.0 g
Poly(p-1-ethoxyethoxystyrene/p-hydroxystyrene/p-tert-butoxycarbonyloxystyrene) [Mw 20,000; Mw/Mn=1.12] 2.0 g
Bis(cyclohexylsulfonyl)diazomethane 0.3 g
Bis(p-tert-butylphenyl)iodonium/p-toluenesulfonate 0.05 g
Tetrabutylammonium hydroxide 0.1 g
Propylene glycol monomethyl ether acetate 28.7 g

EXAMPLE 43

Poly(p-1-ethoxy-n-propoxystyrene/p-hydroxystyrene/p-pivaloyloxystyrene) [Mw 18,800; Mw/Mn=1.12; polymer of Production Example 23] 4.5 g
Poly(p-1-ethoxy-n-propoxystyrene/p-hydroxystyrene) [Mw 18,000; Mw/Mn=1.18] 1.5 g
Bis(cyclohexylsulfonyl)diazomethane 0.3 g
Diphenyl-p-tolylsulfonium/p-toluenesulfonate 0.05 g
Dicyclohexylamine 0.1 g
Fluorine-containing nonionic surfactant 0.1 g
γ-butyrolactone 0.05 g
Propylene glycol monomethyl ether acetate 28.5 g

EXAMPLE 44

Poly(p-1-ethoxy-n-propoxystyrene/p-hydroxystyrene/p-isopropoxystyrene) [Mw 18,200; Mw/Mn=1.12; polymer of Production Example 22] 5.0 g
Poly(p-1-ethoxy-n-propoxystyrene/p-hydroxystyrene) [Mw 18,000; Mw/Mn=1.18] 1.0 g
Bis(cyclohexylsulfonyl)diazomethane 0.3 g
Diphenyl-o-tolylsulfonium/p-toluenesulfonate 0.05 g
Dicyclohexylamine 0.1 g
Fluorine-containing nonionic surfactant 0.1 g
γ-butyrolactone 0.05 g
Propylene glycol monomethyl ether acetate 28.5 g

EXAMPLE 45

Poly(p-1-ethoxy-n-propoxystyrene/p-hydroxystyrene/p-isopropoxystyrene) [Mw 18,200; Mw/Mn=1.12] 5.0 g
Poly(p-1-ethoxyethoxystyrene/p-hydroxystyrene) [Mw 17,500; Mw/Mn=1.18] 1.0 g
Bis(cyclohexylsulfonyl)diazomethane 0.3 g
Diphenyl-p-tolylsulfonium/p-toluenesulfonate 0.05 g
Dicyclohexylamine 0.1 g
Fluorine-containing nonionic surfactant 0.1 g
γ-butyrolactone 1.0 g
Ethyl lactate 2.5 g
Propylene glycol monomethyl ether acetate 26.5 g

EXAMPLE 46

Poly(p-1-ethoxyethoxystyrene/p-hydroxystyrene/p-pivaloyloxystyrene) [Mw 18,500; Mw/Mn=1.12] 5.0 g
Poly(p-1-ethoxyethoxystyrene/p-hydroxystyrene) [Mw 17,500; Mw/Mn=1.18] 1.0 g
Bis(cyclohexylsulfonyl)diazomethane 0.3 g
Diphenyl-p-tolylsulfonium/p-toluenesulfonate 0.05 g
Dicyclohexylamine 0.1 g
γ-butyrolactone 1.0 g
Ethyl lactate 1.5 g
Propylene glycol monomethyl ether acetate 27.0 g

EXAMPLE 47

Poly(p-1-ethoxyethoxystyrene/p-hydroxystyrene/p-isopropoxystyrene) [Mw 18,000; Mw/Mn=1.12] 5.0 g
Poly(p-1-ethoxy-n-propoxystyrene/p-hydroxystyrene) [Mw 18,000; Mw/Mn=1.18] 1.0 g
Bis(cyclohexylsulfonyl)diazomethane 0.3 g
Diphenyl-p-tolylsulfonium/p-toluenesulfonate 0.05 g
Dicyclohexylamine 0.1 g
Fluorine-containing nonionic surfactant 0.1 g
γ-butyrolactone 1.0 g
Methyl lactate 3.5 g
Propylene glycol monomethyl ether acetate 25.5 g

EXAMPLE 48

Poly(p-1-ethoxyethoxystyrene/p-hydroxystyrene/p-tert-butoxystyrene) [Mw 18,200; Mw/Mn=1.11] 5.0 g
Poly(p-1-ethoxyethoxystyrene/p-hydroxystyrene/styrene) [Mw 18,300; Mw/Mn=1.06; polymer of Production Example 24] 2.0 g
Bis(cyclohexylsulfonyl)diazomethane 0.3 g
Diphenyl-p-tolylsulfonium/p-toluenesulfonate 0.1 g
Dicyclohexylmethylamine 0.1 g
Fluorine-containing nonionic surfactant 0.1 g
γ-butyrolactone 0.1 g
Propylene glycol monomethyl ether acetate 25.5 g

EXAMPLE 49

Poly(p-1-ethoxyethoxystyrene/p-hydroxystyrene/p-tert-butoxystyrene) [Mw 18,200; Mw/Mn=1.11] 4.0 g Poly(p-1-ethoxyethoxystyrene/p-hydroxystyrene) [Mw 17,500; Mw/Mn=1.18] 2.0 g
Bis(cyclohexylsulfonyl)diazomethane 0.3 g
Diphenyl-p-tolylsulfonium/p-toluenesulfonate 0.05 g
Tris[2-(2-methoxyethoxy)ethylamine] 0.05 g
Dicyclohexylmethylamine 0.05 g
γ-butyrolactone 0.1 g
Propylene glycol monomethyl ether acetate 27.5 g

EXAMPLE 50

Poly(p-1-ethoxyethoxystyrene/p-hydroxystyrene/cyclohexyl acrylate) [Mw 17,500; Mw/Mn=1.50; polymer of Production Example 26] 4.5 g
Poly(p-1-cyclohexyloxyethoxystyrene/p-hydroxystyrene/p-tert-butoxycarbonyloxystyrene) [Mw 20,000; Mw/Mn=1.12; polymer of Production Example 10] 1.5 g
Bis(1,1-dimethylethylsulfonyl)diazomethane 0.3 g
Diphenyl-p-tolylsulfonium/p-toluenesulfonate 0.05 g
Diphenyl-o-tolylsulfonium/p-toluenesulfonate 0.02 g
Dicyclohexylmethylamine 0.1 g
Fluorine-containing nonionic surfactant 0.1 g
γ-butyrolactone 0.05 g
Propylene glycol monomethyl ether acetate 27.5 g

EXAMPLE 51

Poly(p-1-ethoxyethoxystyrene/p-hydroxystyrene/isobonyl acrylate) [Mw 20,000; Mw/Mn=1.55; polymer of Production Example 27] 4.5 g
Poly(p-1-ethoxyethoxystyrene/p-hydroxystyrene) [Mw 17,500; Mw/Mn=1.18] 1.5 g
Bis(cyclohexylsulfonyl)diazomethane 0.3 g
Diphenyl-p-tolylsulfonium/p-toluenesulfonate 0.05 g
Diphenyl-o-tolylsulfonium/p-toluenesulfonate 0.02 g
Dicyclohexylmethylamine 0.1 g
Fluorine-containing nonionic surfactant 0.1 g
γ-butyrolactone 0.1 g
Propylene glycol monomethyl ether acetate 27.0 g

EXAMPLE 52

Poly(p-1-ethoxy-n-propoxystyrene/p-hydroxystyrene/tert-butyl methacrylate) [Mw 16,000; Mw/Mn=1.60; polymer of Production Example 28] 5.0 g
Poly(p-1-ethoxy-n-propoxystyrene/p-hydroxystyrene) [Mw 18,000; Mw/Mn=1.18] 1.0 g
Bis(cyclohexylsulfonyl)diazomethane 0.3 g
Diphenyl-2,4,6-trimethylphenylsulfonium/p-toluenesulfonate 0.05 g
Dicyclohexylmethylamine 0.1 g
Fluorine-containing nonionic surfactant 0.1 g
γ-butyrolactone 0.2 g
Propylene glycol monomethyl ether acetate 26.5 g

EXAMPLE 53

Poly(p-1-cyclohexyloxyethoxystyrene/p-hydroxystyrene/methyl methacrylate) [Mw 15,500; Mw/Mn=1.70; polymer of Production Example 29] 4.5 g
Poly(p-1-ethoxyethoxystyrene/p-hydroxystyrene) [Mw 17,500; Mw/Mn=1.18] 1.5 g
Bis(cyclohexylsulfonyl)diazomethane 0.3 g
Diphenyl-2,4-dimethyphenylsulfonium/p-toluenesulfonate 0.05 g
Dicyclohexylmethylamine 0.07 g
Tetramethylammonium hydroxide 0.03 g
Fluorine-containing nonionic surfactant 0.1 g
γ-butyrolactone 0.2 g
Propylene glycol monomethyl ether acetate 26.0 g

EXAMPLE 54

Poly(p-1-ethoxyethoxystyrene/p-hydroxystyrene/cyclohexyl acrylate) [Mw 17,500; Mw/Mn=1.50] 4.5 g
Poly(p-1-ethoxyethoxystyrene/p-hydroxystyrene) [Mw 17,500; Mw/Mn=1.18] 1.5 g
Bis(cyclohexylsulfonyl)diazomethane 0.3 g
Diphenyl-p-tolylsulfonium/p-toluenesulfonate 0.05 g
Dicyclohexylmethylamine 0.1 g
Fluorine-containing nonionic surfactant 0.1 g
γ-butyrolactone 0.1 g
Propylene glycol monomethyl ether acetate 27.0 g Using each of the above resin compositions, a pattern formation was conducted in the same manner as in Example 28. Evaluation results on an anti-reflective film are shown in Tables 31 to 36, and those on a $Ti_3N_4$ plate are shown in Tables 37 and 38.

TABLE 31

| Example | Exposure dose mJ/cm$^2$ | Resolution ability μm L&S | Line width change with lapse of time from exposure to heat treatment (μm L&S) | | | DOF (0.18 μm) (μm) |
|---|---|---|---|---|---|---|
| | | | 0 min. | After 30 min. | After 4 hr. | |
| 29 | 26 | 0.16 | 0.18 | 0.18 | 0.18 | ±0.6 |
| 30 | 26 | 0.15 | 0.18 | 0.18 | 0.18 | ±0.7 |
| 31 | 31 | 0.15 | 0.18 | 0.18 | 0.18 | ±0.7 |
| 32 | 27 | 0.16 | 0.18 | 0.18 | 0.18 | ±0.6 |
| 33 | 33 | 0.15 | 0.18 | 0.18 | 0.18 | ±0.7 |
| 34 | 32 | 0.15 | 0.18 | 0.18 | 0.18 | ±0.7 |
| 35 | 26 | 0.15 | 0.18 | 0.18 | 0.18 | ±0.7 |
| 36 | 28 | 0.15 | 0.18 | 0.18 | 0.18 | ±0.7 |
| 37 | 26 | 0.15 | 0.18 | 0.18 | 0.18 | ±0.7 |
| 38 | 30 | 0.15 | 0.18 | 0.18 | 0.18 | ±0.7 |
| 39 | 26 | 0.15 | 0.18 | 0.18 | 0.18 | ±0.7 |
| 40 | 32 | 0.15 | 0.18 | 0.18 | 0.18 | ±0.7 |
| 41 | 28 | 0.15 | 0.18 | 0.18 | 0.18 | ±0.7 |

TABLE 32

| Example | Exposure dose mJ/cm$^2$ | Resolution ability μm L&S | Line width change with lapse of time from exposure to heat treatment (μm L&S) | | | DOF (0.18 μm) (μm) |
|---|---|---|---|---|---|---|
| | | | 0 min. | After 30 min. | After 4 hr. | |
| 42 | 26 | 0.15 | 0.18 | 0.18 | 0.18 | ±0.6 |
| 43 | 28 | 0.14 | 0.18 | 0.18 | 0.18 | ±0.7 |
| 44 | 26 | 0.14 | 0.18 | 0.18 | 0.18 | ±0.7 |
| 45 | 26 | 0.14 | 0.18 | 0.18 | 0.18 | ±0.7 |
| 46 | 26 | 0.14 | 0.18 | 0.18 | 0.18 | ±0.7 |
| 47 | 28 | 0.14 | 0.18 | 0.18 | 0.18 | ±0.7 |
| 48 | 28 | 0.15 | 0.18 | 0.18 | 0.18 | ±0.7 |
| 49 | 27 | 0.15 | 0.18 | 0.18 | 0.18 | ±0.7 |
| 50 | 28 | 0.14 | 0.18 | 0.18 | 0.18 | ±0.7 |

TABLE 32-continued

| Example | Exposure dose mJ/cm² | Resolution ability μm L&S | Line width change with lapse of time from exposure to heat treatment (μm L&S) | | | DOF (0.18 μm) (μm) |
|---|---|---|---|---|---|---|
| | | | 0 min. | After 30 min. | After 4 hr. | |
| 51 | 28 | 0.14 | 0.18 | 0.18 | 0.18 | ±0.7 |
| 52 | 27 | 0.14 | 0.18 | 0.18 | 0.18 | ±0.7 |
| 53 | 32 | 0.14 | 0.18 | 0.18 | 0.18 | ±0.7 |
| 54 | 27 | 0.14 | 0.18 | 0.18 | 0.18 | ±0.7 |

TABLE 33

| Example | Pattern shape | Side wall roughness | Scum |
|---|---|---|---|
| 29 | Rectangular | Good | None |
| 30 | Rectangular | Good | None |
| 31 | Rectangular | Good | None |
| 32 | Rectangular | Good | None |
| 33 | Rectangular | Good | None |
| 34 | Rectangular | Good | None |
| 35 | Rectangular | Good | None |
| 36 | Rectangular | Good | None |
| 37 | Rectangular | Good | None |
| 39 | Rectangular | Good | None |
| 39 | Rectangular | Good | None |
| 40 | Rectangular | Good | None |
| 41 | Rectangular | Good | None |

TABLE 34

| Example | Pattern shape | Side wall roughness | Scum |
|---|---|---|---|
| 42 | Rectangular | Good | None |
| 43 | Rectangular | Good | None |
| 44 | Rectangular | Good | None |
| 45 | Rectangular | Good | None |
| 46 | Rectangular | Good | None |
| 47 | Rectangular | Good | None |
| 48 | Rectangular | Good | None |
| 49 | Rectangular | Good | None |
| 50 | Rectangular | Good | None |
| 51 | Rectangular | Good | None |
| 52 | Rectangular | Good | None |
| 53 | Rectangular | Good | None |
| 54 | Rectangular | Good | None |

TABLE 35

| Example | Heat resistance | Line width change with lapse of time of storage (μm L&S) | | | DOF change with lapse of time of storage 0.18 μm L&S (μm) | |
|---|---|---|---|---|---|---|
| | | before storage | after 1 month | after 3 months | after 1 month | after 3 months |
| 29 | Good | 0.18 | 0.18 | 0.18 | ±0.6 | ±0.6 |
| 30 | Good | 0.18 | 0.18 | 0.18 | ±0.7 | ±0.7 |
| 31 | Good | 0.18 | 0.18 | 0.18 | ±0.7 | ±0.7 |
| 32 | Good | 0.18 | 0.18 | 0.18 | ±0.6 | ±0.6 |
| 33 | Good | 0.18 | 0.18 | 0.18 | ±0.7 | ±0.7 |
| 34 | Good | 0.18 | 0.18 | 0.18 | ±0.7 | ±0.7 |
| 35 | Good | 0.18 | 0.18 | 0.18 | ±0.7 | ±0.7 |
| 36 | Good | 0.18 | 0.18 | 0.18 | ±0.7 | ±0.7 |
| 37 | Good | 0.18 | 0.18 | 0.18 | ±0.7 | ±0.7 |
| 38 | Good | 0.18 | 0.18 | 0.18 | ±0.7 | ±0.7 |
| 39 | Good | 0.18 | 0.18 | 0.18 | ±0.7 | ±0.7 |
| 40 | Good | 0.18 | 0.18 | 0.18 | ±0.7 | ±0.7 |
| 41 | Good | 0.18 | 0.18 | 0.18 | ±0.7 | ±0.7 |

TABLE 36

| Example | Heat resistance | Line width change with lapse of time of storage (μm L&S) | | | DOF change with lapse of time of storage 0.18 μm L&S (μm) | |
|---|---|---|---|---|---|---|
| | | before storage | after 1 month | after 3 months | after 1 month | after 3 months |
| 42 | Good | 0.18 | 0.18 | 0.18 | ±0.7 | ±0.7 |
| 43 | Good | 0.18 | 0.18 | 0.18 | ±0.7 | ±0.7 |
| 44 | Good | 0.18 | 0.18 | 0.18 | ±0.7 | ±0.7 |
| 45 | Good | 0.18 | 0.18 | 0.18 | ±0.7 | ±0.7 |
| 46 | Good | 0.18 | 0.18 | 0.18 | ±0.7 | ±0.7 |
| 47 | Good | 0.18 | 0.18 | 0.18 | ±0.7 | ±0.7 |
| 48 | Good | 0.18 | 0.18 | 0.18 | ±0.7 | ±0.7 |
| 49 | Good | 0.18 | 0.18 | 0.18 | ±0.7 | ±0.7 |
| 50 | Good | 0.18 | 0.18 | 0.18 | ±0.7 | ±0.7 |
| 51 | Good | 0.18 | 0.18 | 0.18 | ±0.7 | ±0.7 |
| 52 | Good | 0.18 | 0.18 | 0.18 | ±0.7 | ±0.7 |
| 53 | Good | 0.18 | 0.18 | 0.18 | ±0.7 | ±0.7 |
| 54 | Good | 0.18 | 0.18 | 0.18 | ±0.7 | ±0.7 |

TABLE 37

| Example | Exposure dose mJ/cm² | Resolution ability (Ti₃N₄:0.7 μm thick) | DOF (0.18 μm L&S) | Side wall roughness | Pattern shape |
|---|---|---|---|---|---|
| 29 | 22 | 0.16 μm L&S | ±0.6 μm | Good | Good |
| 30 | 22 | 0.15 μm L&S | ±0.7 μm | Good | Good |
| 31 | 24 | 0.15 μm L&S | ±0.7 μm | Good | Good |
| 32 | 22 | 0.16 μm L&S | ±0.6 μm | Good | Good |
| 33 | 26 | 0.15 μm L&S | ±0.7 μm | Good | Good |
| 34 | 25 | 0.15 μm L&S | ±0.7 μm | Good | Good |
| 35 | 22 | 0.15 μm L&S | ±0.7 μm | Good | Good |
| 36 | 22 | 0.15 μm L&S | ±0.7 μm | Good | Good |
| 37 | 22 | 0.15 μm L&S | ±0.7 μm | Good | Good |
| 38 | 25 | 0.15 μm L&S | ±0.7 μm | Good | Good |
| 39 | 22 | 0.15 μm L&S | ±0.7 μm | Good | Good |
| 40 | 25 | 0.15 μm L&S | ±0.7 μm | Good | Good |
| 41 | 24 | 0.15 μm L&S | ±0.7 μm | Good | Good |

TABLE 38

| Example | Exposure dose mJ/cm² | Resolution ability (Ti₃N₄:0.7 μm thick) | DOF (0.18 μm L&S) | Side wall roughness | Pattern shape |
|---|---|---|---|---|---|
| 42 | 22 | 0.15 μm L&S | ±0.7 μm | Good | Good |
| 43 | 24 | 0.15 μm L&S | ±0.7 μm | Good | Good |
| 44 | 22 | 0.15 μm L&S | ±0.7 μm | Good | Good |
| 45 | 22 | 0.15 μm L&S | ±0.7 μm | Good | Good |
| 46 | 22 | 0.15 μm L&S | ±0.7 μm | Good | Good |

TABLE 38-continued

| Example | Exposure dose mJ/cm² | Resolution ability (Ti₃N₄:0.7 μm thick) | DOF (0.18 μm L&S) | Side wall roughness | Pattern shape |
|---|---|---|---|---|---|
| 47 | 24 | 0.15 μm L&S | ±0.7 μm | Good | Good |
| 48 | 24 | 0.15 μm L&S | ±0.7 μm | Good | Good |
| 49 | 22 | 0.15 μm L&S | ±0.7 μm | Good | Good |
| 50 | 26 | 0.15 μm L&S | ±0.7 μm | Good | Good |
| 51 | 26 | 0.15 μm L&S | ±0.7 μm | Good | Good |
| 52 | 26 | 0.15 μm L&S | ±0.7 μm | Good | Good |
| 53 | 30 | 0.15 μm L&S | ±0.7 μm | Good | Good |
| 54 | 27 | 0.15 μm L&S | ±0.7 μm | Good | Good |

As is clear from Tables 31 to 38, any of the resist compositions of Examples 29 to 54, like that of Example 1, could form a good positive type pattern and could resolve 0.15 to 0.16 μm L & S on an anti-reflective film. Further, more than ±0.6 μm of DOF could be obtained at 0.18 μm L & S. Still further, even after the lapse of 4 hours, 0.18 μm L & S could be resolved without any problem and no pattern size variation was observed, indicating no influence of PED similarly to the composition of Example 1. Also, any of the resist compositions of Examples 29 to 54 showed good performance even when using Ti₃N₄ and other substrates, and no problem on substrate dependency was posed. Further, the resist compositions of Examples 29 to 54 raised no problem concerning storage stability.

COMPARATIVE EXAMPLE 29

A resist composition of the following formulation was prepared.
Poly(p-1-ethoxyethoxystyrene/p-hydroxystyrene) [Mw 17,500; Mw/Mn=1.18; polymer of Production Example 15] 4.0 g
Poly(p-tert-butoxycarbonyloxystyrene/p-hydroxystyrene) [Mw 17,500; Mw/Mn=1.20; polymer of Production Example 18] 2.0 g
Bis(cyclohexylsulfonyl)diazomethane 0.2 g
Bis(2,4-dimethylphenylsulfonyl)diazomethane 0.1 g
Salicylic acid 0.1 g
Tri-n-butylamine 0.1 g
N,N-dimethylacetamide 0.2 g
Propylene glycol monomethyl ether acetate 28.5 g A pattern was formed using the above resist composition in the same manner as in Example 1. A positive type pattern of 0.16 μm L & S could be resolved at an exposure dose of 32 mJ/cm², but the shape was defective as it was taper. DOF at 0.18 μm L & S was ±0.3 μm. When pattern formation was conducted after storage at 23° C. for one month, pattern size variation of ±10% was observed, and thus this resist composition was of poor ability and storage stability.

COMPARATIVE EXAMPLE 30

A resist composition of the following formulation was prepared.
Poly(p-tetrahydropyranyloxystyrene/p-hydroxystyrene) [Mw 18,000; Mw/Mn=1.14; polymer of Production Example 19] 6.0 g
Bis(1-methylethylsulfonyl)diazomethane 0.3 g
Triphenylsulfonium/p-toluenesulfonate 0.05 g
Triethanolamine 0.1 g
Propylene glycol monomethyl ether acetate 28.5 g A pattern formation was conducted using the above resist composition in the same manner as in Example 1. A positive type pattern of 0.18 μm L & S could be resolved at an exposure dose of 33 mJ/cm², but the shape was defective as it was taper. DOF at 0.18 μm was ±0 μm. Thus this resist composition was poor in its ability.

COMPARATIVE EXAMPLE 31

A resist composition of the following formulation was prepared.
Poly(p-tert-butoxystyrene/p-hydroxystyrene) [Mw 12,000; Mw/Mn=1.70; polymer of Production Example 20] 6.0 g
Bis(1,1-dimethylethylsulfonyl)diazomethane 0.3 g
Triphenylsulfonium/p-toluenesulfonate 0.05 g
Triethanolamine 0.1 g
Propylene glycol monomethyl ether acetate 28.5 g A pattern formation was conducted using the above resist composition in the same manner as in Example 1. A positive type pattern of 0.18 μm L & S could be resolved at an exposure dose of 32 mJ/cm², but the shape was defective as it was taper, and a pattern of 0.16 μm L & S could not be resolved. DOF at 0.18 μm was ±1 μm. Thus this resist composition was poor in its ability.

COMPARATIVE EXAMPLE 32

A resist composition of the following formulation was prepared.
Poly(p-tert-butoxycarbonyloxystyrene/p-hydroxystyrene) [Mw 17,500; Mw/Mn=1.20] 6.0 g
Bis(cyclohexylsulfonyl)diazomethane 0.3 g
Triphenylsulfonium/trifluoromethanesulfonate 0.05 g
Triethanolamine 0.1 g
Propylene glycol monomethyl ether acetate 28.5 g A pattern formation was conducted using the above resist composition in the same manner as in Example 1. A positive type pattern of 0.20 μm L & S could be resolved at an exposure dose of 34 mJ/cm² (footing), but a pattern of 0.18 μm L & S could not be resolved. Thus this resist composition was poor in its ability.

COMPARATIVE EXAMPLES 33 TO 57

By way of comparison, resist compositions of the formulations shown below were prepared, and pattern formations were conducted in the same manner as in Example 29. The evaluation results are shown in Tables 39 to 41.

COMPARATIVE EXAMPLE 33

Poly(p-tert-butoxystyrene/p-hydroxystyrene) [Mw 12,000; Mw/Mn=1.70] 6.0 g
Bis(1,1-dimethylethylsulfonyl)diazomethane 0.2 g
Bis(p-toluenesulfonyl)diazomethane 0.1 g
Triethanolamine 0.1 g
Propylene glycol monomethyl ether acetate 28.5 g

COMPARATIVE EXAMPLE 34

Poly(p-1-ethoxyethoxystyrene/p-hydroxystyrene/p-tert-butoxycarbonyloxystyrene) [Mw 20,000; Mw/Mn=1.12; polymer of Production Example 9] 6.0 g
Bis(cyclohexylsulfonyl)diazomethane 0.2 g
Bis(2,4-dimethylphenylsulfonyl)diazomethane 0.1 g
Triethanolamine 0.1 g Propylene glycol monomethyl ether acetate 28.5 g

COMPARATIVE EXAMPLE 35

Poly(p-1-ethoxyethoxystyrene/p-hydroxystyrene) [Mw 17,500; Mw/Mn=1.18] 6.0 g
Bis(cyclohexylsulfonyl)diazomethane 0.2 g
Triphenylsulfonium/p-toluenesulfonate 0.1 g
Dicyclohexylmethylamine 0.1 g
Propylene glycol monomethyl ether acetate 28.7 g

COMPARATIVE EXAMPLE 36

Poly(p-1-ethoxyethoxystyrene/p-hydroxystyrene/styrene) [Mw 18,000; Mw/Mn=1.85; polymer of Production Example 3] 6.0 g
Diphenyliodonium hexafluorophosphate [commercial product] 0.2 g
Dicyclohexylmethylamine 0.1 g
Diethylene glycol dimethyl ether 14.7 g
Propylene glycol monomethyl ether acetate 14.0 g

COMPARATIVE EXAMPLE 37

Poly(p-1-ethoxyethoxystyrene/p-hydroxystyrene/p-tert-butoxystyrene) [Mw 18,000; Mw/Mn=1.90; polymer of Production Example 1] 6.0 g
Triphenylsulfonium/trifluoromethanesulfonate 0.3 g
Dicyclohexylmethylamine 0.1 g
Propylene glycol monomethyl ether acetate 0.1 g

COMPARATIVE EXAMPLE 38

Poly(p-1-ethoxyethoxystyrene/p-hydroxystyrene/p-tert-butoxystyrene) [Mw 18,200; Mw/Mn=1.11; polymer of Production Example 4] 4.0 g
Poly(p-1-ethoxyethoxystyrene/p-hydroxystyrene) [Mw 17,500; Mw/Mn=1.18] 2.0 g
Tris(trichloromethyl)-s-triazine 1.1 g
Acetamide 0.5 g
Triethanolamine 0.1 g
Propylene glycol monomethyl ether acetate 27.5 g

COMPARATIVE EXAMPLE 39

Poly(p-1-ethoxyethoxystyrene/p-hydroxystyrene/p-tert-butoxystyrene) [Mw 18,000; Mw/Mn=1.90] 4.5 g
Poly(p-1-ethoxyethoxystyrene/p-hydroxystyrene/p-tert-butoxystyrene) [Mw 9,200; Mw/Mn=1.30; polymer of Production Example 21] 1.5 g
Diphenyl-p-tolylsulfonium/p-toluenesulfonate 0.3 g
Pyridine 0.2 g
Propylene glycol monomethyl ether acetate 28.5 g

COMPARATIVE EXAMPLE 40

Poly(p-1-ethoxyethoxystyrene/p-hydroxystyrene/p-tert-butoxystyrene) [Mw 18,000; Mw/Mn=1.90] 4.5 g
Poly(p-1-ethoxyethoxystyrene/p-hydroxystyrene/p-tert-butoxystyrene) [Mw 9,200; Mw/Mn=1.30] 1.5 g
Bis(1,1-dimethylethylsulfonyl)diazomethane 0.2 g
Bis(p-toluenesulfonyl)diazomethane 0.1 g
Tri-n-butylamine 0.1 g
Propylene glycol monomethyl ether acetate 28.5 g

COMPARATIVE EXAMPLE 41

Poly(p-1-ethoxyethoxystyrene/p-hydroxystyrene/p-tetrahydropyranyloxystyrene) [Mw 18,500; Mw/Mn=1.18; polymer of Production Example 8] 6.0 g
Bis(cyclohexylsulfonyl)diazomethane 0.2 g
1,2,3-tris(methanesulfonyloxy)benzene 0.1 g
Tri-n-butylamine 0.1 g
Propylene glycol monomethyl ether acetate 28.7 g

COMPARATIVE EXAMPLE 42

Poly(p-1-ethoxyethoxystyrene/p-hydroxystyrene) [Mw 17,500; Mw/Mn=1.18] 3,5 g
Poly(p-1-ethoxy-n-propoxystyrene/p-hydroxystyrene) [Mw 18,000; Mw/Mn=1.18; polymer of Production Example 17] 2.5 g
Triphenylsulfonium/trifluoromethanesulfonate 0.2 g
Dicyclohexylmethylamine 0.1 g
Propylene glycol monomethyl ether acetate 28.5 g

COMPARATIVE EXAMPLE 43

Poly(p-1-ethoxyethoxystyrene/p-hydroxystyrene/p-tert-butoxystyrene) [Mw 9,200; Mw/Mn=1.30; polymer of Production Example 21] 2.5 g
Poly(p-1-ethoxyethoxystyrene/p-hydroxystyrene/p-tert-butoxycarbonyloxystyrene) [Mw 20,000; Mw/Mn=1.12] 2.0 g
Poly(p-1-isobutoxyethoxystyrene/p-hydroxystyrene) [Mw 18,500; Mw/Mn=1.18; polymer of Production Example 16] 1.5 g
Bis(cyclohexylsulfonyl)diazomethane 0.3 g
Diphenyl-p-tolylsulfonium/perfluorooctanesulfonate 0.15 g
Dicyclohexylmethylamine 0.1 g
Propylene glycol monomethyl ether acetate 28.0 g

COMPARATIVE EXAMPLE 44

Poly(p-1-ethoxyethoxystyrene/p-hydroxystyrene/p-tert-butoxystyrene) [Mw 18,200; Mw/Mn=1.11] 2.5 g
Poly(p-1-ethoxyethoxystyrene/p-hydroxystyrene/p-tert-butoxycarbonyloxystyrene) [Mw 20,000; Mw/Mn=1.12] 2.0 g
Poly(p-1-ethoxy-n-propoxystyrene/p-hydroxystyrene) [Mw 18,000; Mw/Mn=1.18] 1.5 g
Bis(cyclohexylsulfonyl)diazomethane 0.3 g
Diphenyl-p-tolylsulfonium/perfluorooctanesulfonate 0.06 g
Dicyclohexylmethylamine 0.1 g
Propylene glycol monomethyl ether acetate 28.6 g

COMPARATIVE EXAMPLE 45

Poly(p-1-ethoxyethoxystyrene/p-hydroxystyrene/p-tert-butoxystyrene) [Mw 18,000; Mw/Mn=1.90] 4.5 g
Poly(p-1-ethoxyethoxystyrene/p-hydroxystyrene/p-tert-butoxystyrene) [Mw 9,200; Mw/Mn=1.30] 1.5 g
Bis(cyclohexylsulfonyl)diazomethane 0.3 g
Diphenyl-p-tolylsulfonium/trifluoromethanesulfonate 0.1 g
Tri-n-octylamine 0.1 g
Propylene glycol monomethyl ether acetate 28.6 g

COMPARATIVE EXAMPLE 46

Poly(p-1-ethoxyethoxystyrene/p-hydroxystyrene/p-tert-butoxystyrene) [Mw 18,200; Mw/Mn=1.11] 4.0 g
Poly(p-1-ethoxyethoxystyrene/p-hydroxystyrene) [Mw 17,500; Mw/Mn=1.18] 2.0 g Bis(cyclohexylsulfonyl)diazomethane 0.3 g
Diphenyl-p-tolylsulfonium/trifluoromethanesulfonate 0.05 g
Dicyclohexylmethylamine 0.1 g
Propylene glycol monomethyl ether acetate 27.5 g

COMPARATIVE EXAMPLE 47

Poly(p-1-ethoxyethoxystyrene/p-hydroxystyrene/p-tert-butoxystyrene) [Mw 18,200; Mw/Mn=1.11] 4.0 g
Poly(p-1-ethoxyethoxystyrene/p-hydroxystyrene) [Mw 17,500; Mw/Mn=1.18] 2.0 g
Bis(cyclohexylsulfonyl)diazomethane 0.3 g
Bis(p-toluenesulfonyl)diazomethane 0.1 g
Tri-n-octylamine 0.1 g
Propylene glycol monomethyl ether acetate 27.5 g

COMPARATIVE EXAMPLE 48

Poly(p-1-ethoxyethoxystyrene/p-hydroxystyrene/p-tert-butoxystyrene) [Mw 18,200; Mw/Mn=1.11] 4.0 g
Poly(p-1-ethoxyethoxystyrene/p-hydroxystyrene) [Mw 17,500; Mw/Mn=1.18] 2.0 g
Bis(cyclohexylsulfonyl)diazomethane 0.3 g
Triphenylsulfonium/trifluoromethanesulfonate 0.1 g
Dicyclohexylmethylamine 0.1 g
Propylene glycol monomethyl ether acetate 28.6 g

COMPARATIVE EXAMPLE 49

Poly(p-1-ethoxyethoxystyrene/p-hydroxystyrene/p-tert-butoxycarbonyloxystyrene) [Mw 20,000; Mw/Mn=1.12; polymer of Production Example 9] 6.0 g
Bis(cyclohexylsulfonyl)diazomethane 0.2 g
Triphenylsulfonium/trifluoromethanesulfonate 0.05 g
Triethylamine 0.1 g
Propylene glycol monomethyl ether acetate 28.6 g

COMPARATIVE EXAMPLE 50

Poly(p-1-ethoxyethoxystyrene/p-hydroxystyrene) [Mw 17,500; Mw/Mn=1.18] 4.5 g
Poly(p-tert-butoxycarbonyloxystyrene/p-hydroxystyrene) [Mw 17,500; Mw/Mn=1.20] 1.5 g
Bis(cyclohexylsulfonyl)diazomethane 0.3 g
Tri-n-butylamine 0.1 g
Propylene glycol monomethyl ether acetate 28.7 g

COMPARATIVE EXAMPLE 51

Poly(p-1-ethoxyethoxystyrene/p-hydroxystyrene/p-tert-butoxystyrene) [Mw 18,200; Mw/Mn=1.11] 6.0 g
Bis(cyclohexylsulfonyl)diazomethane 0.3 g
Bis(1,1-dimethylethylsulfonyl)diazomethane 0.2 g
Tetramethylammonium hydroxide 0.1 g
Propylene glycol monomethyl ether acetate 28.6 g

COMPARATIVE EXAMPLE 52

Poly(p-1-ethoxyethoxystyrene/p-hydroxystyrene) [Mw 17,500; Mw/Mn=1.18] 4.5 g
Poly(p-tert-butoxycarbonyloxystyrene/p-hydroxystyrene) [Mw 17,500; Mwn/Mn=1.20] 1.5 g
Bis(p-tert-butylphenyl)iodonium/trifluoromethane sulfonate 0.3 g
Dicyclohexylmethylamine 0.1 g
Propylene glycol monomethyl ether acetate 28.6 g

COMPARATIVE EXAMPLE 53

Poly(p-1-ethoxyethoxystyrene/p-hydroxystyrene) [Mw 17,500; Mw/Mn=1.18] 6.0 g
P-triphenyldisulfone 0.3 g
Tri-n-butylamine 0.1 g
Fluorine-containing nonionic surfactant [commercial product] 0.1 g
Propylene glycol monomethyl ether acetate 28.6 g

COMPARATIVE EXAMPLE 54

Poly(p-1-ethoxyethoxystyrene/p-hydroxystyrene/cyclohexyl acrylate) [Mw 17,500; Mw/Mn=1.50; polymer of Production Example 26] 6.0 g
Bis(cyclohexylsulfonyl)diazomethane 0.3 g
Dicyclohexylmethylamine 0.1 g
Fluorine-containing nonionic surfactant [commercial product] 0.1 g
Propylene glycol monomethyl ether acetate 28.6 g

COMPARATIVE EXAMPLE 55

Poly(p-1-ethoxyethoxystyrene/p-hydroxystyrene/cyclohexyl acrylate) [Mw 17,500; Mw/Mn=1.50] 4.0 g
Poly(p-1-ethoxyethoxystyrene/p-hydroxystyrene) [Mw 17,500; Mw/Mn=1.18] 2.0 g
Bis(1,1-dimethylethylsulfonyl)diazomethane 0.3 g
Dicyclohexylmethylamine 0.1 g
Fluorine-containing nonionic surfactant [commercial product] 0.1 g
Propylene glycol monomethyl ether acetate 28.6 g

COMPARATIVE EXAMPLE 56

Poly(p-1-ethoxyethoxystyrene/p-hydroxystyrene/cyclohexyl acrylate) [Mw 17,500; Mw/Mn=1.50] 4.0 g
Poly(p-1-ethoxyethoxystyrene/p-hydroxystyrene) [Mw 17,500; Mw/Mn=1.18] 2.0 g
Triphenylsulfonium/trifluoromethanesulfonate 0.3 g
Dicyclohexylmethylamine 0.1 g
Fluorine-containing nonionic surfactant [commercial product] 0.1 g
Propylene glycol monomethyl ether acetate 28.6 g

COMPARATIVE EXAMPLE 57

Poly(p-1-ethoxyethoxystyrene/p-hydroxystyrene/cyclohexyl acrylate) [Mw 17,500; Mw/Mn=1.50] 4.0 g
Poly(p-1-ethoxyethoxystyrene/p-hydroxystyrene) [Mw 17,500; Mw/Mn=1.18] 2.0 g
Bis(cyclohexylsulfonyl)diazomethane 0.2 g
Triphenylsulfonium/trifluoromethanesulfonate 0.1 g
Dicyclohexylmethylamine 0.1 g
Fluorine-containing nonionic surfactant [commercial product] 0.1 g
Propylene glycol monomethyl ether acetate 28.6 g

TABLE 39

| Comp. Example | Exposure dose mJ/cm² | Resolution ability | DOF (0.18 μm L&S) | Pattern shape | Side wall roughness |
|---|---|---|---|---|---|
| 33 | 53 | 0.24 μm L&S | — | Footing | Good |
| 34 | 48 | 0.18 μm L&S | ±0.1 μm | Footing | Bad |
| 35 | 33 | 0.18 μm L&S | ±0.1 μm | Bad shape | Bad |
| 36 | 25 | 0.20 μm L&S | — | Bad shape | Bad |
| 37 | 28 | 0.18 μm L&S | ±0 μm | Bad shape | Bad |
| 38 | 26 | 0.20 μm L&S | — | Bad shape | Bad |
| 39 | 22 | 0.18 μm L&S | ±0.2 μm | Bad shape | Bad |
| 40 | 33 | 0.18 μm L&S | ±0.2 μm | Taper | Bad |
| 41 | 25 | 0.18 μm L&S | ±0 μm | Taper | Bad |
| 42 | 21 | 0.18 μm L&S | ±0.2 μm | Bad shape | Bad |
| 43 | 31 | 0.16 μm L&S | ±0.3 μm | Bad shape | Bad |
| 44 | 32 | 0.16 μm L&S | ±0.3 μm | Bad shape | Bad |
| 45 | 28 | 0.16 μm L&S | ±0.3 μm | Bad shape | Bad |
| 46 | 24 | 0.18 μm L&S | ±0.2 μm | Bad shape | Bad |
| 47 | 28 | 0.18 μm L&S | ±0.2 μm | Taper | Bad |
| 48 | 21 | 0.18 μm L&S | ±0.2 μm | Bad shape | Bad |

TABLE 40

| Comp. Example | Exposure dose mJ/cm² | Resolution ability | DOF (0.18 μm L&S) | Pattern shape | Side wall roughness |
|---|---|---|---|---|---|
| 49 | 32 | 0.18 μm L&S | ±0.2 μm | Taper | Good |
| 50 | 38 | 0.18 μm L&S | ±0.2 μm | Footing | Bad |
| 51 | 27 | 0.16 μm L&S | ±0.3 μm | Footing | Bad |
| 52 | 28 | 0.18 μm L&S | ±0.1 μm | Bad shape | Bad |
| 53 | 14 | 0.18 μm L&S | ±0.1 μm | Bad shape | Bad |
| 54 | 32 | 0.16 μm L&S | ±0.1 μm | Footing | Good |
| 55 | 29 | 0.16 μm L&S | ±0.3 μm | Footing | Bad |
| 56 | 25 | 0.16 μm L&S | ±0.2 μm | Taper | Bad |
| 57 | 27 | 0.16 μm L&S | ±0.3 μm | Taper | Bad |

TABLE 41

| Comp. Example | Exposure dose mJ/cm² | Line width change with lapse of time from exposure to heat treatment (μm L&S) | | |
|---|---|---|---|---|
| | | 0 min. | after 30 min | after 4 hr. |
| 43 | 31 | 0.18 | 0.16 | 0.15 |
| 44 | 32 | 0.18 | 0.16 | 0.15 |
| 45 | 28 | 0.18 | 0.16 | 0.15 |
| 46 | 24 | 0.18 | 0.16 | 0.15 |
| 47 | 28 | 0.18 | 0.18 | 0.18 |
| 48 | 21 | 0.18 | 0.16 | 0.15 |
| 54 | 32 | 0.18 | 0.16 | 0.15 |
| 56 | 25 | 0.18 | 0.16 | 0.15 |

The tapers in Comparative Examples 29 to 31, 40 to 41, 47, 49 and 56 to 57 are shown in FIG. 2, the footings in Comparative Examples 32 to 34, 50 to 51 and 54 to 55 are shown in FIG. 3, the defective shapes in Comparative Examples 35, 37, 39 and 42 are shown in FIG. 4, and the defective shapes in Comparative Examples 36, 38, 43 to 46, 48 and 52 to 53 are shown in FIG. 5.

As is clear from Tables 39 and 40 and FIGS. 2 to 5, in those Comparative Examples, the resolving ability is poor, the pattern shape is defective and DOF at 0.18 μm L & S is generally small as compared with those of the resist compositions of the present invention.

The resist composition of the formulation of Comparative Example 53 was prepared and, 48 hours there-after, a pattern formation was conducted in the same manner as in Comparative Example 29, whereupon even non-exposed portion was dissolved in the developing solution and the pattern could not be formed. Thus the resist composition of the formulation of Comparative Example 53 was unstable in the state of a solution.

Further, in Comparative Examples 43 to 46 and 48, there was observed change in pattern size with the lapse of time from exposure to heat treatment, which is indicative of the influence of delay time.

Moreover, it is evident from comparison between Example 49 and Comparative Examples 46 and 48 that the resolution ability, DOF, pattern shape and susceptivity to delay time differ greatly depending on the combination of the photoacid generators used, and this clearly indicates the superiority of the composition of the present invention.

EXAMPLE 55

A resist composition of the following formulation was prepared.

Poly(p-1-ethoxyethoxystyrene/p-hydroxystyrene) [Mw 17,500; Mw/Mn=1.18] 5.0 g

Poly(p-1-ethoxyethoxystyrene/p-hydroxystyrene/p-tetrahydropyranyloxystyrene) [Mw 18,500; Mw/Mn=1.18] 1.0 g Bis(1,1-dimethylethylsulfonyl)diazomethane 0.3 g P-tert-butylphenyldiphenylsulfonium/p-toluenesulfonate 0.05 g Propylene glycol 0.1 g Dicyclohexylmethylamine 0.1 g γ-butyrolactone 0.5 g Propylene glycol monomethyl ether acetate 28.5 g Using the above resist composition, a contact hole (C & H) pattern formation was conducted in the same manner as described in Example 1 except using a mask for contact hole, which resulted in resolution of 0.18 μm C & H under exposure dose of 50 mJ/cm². The pattern shape was rectangular. DOF at 0.22 μm C & H was ±0.5 μm.

EXAMPLE 56

A resist composition of the following formulation was prepared.

Poly(p-1-ethoxyethoxystyrene/p-hydroxystyrene) [Mw 17,500; Mw/Mn=1.18] 5.0 g

Poly(p-1-ethoxyethoxystyrene/p-hydroxystyrene/p-isopropoxystyrene) [Mw 18,000; Mw/Mn=1.12] 1.0 g Bis(cyclohexylsulfonyl)diazomethane 0.3 g Diphenyl-p-tolylsulfonium/p-toluenesulfonate 0.05 g Fluorine-containing nonionic surfactant 0.1 g Dicyclohexylmethylamine 0.1 g γ-butyrolactone 1.0 g Propylene glycol monomethyl ether acetate 28.5 g Using the above resist composition, a contact hole pattern formation was conducted in the same manner as described in Example 55, which resulted in resolution of 0.18 μm C & H under exposure dose of 52 mJ/cm². The pattern shape was rectangular. DOF at 0.22 μm C & H was ±0.5 μm.

COMPARATIVE EXAMPLE 58

A resist composition of the following formulation was prepared.

Poly(p-1-ethoxyethoxystyrene/p-hydroxystyrene) [Mw 18,500; Mw/Mn=1.18] 5.0 g

Poly(p-1-ethoxyethoxystyrene/p-hydroxystyrene/p-tetrahydropyranyloxystyrene) [Mw 18,500; Mw/Mn=1.18] 1.0 g Bis(1,1-dimethylethylsulfonyl)diazomethane 0.2 g Bis(2,4-dimethylbenzenesulfonyl)diazomethane 0.1 g Fluorine-containing nonionic surfactant 0.1 g
Dicyclohexylmethylamine 0.1 g
γ-butyrolactone 1.0 g
Propylene glycol monomethyl ether acetate 28.5 g Using the above resist composition, a contact hole pattern formation was conducted in the same manner as described in Example 55, which resulted in resolution of 0.20 μm C & H under exposure dose of 66 mJ/cm². The resist membrane surface had a round taper shape. DOF at 0.22 μm C & H was as poor as ±0.1 μm.

COMPARATIVE EXAMPLE 59

A resist composition of the following formulation was prepared.
Poly(p-tetrahydropyranyloxystyrene/p-hydroxystyrene) [Mw 18,000; Mw/Mn=1.14] 6.0 g
Bis(1,1-dimethylethylsulfonyl)diazomethane 0.3 g
Bis(2,4-dimethylbenzenesulfonyl)diazomethane 0.1 g
Triphenylsulfonium/p-toluenesulfonate 0.05 g
Fluorine-containing nonionic surfactant 0.1 g
Dicyclohexylmethylamine 0.1 g
γ-butyrolactone 0.5 g
Propylene glycol monomethyl ether acetate 28.5 g Using the above resist composition, a contact hole pattern formation was conducted in the same manner as described in Example 55, which resulted in resolution of 0.20 μm C & H under exposure dose of 78 mJ/cm². The membrane surface had a round taper shape. DOF at 0.22 μm C & H was as poor as 0.1 μm.

From the results of Examples 55 and 56 and Comparative Examples 58 and 59, it is learned that the use of mixture of two or more types of polymers containing an acetal group and two or more types of photoacid generators having a specific structure is advantageous in terms of resolution ability, DOF and pattern shape in the case of contact hole pattern formation.

A cross section of the rectangular contact hole pattern obtained in Examples 55 and 56 is shown in FIG. 6, and a cross section of the contact hole pattern with a defective round taper shape of the resist membrane surface obtained in Comparative Examples 58 and 59 is shown in FIG. 7.

EXAMPLE 57

The resist composition of Example 11 and the same composition without γ-butyrolactone were stored at 23° C. and the number of the fine particles with a size of 0.2 μm or greater was counted with the lapse of time. The results are shown in Table 42.

TABLE 42

| | Number of fine particles (particle/ft³) | | | | |
|---|---|---|---|---|---|
| | Before storage | After 1 month storage | After 2 month storage | After 3 month storage | After 6 month storage |
| Resist composition in Example 11 | 2 | 2 | 3 | 3 | 5 |
| Resist composition in Example 11 except for γ-butyrolactone | 3 | 10 | 20 | 45 | 480 |

It is understood that use of γ-butylolactone incorporated in the resist composition of the present invention is effective for inhibiting increase of fine particles in the composition during its storage.

As clearly understood from the above mentioned, when a resist composition, in which a diazodisulfone compound is co-used with an onium salt containing an aromatic or aliphatic polycyclic sulfonic acid ion as a counter anion as photoacid generators and two or more kinds of acetal type polymers are used together, is used as the resist composition for exposure by light source having 300 nm or less wavelength such as deep ultraviolet light and KrF excimer laser light (248.4 nm) on an anti-reflective film or $Ti_3N_4$ substrate for the purpose of utilizing in recently desired ultra fine processing requiring 0.20 to 0.13 μm line and space, remarkably higher resolution and good rectangular pattern shape with good side wall roughness can be attained as compared with so far known resist compositions and further stable pattern size can be maintained as the time lapse from exposure to heat treatment (post baking) and still further good shaped fine pattern with large DOF can be obtained. Further, it has been confirmed that the resist composition of the present invention shows excellent ability even when applied on other kinds of substrates and thus the substrate dependency raized as a serious problem in the known resist composition can be overcomed. Therefore the present invention has a great value for ultra fine pattern formation in semiconductor industries, etc.

Additionally, the resist composition of the present invention can show the effect particularly in the pattern formation with the use of deep ultraviolet light and KrF excimer laser light and it can also be used in the pattern formation with the use of electron beams and soft X-ray as well.

What is claimed is:
1. A chemically amplified resist composition comprising
   (a) two or more polymers which become alkali-soluble by an action of an acid and represented by the formula:

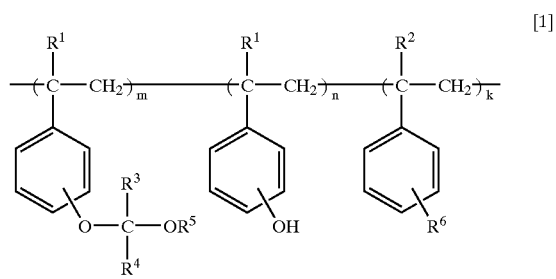

[1]

wherein $R^1$ and $R^2$ are independently a hydrogen atom or a methyl group; $R^3$ and $R^4$ are independently a hydrogen atom, a straight-chain, branched or cyclic alkyl group having 1 to 6 carbon atoms, a straight-chain, branched or cyclic haloalkyl group having 1 to 6 carbon atoms, a phenyl group which may have one or more substituents, or $R^3$ and $R^4$ can together form a methylene chain, provided that both $R^3$ and $R^4$ cannot be hydrogen atoms at the same time; $R^5$ is a straight-chain, branched or cyclic alkyl group having 1 to 10 carbon atoms, a straight-chain, branched or cyclic haloalkyl group having 1 to 10 carbon atoms, or an aralkyl group;

$R^6$ is a hydrogen atom, a straight-chain or branched alkyl group having 1 to 4 carbon atoms, a straight-chain, branched or cyclic alkoxy group having 1 to 8 carbon atoms, a saturated heterocyclic oxy group, or a group of the formula:

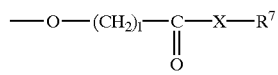  [2]

wherein $R^7$ is a straight-chain, branched or cyclic alkyl group having 1 to 8 carbon atoms, an aryl group or a saturated heterocyclic group; X is a direct link; l is zero or an integer; k is zero or an integer; provided that $0.10 \leq (m+k)/(m+n+k) \leq 0.90$ and $0 \leq k/(m+n+k) \leq 0.25$, (b) a mixture of at least one compound of the formula:

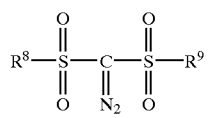  [3]

wherein $R^8$ is a branched or cyclic alkyl group having 3 to 8 carbon atoms; and $R^9$ is a straight-chain, branched or cyclic alkyl group having 1 to 8 carbon atoms, or an aralkyl group, and at least one compound selected from the group consisting of a compound of the formula:

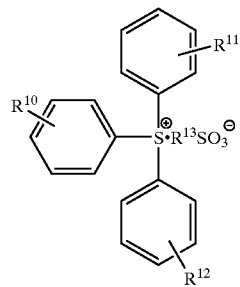  [4]

wherein $R^{10}$, $R^{11}$ and $R^{12}$ are independently a hydrogen atom, a halogen atom, a straight-chain, branched or cyclic alkyl group having 1 to 6 carbon atoms, a straight-chain, branched or cyclic alkoxy group having 1 to 6 carbon atoms, or a phenylthio group: $R^{13}$ is a 1-naphthyl group, a 2-naphthyl group, a 10-camphoryl group, a pyridyl group, or a group of the formula:

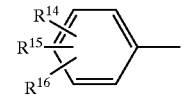  [5]

wherein $R^{14}$ and $R^{15}$ are independently a hydrogen atom or a halogen atom; and $R^{16}$ is a hydrogen atom, a halogen atom, a straight-chain, branched or cyclic alkyl group having 1 to 12 carbon atoms, a straight-chain or branched alkoxy group having 1 to 4 carbon atoms, and a compound of the formula:

[6]

wherein $R^{17}$ and $R^{18}$ are independently a hydrogen atom, a straight-chain or branched alkyl group having 1 to 4 carbon atoms, a straight-chain or branched alkoxy group having 1 to 4 carbon atoms; and $R^{19}$ is a 1-naphthyl group, a 2-naphthyl group, a 10-camphoryl group, a phenyl group, or a phenyl group substituted with one or more, the same or different, straight-chain, branched or cyclic alkyl groups having 1 to 12 carbon atoms, and (c) a solvent dissolving the components (a) and (b), wherein the component (c) is a mixed solvent containing a compound having a lactone ring.

2. A resist composition according to claim 1, wherein the compound having a lactone ring is γ-butyrolactone or γ-propiolactone.

* * * * *